(12) United States Patent
Adachi et al.

(10) Patent No.: US 9,676,175 B2
(45) Date of Patent: Jun. 13, 2017

(54) PEELING APPARATUS

(71) Applicant: Semiconductor Energy Laboratory Co., Ltd., Atsugi-shi, Kanagawa-ken (JP)

(72) Inventors: Hiroki Adachi, Tochigi (JP); Saki Eguchi, Tochigi (JP); Masakatsu Ohno, Tochigi (JP); Junpei Yanaka, Tochigi (JP); Yoshiharu Hirakata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 52 days.

(21) Appl. No.: 14/740,957

(22) Filed: Jun. 16, 2015

(65) Prior Publication Data
US 2015/0367622 A1 Dec. 24, 2015

(30) Foreign Application Priority Data
Jun. 20, 2014 (JP) .................................. 2014-127355

(51) Int. Cl.
*B32B 43/00* (2006.01)
*H01L 21/67* (2006.01)
(Continued)

(52) U.S. Cl.
CPC .......... *B32B 43/006* (2013.01); *B32B 37/025* (2013.01); *B32B 37/12* (2013.01);
(Continued)

(58) Field of Classification Search
CPC ... H01L 2221/68318; H01L 2221/6835; H01L 2221/68363; H01L 2221/68386; B32B 38/10; B32B 43/006
See application file for complete search history.

(56) References Cited

U.S. PATENT DOCUMENTS

| 6,684,925 B2 * | 2/2004 | Nagate .................... B32B 38/10 |
| | | 156/230 |
| 7,543,621 B2 * | 6/2009 | Kanbara ............... B32B 37/182 |
| | | 156/516 |
| 7,591,863 B2 | 9/2009 | Watanabe et al. |
| 8,048,777 B2 | 11/2011 | Eguchi et al. |

(Continued)

FOREIGN PATENT DOCUMENTS

| JP | H10-125931 | 5/1998 |
| JP | 2003-174153 | 6/2003 |

*Primary Examiner* — Mark A Osele
(74) *Attorney, Agent, or Firm* — Fish & Richardson P.C.

(57) ABSTRACT

A peeling apparatus including a support body supply unit, a support body hold unit, a transfer mechanism, and a first structure body. The first structure body has a convex surface. The support body supply unit has a function of unwinding a first support body and includes one of a pair of tension applying mechanisms. The support body hold unit includes the other of the pair of tension applying mechanisms. The pair of tension applying mechanisms applies tension to the first support body. The transfer mechanism has a function of transferring a process member. The first structure body has a function of bending back the first support body along the convex surface. The first structure body has a function of dividing the process member into a first member and a second member. An angle at which the first structure body bends back the first support body is an obtuse angle.

17 Claims, 25 Drawing Sheets

(51) Int. Cl.
*B32B 37/12* (2006.01)
*B32B 37/22* (2006.01)
*B32B 38/10* (2006.01)
*B32B 38/18* (2006.01)
*B32B 39/00* (2006.01)
*H01L 21/683* (2006.01)
*B32B 37/00* (2006.01)

(52) U.S. Cl.
CPC ............ *B32B 37/187* (2013.01); *B32B 37/22* (2013.01); *B32B 38/10* (2013.01); *B32B 38/18* (2013.01); *B32B 39/00* (2013.01); *H01L 21/67132* (2013.01); *H01L 21/6835* (2013.01); *B32B 37/003* (2013.01); *B32B 2457/00* (2013.01); *B32B 2457/20* (2013.01); *B32B 2457/208* (2013.01); *H01L 2221/6835* (2013.01); *H01L 2221/68318* (2013.01); *H01L 2221/68363* (2013.01); *H01L 2221/68386* (2013.01); *Y10T 156/195* (2015.01)

(56) References Cited

U.S. PATENT DOCUMENTS

| | | | |
|---|---|---|---|
| 8,123,896 | B2 | 2/2012 | Watanabe et al. |
| 8,137,417 | B2 | 3/2012 | Eguchi et al. |
| 8,911,583 | B2* | 12/2014 | Jakob ................ H01L 21/67132 156/150 |
| 2006/0055314 | A1* | 3/2006 | Nakamura .......... H01L 51/0004 313/500 |
| 2008/0042168 | A1 | 2/2008 | Watanabe et al. |
| 2008/0113486 | A1* | 5/2008 | Eguchi ................. B32B 43/006 438/458 |
| 2008/0132033 | A1* | 6/2008 | Eguchi ............. H01L 21/67092 438/460 |
| 2014/0234664 | A1 | 8/2014 | Yasumoto et al. |
| 2015/0059986 | A1 | 3/2015 | Komatsu et al. |
| 2015/0059987 | A1 | 3/2015 | Kumakura et al. |
| 2015/0060933 | A1 | 3/2015 | Ohno et al. |
| 2015/0068683 | A1 | 3/2015 | Ohno et al. |
| 2015/0151531 | A1 | 6/2015 | Ohno et al. |
| 2015/0155505 | A1 | 6/2015 | Yamazaki et al. |
| 2015/0165477 | A1 | 6/2015 | Yamazaki et al. |

* cited by examiner

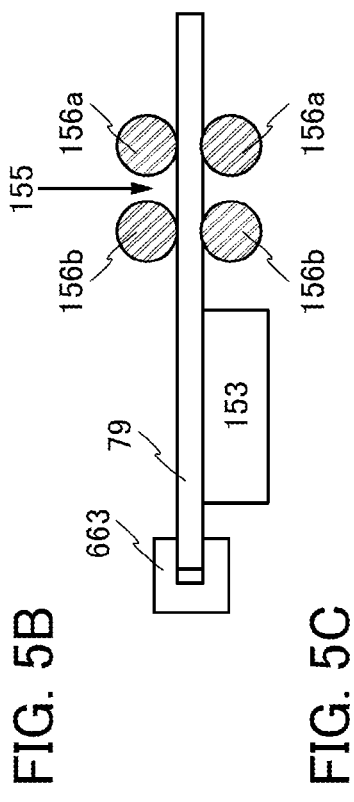
FIG. 5A
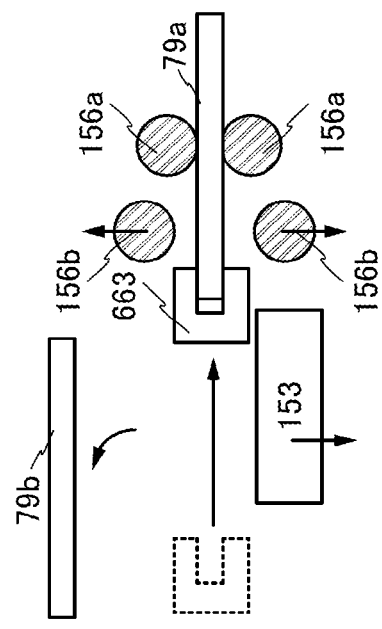
FIG. 5B
FIG. 5C
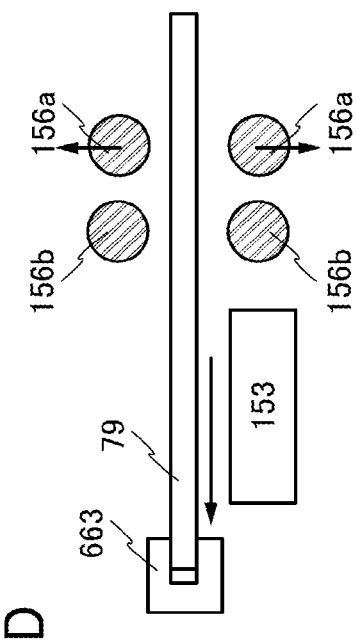
FIG. 5D

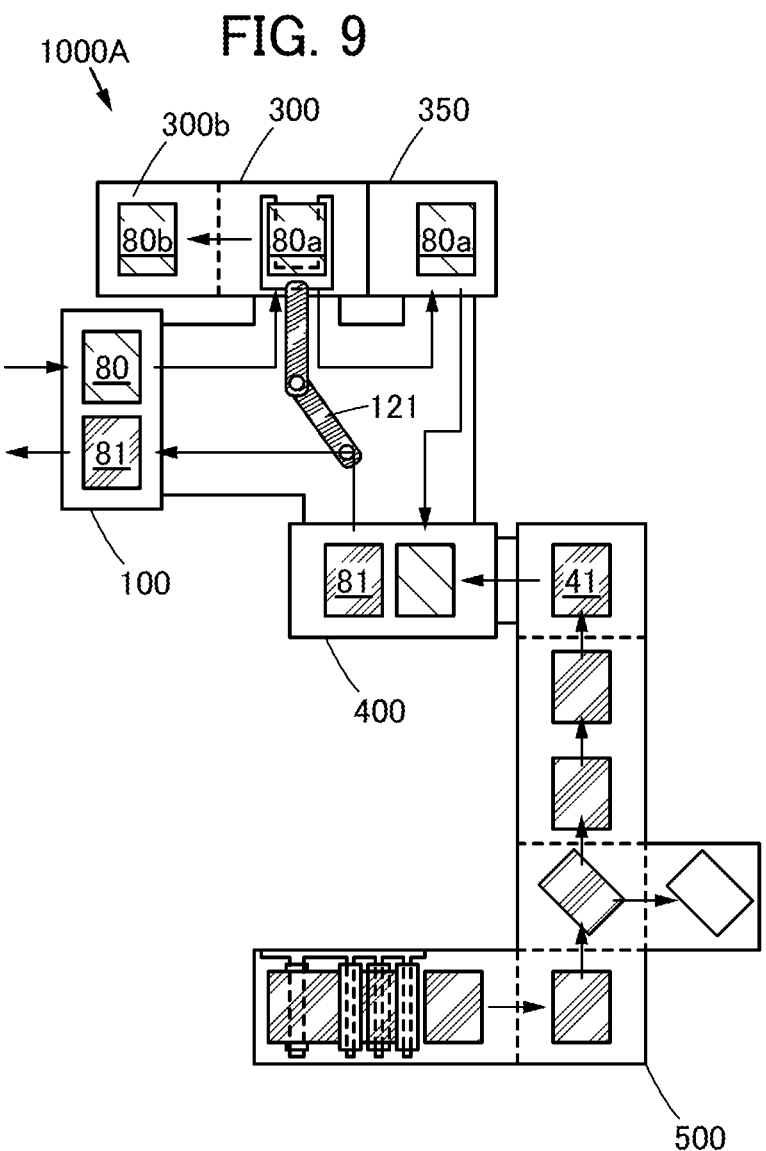

FIG. 10A 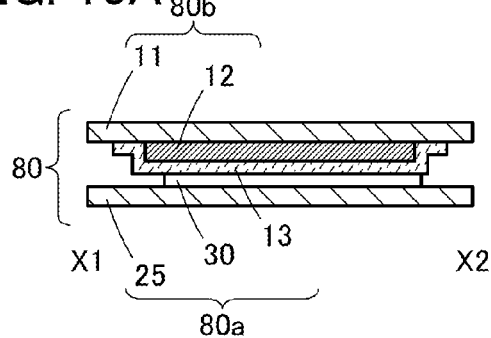 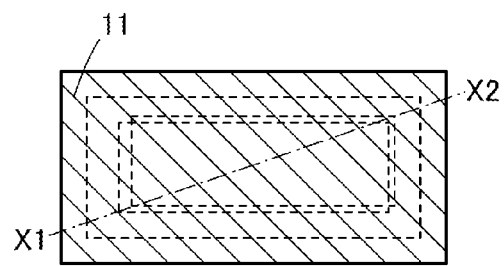
FIG. 10B 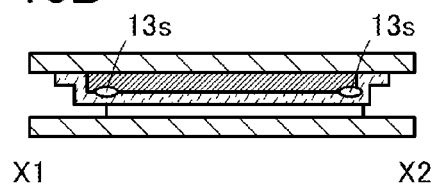 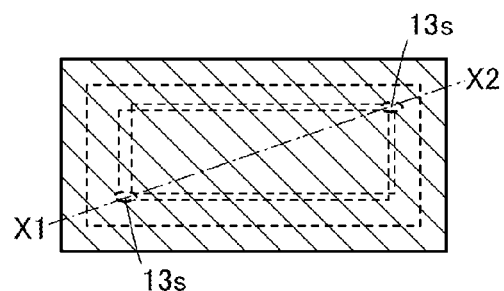

FIG. 10D 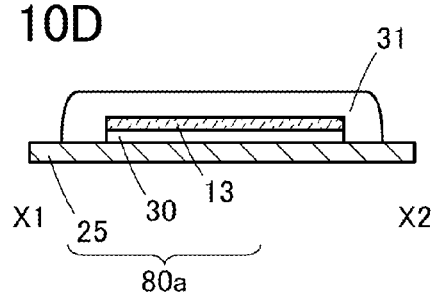 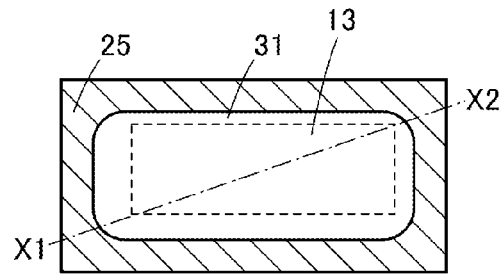
FIG. 10E 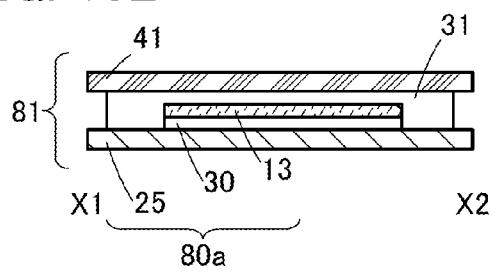 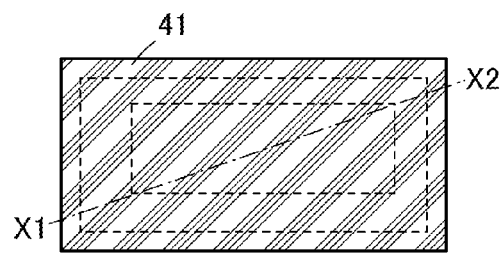

FIG. 12A 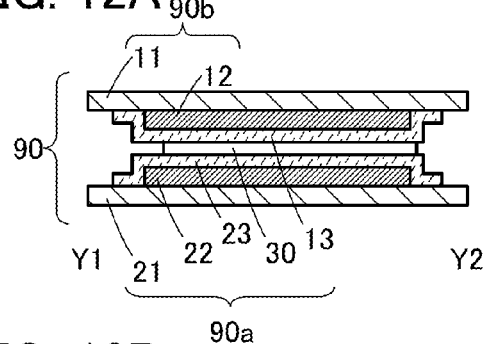 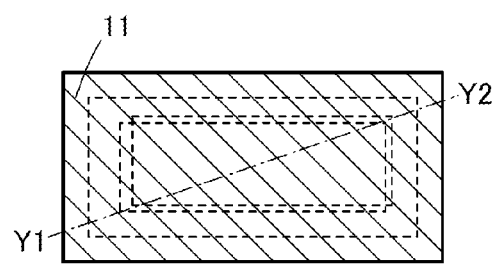
FIG. 12B 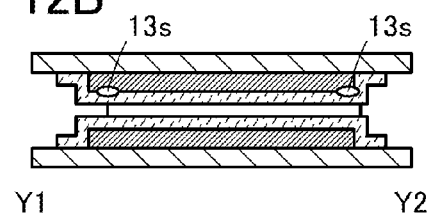 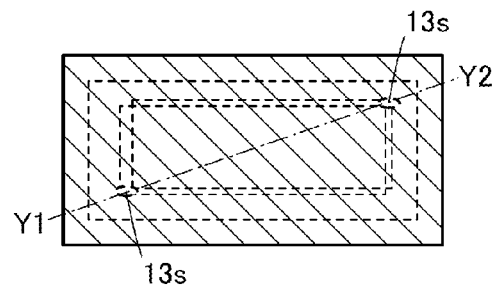

FIG. 12D 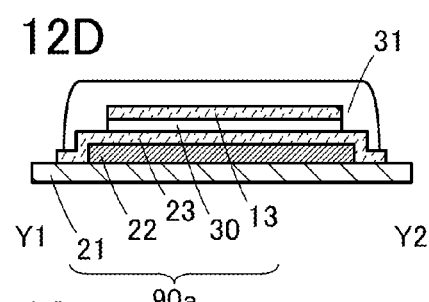 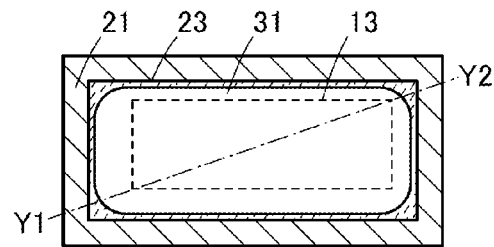
FIG. 12E 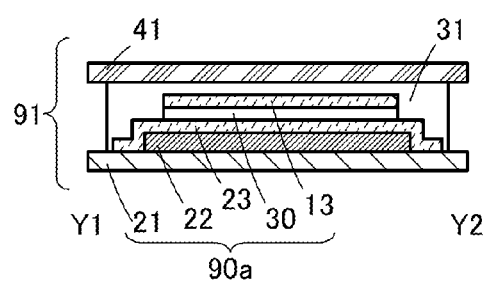 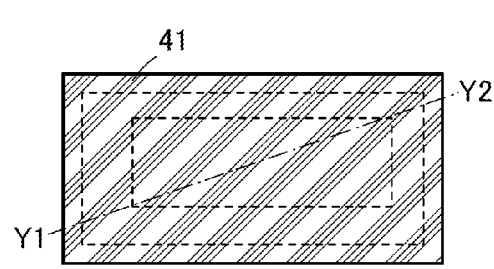

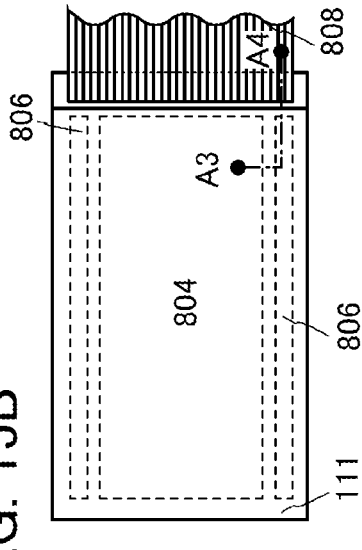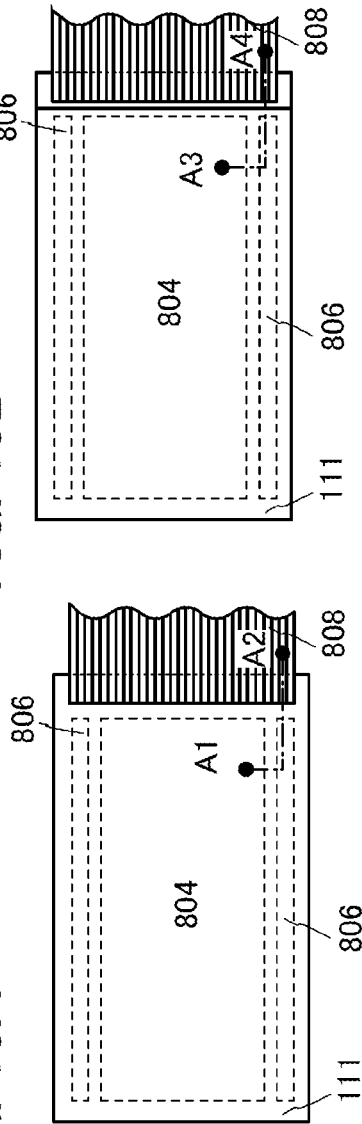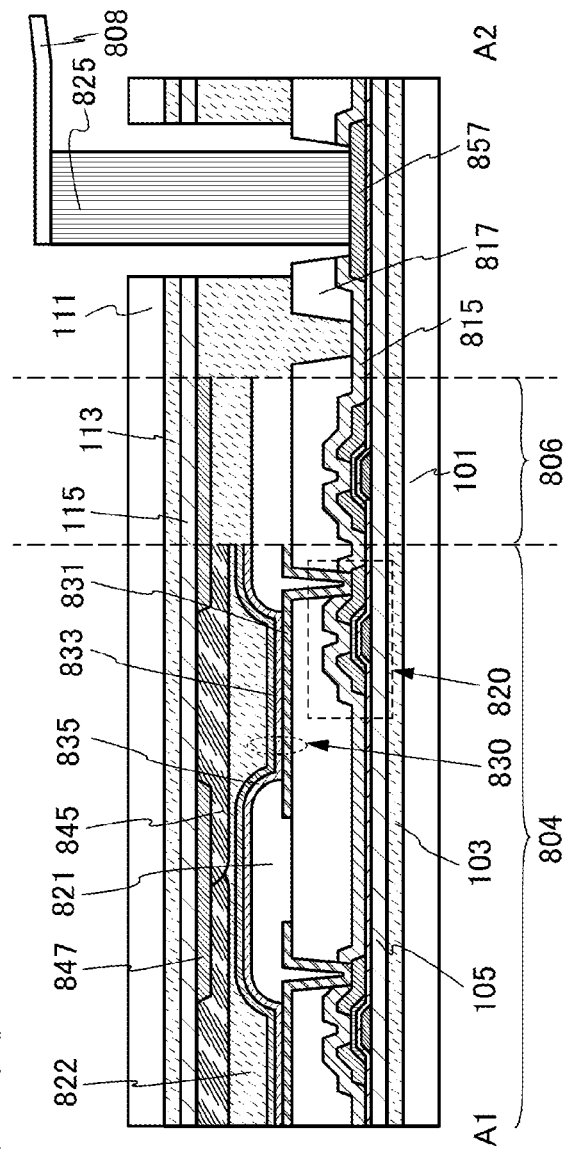

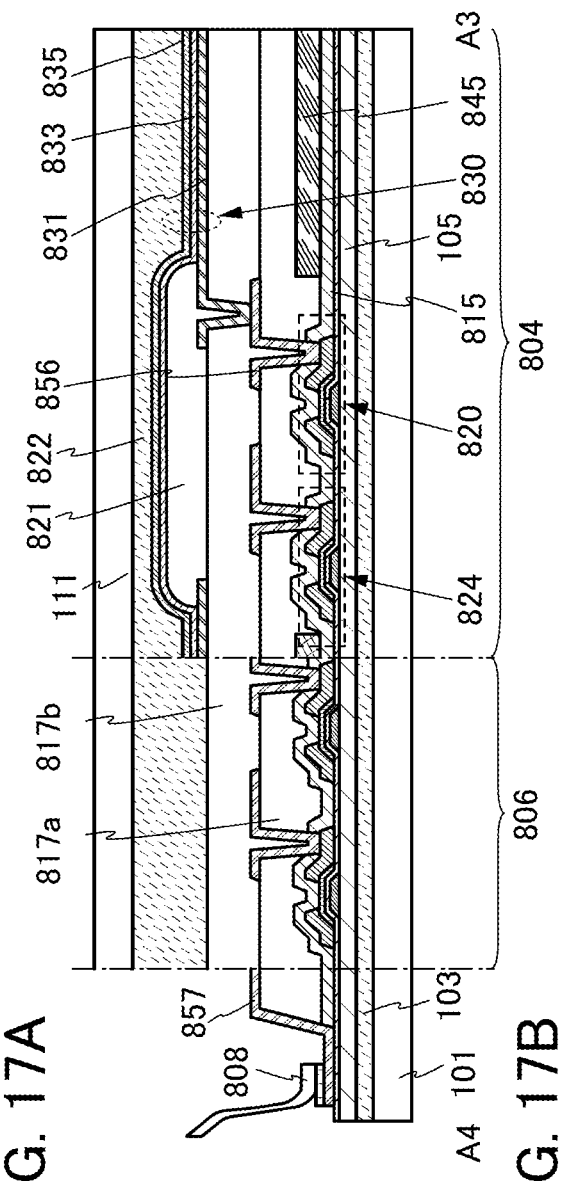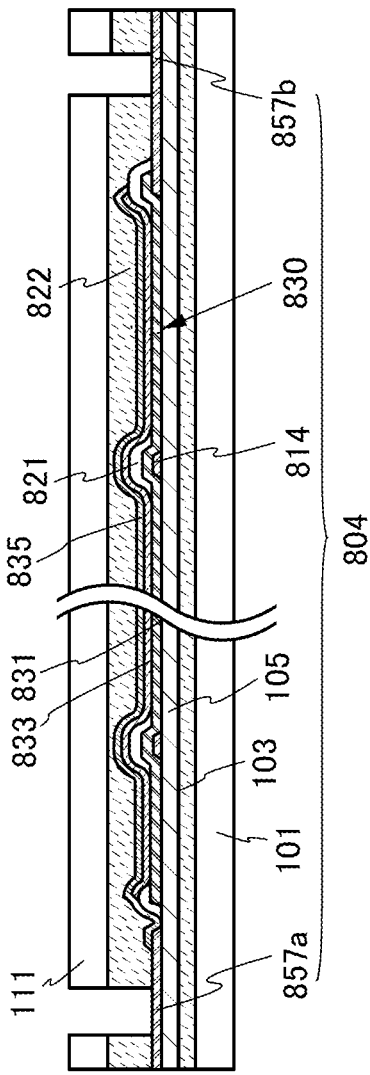
FIG. 17A
FIG. 17B

PEELING APPARATUS

BACKGROUND OF THE INVENTION

1. Field of the Invention

One embodiment of the present invention relates to a peeling apparatus and a stack manufacturing apparatus. One embodiment of the present invention relates to a peeling method and a stack manufacturing method.

Note that one embodiment of the present invention is not limited to the above technical field. One embodiment of the invention disclosed in this specification and the like relates to an object, a method, or a manufacturing method. Moreover, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an electronic device, a lighting device, an input device (e.g., a touch sensor), an output device, an input/output device (e.g., a touch panel), a driving method thereof, and a manufacturing method thereof.

2. Description of the Related Art

In recent years, a flexible device in which a functional element such as a semiconductor element, a display element, or a light-emitting element is provided over a substrate having flexibility (hereinafter also referred to as a flexible substrate) has been developed. Typical examples of the flexible device include a lighting device, an image display device, a variety of semiconductor circuits including a semiconductor element such as a transistor, and the like.

As a method for manufacturing a device including a flexible substrate, a technique has been developed in which a functional element such as a thin film transistor or an organic electroluminescence (EL) element is formed over a formation substrate (e.g., a glass substrate or a quartz substrate), and then the functional element is transferred to a flexible substrate. This technique needs a process of peeling a peeled layer including the functional element from the formation substrate (also referred to as a peeling process).

For example, Patent Document 1 discloses the following peeling technique using laser ablation: a separation layer formed of amorphous silicon or the like is provided over a substrate, a peeled layer which includes a thin film element is provided over the separation layer, and the peeled layer is bonded to a transfer body with the use of an adhesive layer. The separation layer is ablated by laser irradiation, so that peeling occurs at the separation layer.

In addition, Patent Document 2 discloses a technique in which peeling is performed by physical force with human hands or the like. In Patent Document 2, a metal layer is formed between a substrate and an oxide layer and peeling is caused at the interface between the oxide layer and the metal layer by utilizing weak bonding at the interface between the oxide layer and the metal layer, so that a peeled layer and the substrate are separated from each other.

REFERENCE

Patent Document

[Patent Document 1] Japanese Published Patent Application No. H10-125931

[Patent Document 2] Japanese Published Patent Application No. 2003-174153

SUMMARY OF THE INVENTION

An object of one embodiment of the present invention is to improve the yield of a peeling process.

An object of one embodiment of the present invention is to improve the yield of a manufacturing process of a device such as a semiconductor device, a light-emitting device, a display device, an input/output device, an electronic device, or a lighting device. In particular, an object of one embodiment of the present invention is to improve the yield of a manufacturing process of a lightweight, thin, or flexible device.

An object of one embodiment of the present invention is to provide a novel peeling apparatus or a novel stack manufacturing apparatus.

An object of one embodiment of the present invention is to provide a novel display device, a novel light-emitting device, or the like. An object of one embodiment of the present invention is to provide a highly reliable display device, a highly reliable light-emitting device, or the like.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a peeling apparatus that has a function of dividing a process member into a first member and a second member and that includes a support body supply unit, a support body hold unit, a transfer mechanism, and a first structure body. The first structure body has a convex surface. The support body supply unit has a function of unwinding a first support body in rolled sheet form. The support body supply unit includes one of a pair of tension applying mechanisms. The support body hold unit includes the other of the pair of tension applying mechanisms. The pair of tension applying mechanisms has a function of applying a tension to the first support body. The transfer mechanism has a function of transferring the process member. The first structure body is positioned between the support body supply unit and the support body hold unit. The first structure body has a function of bending back the unwound first support body along the convex surface. The first structure body has a function of dividing the process member into the first member and the second member. An angle at which the first structure body bends back the first support body is an obtuse angle.

The peeling apparatus may further include a second structure body. The second structure body has a convex surface. The second structure body is positioned between the first structure body and the support body hold unit. The second structure body has a function of delivering the first support body from the first structure body to the support body hold unit along the convex surface. The second structure body has at least one of a function of applying a tension to the first support body and a function of controlling an angle α at which the first structure body bends back the first support body. The convex surface of the first structure body preferably has a larger radius of curvature than the convex surface of the second structure body. For example, the convex surface of the first structure body can have a radius of curvature of greater than or equal to 0.5 mm and less than or equal to 3000 mm.

The above peeling apparatus may further include a fixing mechanism. The fixing mechanism has a function of fixing the second member separated from the first member.

The above peeling apparatus may further include a liquid feeding mechanism. The liquid feeding mechanism has a function of supplying liquid to a surface where the first member and the second member are separated (separation surface).

The above peeling apparatus may further include a reel. The reel is positioned between the support body supply unit and the support body hold unit. A tape is bonded to one surface of the first support body. The reel has a function of winding up the tape.

The above peeling apparatus may further include a pressure application mechanism. The pressure application mechanism is positioned between the support body supply unit and the first structure body. The pressure application mechanism has a function of bonding the process member and the first support body to each other.

One embodiment of the present invention can improve the yield of a peeling process.

One embodiment of the present invention can improve the yield of a manufacturing process of a device such as a semiconductor device, a light-emitting device, a display device, an input/output device, an electronic device, or a lighting device. In particular, one embodiment of the present invention can improve the yield of a manufacturing process of a lightweight, thin, or flexible device.

One embodiment of the present invention can provide a novel peeling apparatus or a novel stack manufacturing apparatus.

One embodiment of the present invention can provide a novel display device, a novel light-emitting device, or the like. One embodiment of the present invention can provide a highly reliable display device, a highly reliable light-emitting device, or the like.

Note that the description of these effects does not disturb the existence of other effects. One embodiment of the present invention does not necessarily obtain all the effects listed above. Other effects will be apparent from and can be derived from the description of the specification, the drawings, the claims, and the like.

BRIEF DESCRIPTION OF THE DRAWINGS

FIGS. 5A to 5D illustrate a peeling apparatus.
FIG. 9 illustrates a stack manufacturing apparatus.
FIGS. 10A to 10E illustrate a stack manufacturing process.
FIGS. 12A to 12E illustrate a stack manufacturing process.
FIGS. 15A to 15C illustrate light-emitting devices.
FIGS. 17A and 17B illustrate light-emitting devices.

DETAILED DESCRIPTION OF THE INVENTION

Figure 1:
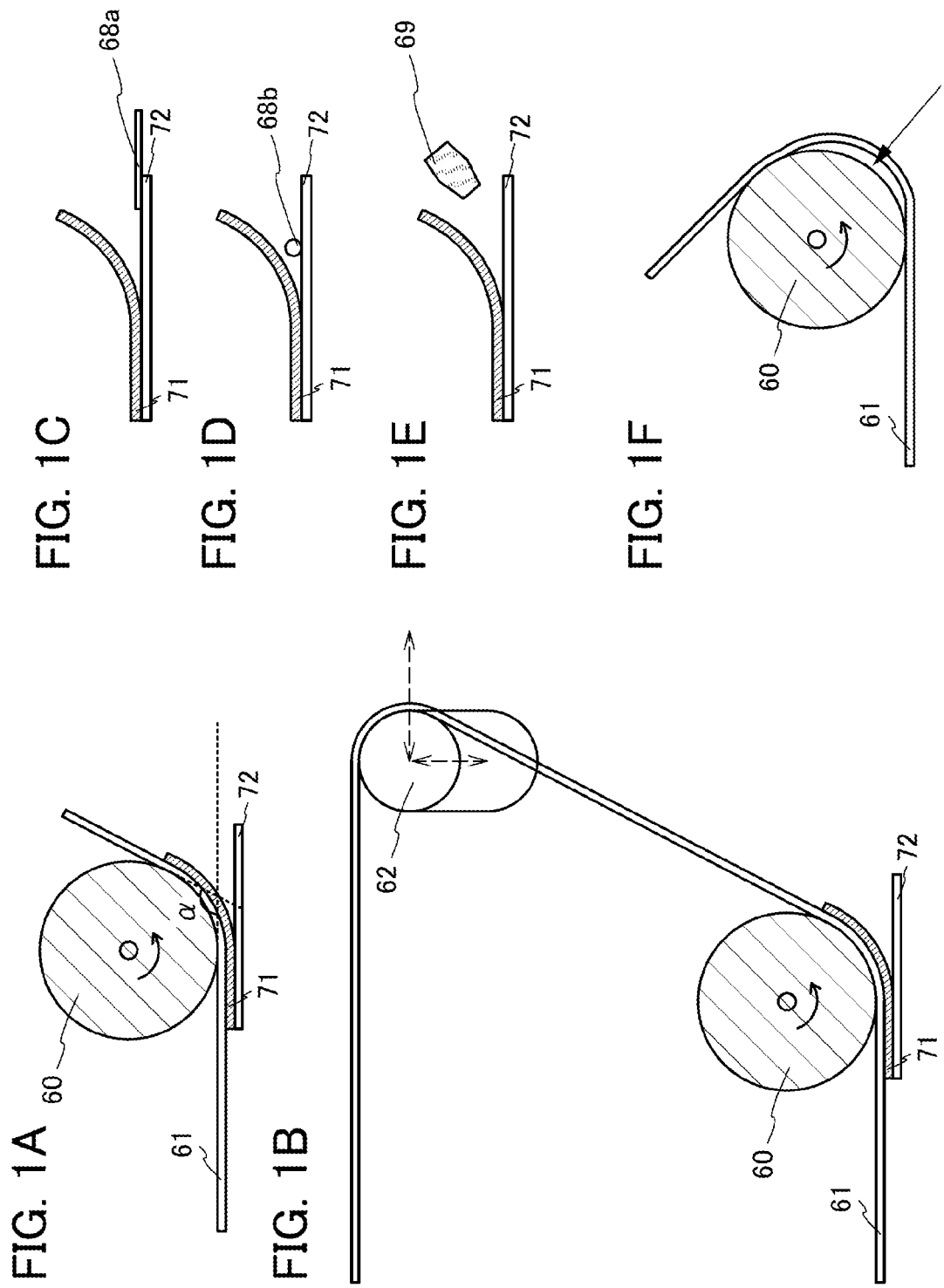
FIGS. 1A to 1F illustrate a peeling apparatus.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is applied to similar functions, and these are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, size, range, or the like disclosed in the drawings and the like.

Note that the terms "film" and "layer" can be interchanged with each other depending on the case or circumstances. For example, the term "conductive layer" can be changed into the term "conductive film" in some cases. In addition, the term "insulating film" can be changed into the term "insulating layer" in some cases.

A peeled layer can be formed over a formation substrate, separated from the formation substrate, and then transferred to another substrate. With this method, for example, a peeled layer which is formed over a formation substrate having high heat resistance can be transferred to a substrate having low heat resistance. The temperature at which the peeled layer is formed is not limited by the substrate having low heat resistance. The peeled layer is transferred to a substrate or the like which is more lightweight, thin, or flexible than the formation substrate, whereby a variety of devices such as a semiconductor device, a light-emitting device, or a display device can be made lightweight, thin, and flexible.

A device that can be manufactured according to one embodiment of the present invention includes a functional element. Examples of the functional element include a semiconductor element such as a transistor; a light-emitting element such as a light-emitting diode, an inorganic EL element, and an organic EL element; and a display element such as a liquid crystal element. For example, a semiconductor device including a sealed transistor and a light-emitting device including a sealed light-emitting element (here, a display device including a transistor and a light-emitting element which are sealed is also included) are also examples of the device that can be manufactured according to one embodiment of the present invention.

As a specific example, since an organic EL element is likely to deteriorate because of moisture or the like, it is preferable that a protective film having an excellent moisture-proof property be formed over a glass substrate at a high temperature and transferred to a flexible organic resin substrate having low heat resistance and a poor moisture-proof property. A highly reliable flexible light-emitting device can be manufactured by forming an organic EL element over the protective film transferred to the organic resin substrate.

Another example is as follows: after a protective film having an excellent moisture-proof property is formed over a glass substrate at a high temperature and an organic EL element is formed over the protective film, the protective film and the organic EL element can be peeled from the glass substrate and transferred to a flexible organic resin substrate having a low heat resistance and a poor moisture-proof property. A highly reliable flexible light-emitting device can be manufactured by transferring the protective film and the organic EL element to the organic resin substrate.

One embodiment of the present invention relates to a device (or a stack that is a part of the device) manufacturing apparatus using such peeling and transfer.

A stack manufacturing apparatus of one embodiment of the present invention includes a supply unit for supplying a process member, a separation unit for dividing the process member into a surface layer and a remaining portion, a bonding unit for bonding a support body to the remaining portion, a support body supply unit for supplying the support body, and an unloading unit for unloading a stack including the remaining portion and the support body bonded to each other with an adhesive layer.

Thus, one surface layer of a process member can be peeled, and a support body can be bonded to a remaining portion of the process member from which the surface layer has been peeled. One embodiment of the present invention can provide a novel stack manufacturing apparatus capable of manufacturing a stack including a support body and a remaining portion of a process member from which a surface layer has been peeled.

In Embodiment 1, peeling apparatuses of embodiments of the present invention will be described. In Embodiments 2 and 3, stack manufacturing apparatuses of embodiments of the present invention each of which includes the peeling apparatus will be described. In Embodiments 4 to 6, a stack which can be manufactured with the stack manufacturing apparatus of one embodiment of the present invention, and examples of a device, an electronic device, and a lighting device which include the stack will be described.

Embodiment 1

In this embodiment, a peeling apparatus of one embodiment of the present invention will be described.

The peeling apparatus of one embodiment of the present invention has a function of dividing a process member into a first member and a second member and includes a support body supply unit, a support body hold unit, a transfer mechanism, and a first structure body. The first structure body has a convex surface. The support body supply unit has a function of unwinding a first support body in rolled sheet form. The support body supply unit includes one of a pair of tension applying mechanisms. The support body hold unit includes the other of the pair of tension applying mechanisms. The pair of tension applying mechanisms has a function of applying tension to the first support body. The transfer mechanism has a function of transferring the process member. The first structure body is positioned between the support body supply unit and the support body hold unit. The first structure body has a function of bending back the unwound first support body along the convex surface. The first structure body has a function of dividing the process member into the first member and the second member. An angle at which the first structure body bends back the first support body is an obtuse angle.

With the use of the peeling apparatus of one embodiment of the present invention, the process member can be divided into the first member and the second member with a high yield. The peeling apparatus of one embodiment of the present invention does not require a complicated structure and can be used for the peeling of process members with a variety of sizes.

Peeling can be performed by a worker manually but in that case, experience is required for a high speed and a high yield of peeling. Thus, automation using the peeling apparatus of one embodiment of the present invention is important. When peeling of a process member is automated with the peeling apparatus of one embodiment of the present invention, transfer and peeling of the process member at a certain speed and peeling with uniform force can be performed, which can inhibit failure of peeling and crack caused in a peeled member.

When crack in the member is inhibited at the time of division of the process member into the first member and the second member, important factors are an angle between the direction in which the process member is transferred with the transfer mechanism and the delivery direction of the first support body changed with the first structure body; a radius of curvature of the convex surface of the first structure body; materials for the first structure body and the first support body; the speed at which the first support body is unwound; and the like.

Note that in this embodiment, the direction in which the process member is transferred with the transfer mechanism is the horizontal direction. The horizontal direction is a direction parallel to a plane (horizontal plane) perpendicular to a direction in which gravity acts. Note that in the peeling apparatus of one embodiment of the present invention, the direction in which the process member is transferred with the transfer mechanism is not limited to the horizontal direction.

As illustrated in FIG. 1A, in the peeling apparatus of one embodiment of the present invention, a first support body 61, which has been attached to a first member 71 in advance, is pulled to peel the first member 71 from a second member 72.

Since a process member is divided while a pair of tension applying mechanisms (not shown) applies tension to the first support body 61 in the peeling apparatus of one embodiment of the present invention, it is possible to inhibit slack in the first member 71 attached to the first support body 61 as well as that of the first support body 61, which can improve the yield of peeling.

Here, when force is applied to the first support body 61 as a result of pulling the first support body 61, failure of peeling or crack in the first member 71 might be caused depending on the speed at which the first support body 61 is unwound, the direction in which the first support body 61 is delivered, or the like.

For example, in the case where the first member 71 includes a stacked-layer structure with low adhesion, peeling might occur at an interface with low adhesion, which causes a reduction in the yield of peeling. In another example in which the first member 71 includes an organic EL element, peeling might occur at an interface between two layers of an EL layer or an interface between the EL layer and an electrode, and accordingly, peeling at the interface between the first member 71 and the second member 72 might be prevented.

In the peeling apparatus of one embodiment of the present invention, an angle α at which the first structure body 60 bends back the first support body 61 is an obtuse angle (i.e., greater than 90° and less than 180°). Peeling at an interface with low adhesion in the first member 71 is thus inhibited and the process member can be divided into the first member 71 and the second member 72 with a high yield.

Note that the angle α means an angle formed between a surface of the first support body 61 before being bent back on the first structure body 60 side (the horizontal plane, or a virtual line indicated by a dotted line) and the surface of the first support body 61 after being bent back on the first structure body 60 side (another virtual line indicated by another dotted line) as shown in FIG. 1A.

For a higher yield of peeling, the angle α is preferably greater than or equal to 110° and less than 180°. For example, the angle α may be greater than or equal to 120° and less than or equal to 165°.

The first member 71 that is separated from the second member 72 is warped or distorted in some cases. It is hard for a robot to transfer or deliver the warped or distorted first member 71. However, in one embodiment of the present invention, the first member 71 can be easily transferred because the first member 71 is attached to the first support body 61.

The peeling apparatus of one embodiment of the present invention may further include a second structure body. The second structure body has a convex surface. The second structure body is positioned between the first structure body and the support body hold unit. The second structure body has a function of delivering the first support body from the first structure body to the support body hold unit along the convex surface. The second structure body has at least one of a function of applying tension to the first support body and a function of controlling an angle α at which the first structure body bends back the first support body.

In the peeling apparatus, the pair of tension applying mechanisms alone does not suffice to apply tension to the entire first support body 61, and a portion of the first support body 61 which does not readily undergo the stress is slacked in some cases. For example, failure of peeling easily occurs when, as indicated by an arrow in FIG. 1F, the first support body 61 is slacked in the vicinity of the position where the process member is divided (which can also be called the vicinity of the first structure body 60) and a gap is formed between the first structure body 60 and the first support body 61.

As shown in FIG. 1B, the peeling apparatus of one embodiment of the present invention includes the second structure body 62 with a convex surface. The second structure body 62 adjusts force applied to the first support body 61 and/or the direction in which the first support body 61 is delivered. Accordingly, the process member can be divided into the first member 71 and the second member 72 with a high yield.

The second structure body 62 may be movable in the vertical direction, the horizontal direction, or the depth direction in the diagram. The tension applied to the first support body 61 can be adjusted by changing the position of the second structure body 62, for example. Alternatively, the angle α at which the first support body 61 is bent back can be adjusted by changing the position of the second structure body 62, for example. The angle α may be adjustable in the range of 110° to less than 180° by changing the position of the second structure body 62, for example. Alternatively, the angle α may be adjustable in the range of 120° to 165°.

FIG. 1B illustrates an example where the second structure body 62 can move in the vertical direction and the horizontal direction. The second structure body 62 may be movable in at least one of a direction parallel to the horizontal plane, a direction perpendicular to the horizontal plane, and a direction tilted relative to the horizontal plane. Note that the second structure body 62 may be able to be driven with a motor.

As illustrated in FIG. 1B, the second structure body 62 may bend back the first support body 61 to change the delivery direction of the first support body 61. Alternatively, the second structure body 62 may wind up the first support body 61 (and the first member 71).

To inhibit slack in the first support body 61, the material for the first structure body 60 and that for the first support body 61 preferably have high adhesiveness to each other.

The peeling apparatus of one embodiment of the present invention preferably includes a flat-plate-like fixing mechanism 68a shown in FIG. 1C or a roller-like fixing mechanism 68b shown in FIG. 1D. The fixing mechanisms 68a and 68b can each fix the second member 72 separated from the first member 71. Thus, the fixing mechanisms 68a and 68b can each prevent the second member 72 from leaving the supporting surface. When the second member 72 leaves the supporting surface, the position of peeling changes and peeling does not proceed normally in some cases. The second member 72 is preferably held down because the second member 72 can be fixed without fail.

Examples of the flat-plate-like fixing mechanism 68a include a metal plate, an organic resin plate of acrylic, plastic, or the like, and a glass plate. Alternatively, an elastic flat plate using rubber, a spring, a resin, or the like may be used.

As the roller-like fixing mechanism 68b, a nip roller or the like can be used.

Note that the fixing mechanism is not limited to the above examples, and a chuck such as a suction chuck, an electrostatic chuck, a mechanical chuck, or a porous chuck, or a table such as a suction table, a heater table, or a spinner table can also be used.

The peeling apparatus of one embodiment of the present invention preferably includes a liquid feeding mechanism 69 shown in FIG. 1E. The liquid feeding mechanism 69 can supply liquid to a separation surface between the first member 71 and the second member 72.

The presence of the liquid in the portion where the peeling proceeds can decrease the force required for the peeling.

Moreover, electrostatic discharge damage to an electronic device or the like can be prevented. Specifically, an adverse effect of static electricity caused at the time of peeling (e.g., damage to a semiconductor element from static electricity) on a functional element or the like included in the first member 71 can be suppressed. Note that liquid can be sprayed in the form of mist or vapor. As the liquid, pure water is preferably used. It is also possible to use an organic solvent or the like. For example, a neutral solution, an alkaline solution, an acid solution, a solution into which salt is melted, or the like may be used.

When the peeling apparatus of one embodiment of the present invention includes the liquid feeding mechanism 69, liquid does not need to be injected through a slight aperture in the process member. During the process using the peeling apparatus, specifically, at the start of separation of the first member 71 and the second member 72, a portion to which liquid is to be injected appears, and thus, liquid can be supplied to the desired portion easily without fail.

Note that one embodiment of the present invention is not limited to the above, and the process member may be transferred into the peeling apparatus of one embodiment of the present invention after liquid is injected to the interface between the first member 71 and the second member 72. During the peeling process, liquid that has been stored in a groove penetrates through the interface between the first member 71 and the second member 72 by capillary action at the same time when the first support body 61 moves, so that an area to be peeled expands. The liquid that has been stored in the groove also has a function of inhibiting static electricity generated in a portion from which peeling starts.

Structure Example of Peeling Apparatus

A peeling apparatus of one embodiment of the present invention will be described with reference to FIGS. 2 to 4 and FIGS. 5A to 5D. Description below is made with reference to mainly FIG. 2. Portions in FIGS. 3 and 4 which are the same as those in FIG. 2 will not be described again, and portions in FIGS. 3 and 4 which are not included in FIG. 2 will be described in detail. FIGS. 5A to 5D illustrate structure examples of a portion that is illustrated as a region Z in FIG. 4.

In this embodiment, an example in which the first member 71 and the second member 72 are separated from each other by peeling the first member 71 from a process member 70 is described. Note that the first member 71 and the second member 72 may be separated from each other by peeling the second member 72 from the process member 70.

The process member 70 has a sheet-like shape and includes the first member 71 and the second member 72 each having a sheet-like shape. The first member 71 and the second member 72 may each have a single-layer structure or a stacked-layer structure. In the process member 70, a peeling trigger is preferably formed. With the trigger, the peeling is easily performed at the interface between the first member 71 and the second member 72. The first member 71 includes at least one of a functional circuit, a functional element, an optical element, and a functional film, for example. For example, the first member 71 can include at least one of a pixel circuit, a pixel driver circuit, a display element, a color filter, and a moisture-proof film of a display device.

Figure 2:
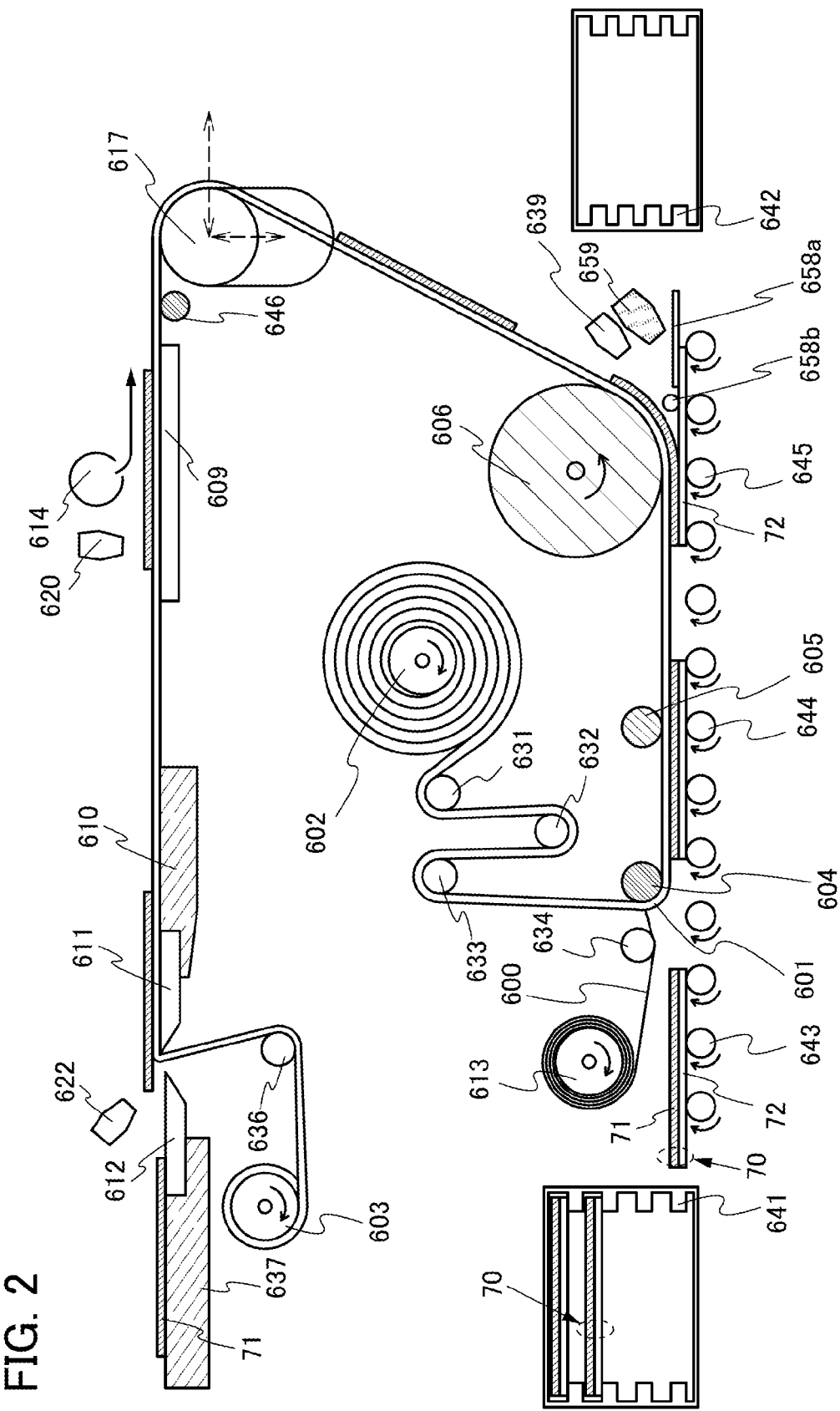
FIG. 2 illustrates a peeling apparatus.

The peeling apparatus in FIG. 2 includes a plurality of transfer rollers (e.g., transfer rollers 643, 644, and 645), a tape reel 602, a first wind-up reel 603, and a first press roller 606.

The tape reel 602 is an example of the support body supply unit. The tape reel 602 can unwind a first support body 601 in rolled sheet form. The speed at which the first support body 601 is unwound is preferably adjustable. When the speed is set relatively low, for example, failure in peeling of the process member or a crack in a peeled member can be inhibited.

The support body supply unit may unwind the first support body 601 continuously. The first support body 601 can be unwound continuously in the case where unwinding of the first support body 601 does not need to be stopped during the process. It is preferable to unwind the first support body 601 continuously because peeling can be performed at a uniform speed and with a uniform force.

The support body supply unit may unwind the first support body 601 intermittently. The first support body 601 may be unwound intermittently in the case where unwinding of the first support body 601 needs to be stopped during the process (e.g., see FIGS. 5B to 5D). Note that at least during peeling, the first support body 601 is preferably unwound continuously for a higher yield of peeling.

For the first support body 601, a film in rolled sheet form made of an organic resin, a metal, an alloy, glass, or the like can be used.

The first support body 601 may be a carrier tape or the like, which is a member that is not a constituent of the device to be manufactured (e.g., flexible device). Alternatively, the first support body 601 may be a flexible substrate or the like, which is a member that is a constituent of the device to be manufactured, like the first member 71.

The support body hold unit can wind up the first support body 601, can wind up the first support body 601 and the first member 71, or can hold an end portion of the first support body 601, for example. The first wind-up reel 603 is an example of the support body hold unit. The first wind-up reel 603 can wind up the first support body 601.

The tape reel 602 includes one of a pair of tension applying mechanisms. The first wind-up reel 603 includes the other of the pair of tension applying mechanisms. The pair of tension applying mechanisms can apply tension to the first support body 601.

The plurality of transfer rollers are an example of the transfer mechanism. The plurality of transfer rollers can transfer the process member 70. The mechanism that transfers the process member 70 is not limited to a transfer roller and may be a different transfer mechanism such as a belt conveyor or a transfer robot. Furthermore, the process member 70 may be placed over a stage over the transfer mechanism.

The transfer roller 643, the transfer roller 644, and the transfer roller 645, each of which is one of the arranged transfer rollers, are provided at predetermined intervals and rotate in the direction in which the process member 70 (or the second member 72) is sent (the clockwise direction as indicated by solid arrows). The plurality of arranged transfer rollers are each rotated by a driving portion (e.g., a motor) which is not illustrated.

The first press roller 606 is an example of the first structure body having a convex surface. The first press roller 606 is rotated by a driving portion (e.g., a motor) which is not illustrated.

When the first press roller 606 rotates, the force of peeling the first member 71 is applied to the process member 70; thus, the first member 71 is peeled. At this time, the process member 70 preferably has a peeling trigger. Peeling of the first member 71 starts from the peeling trigger. As a result, the process member 70 is divided into the first member 71 and the second member 72.

The mechanism that peels the first member 71 from the process member 70 is not limited to the first press roller 606, and it is acceptable as long as the mechanism is a structure body having a convex surface (or a convex curved surface). For example, the mechanism is a cylindrical (e.g., circular cylindrical, right circular cylindrical, elliptic cylindrical, or parabolic cylindrical) or spherical structure body. The mechanism can be a roller such as a drum type roller, for example. Examples of the shape of the structure body include a column with a bottom surface whose boundary includes a curved line (a cylinder with a perfect circle-shaped bottom surface, an elliptic cylinder with an ellipse-shaped bottom surface, or the like), and a column with a bottom surface whose boundary includes a curved line and a straight line (e.g., a column with a semi cylindrical-shaped bottom surface or a semi elliptical cylindrical-shaped bottom surface). If the shape of the structure body is any of such columns, the convex surface corresponds to a curved surface of the column.

As a material for the structure body, a metal, an alloy, an organic resin, rubber, or the like can be used. The structure body may have a space or a hollow inside. Examples of the rubber include natural rubber, urethane rubber, nitrile rubber, and neoprene rubber. In the case of using rubber, it is preferable that a material unlikely to be charged by friction or peeling be used or that countermeasures to prevent static electricity be taken.

The radius of curvature of the convex surface of the structure body can be, for example, greater than or equal to 0.5 mm and less than or equal to 3000 mm. In the case where a film is peeled, for example, the radius of curvature of the convex surface can be greater than or equal to 0.5 mm and less than or equal to 1000 mm, and specifically can be 150 mm, 225 mm, or 300 mm. As an example of the structure body having such a convex surface, a roller with a diameter of 300 mm, 450 mm, or 600 mm can be given. Note that a preferred radius of curvature of the convex surface depends on the thickness or the size of a process member.

When the radius of curvature of the convex surface is too small, an element included in the first member 71 which is peeled along the convex surface might be broken. For this reason, the radius of curvature of the convex surface is preferably greater than or equal to 0.5 mm.

When the radius of curvature of the convex surface is large, a substrate of glass, sapphire, quartz, silicon, or the like, which has low flexibility and high stiffness, can be peeled along the convex surface. For this reason, the radius of curvature of the convex surface is preferably greater than or equal to 300 mm, for example.

However, when the radius of curvature of the convex surface is large, the size of the peeling apparatus might be increased, which might limit the installation location. For this reason, the radius of curvature of the convex surface is preferably less than or equal to 3000 mm, further preferably less than or equal to 1000 mm, still further preferably less than or equal to 500 mm, for example.

A larger radius of curvature of the convex surface is preferable because the angle α at which the first press roller 606 bends back the first support body 601 can be more easily made large. For this reason, the radius of curvature of the convex surface is preferably greater than or equal to 300 mm, for example.

The rotation speed of the first press roller 606 is preferably adjustable. By adjusting the rotation speed of the first press roller 606, the yield of peeling can be further increased.

The first press roller 606 and the plurality of transfer rollers may be movable in at least one of the following directions: the depth direction; the horizontal direction; and the vertical direction. The distance between the convex surface of the first press roller 606 and a supporting surface of the transfer roller is preferably adjustable because peeling can be performed on process members with various thicknesses.

The peeling apparatus in FIG. 2 further includes a flat plate 658a, a roller 658b, a liquid feeding mechanism 659, and a tension roller 617.

The tension roller 617 is an example of the second structure body having a convex surface. The radius of curvature of the convex surface of the second structure body is, for example, less than or equal to the radius of curvature of the convex surface of the first structure body, further preferably less than the radius of curvature of the convex surface of the first structure body. The tension roller 617 can deliver the first support body 601 from the first press roller 606 to the first wind-up reel 603 along the convex surface.

The tension roller 617 can apply tension to the first support body 601. Specifically, the tension roller 617 can pull the first support body 601 in the delivery direction changed with the first press roller 606. In the example shown in FIG. 2, the axis of the tension roller 617 moves in the direction in which the process member 70 is transferred by the transfer mechanism (i.e., moves in the horizontal direction); however, one embodiment of the present invention is not limited to this example.

In addition, the tension roller 617 can adjust the angle α at which the first press roller 606 bends back the first support body 601. In the example shown in FIG. 2, the axis of the tension roller 617 moves in the vertical direction; however, one embodiment of the present invention is not limited to this example.

Furthermore, the tension roller 617 can bend back the first support body 601 and change the delivery direction of the first support body 601. For example, the delivery direction of the first support body 601 may be changed to the horizontal direction. Alternatively, the following structure may be employed: the tension roller 617 bends back the first support body 601 and changes the delivery direction of the first support body 601; then, the delivery direction of the first support body 601 is further changed to the horizontal direction with a direction changing roller 646 (FIG. 2) or a direction changing roller 607 (FIG. 3) positioned between the tension roller 617 and the first wind-up reel 603.

The diameter of the direction changing roller or the tension roller may be smaller than that of the first press roller 606. The direction changing roller or the tension roller may be formed using a material similar to that for the first press roller 606.

The flat plate 658a is an example of the flat-plate-like fixing mechanism 68a and the roller 658b is an example of the roller-like fixing mechanism 68b; thus, the above description can be referred to for the flat plate 658a and the roller 658b. For the liquid feeding mechanism 659, the above description of the liquid feeding mechanism 69 can be referred to.

The peeling apparatus of one embodiment of the present invention may further include the following components.

The peeling apparatus in FIG. 2 includes guide rollers (e.g., guide rollers 631, 632, and 633), a direction changing roller 604, a second press roller 605, a second wind-up reel 613, a drying mechanism 614, and ionizers (e.g., ionizers 639, 620, and 622).

The peeling apparatus may include a guide roller guiding the first support body 601 to the first wind-up reel 603. One guide roller may be used, or a plurality of guide rollers may be used.

The peeling apparatus may include the direction changing roller 604. The direction changing roller 604 enables the first support body 601 to move in substantially the same direction as the transfer direction of the process member 70.

A separation tape 600 (also called separate film) may be bonded to at least one surface of the first support body 601. In this case, the peeling apparatus preferably includes a reel that can wind up the separation tape 600 bonded to one surface of the first support body 601. The reel is positioned between the support body supply unit and the support body hold unit. In the example illustrated in FIG. 2, the second wind-up reel 613 is positioned between the tape reel 602 and the first press roller 606. Furthermore, the peeling apparatus may include a guide roller 634. The guide roller 634 can guide the separation tape 600 to the second wind-up reel 613.

The peeling apparatus preferably includes a pressure application mechanism that can bond the process member 70 and the first support body 601 to each other. The pressure application mechanism is positioned between the support body supply unit and the first structure body. In the example illustrated in FIG. 2, the second press roller 605 is positioned between the tape reel 602 and the first press roller 606.

The second press roller 605 can bond the process member 70 that is transferred by the transfer roller and the first support body 601 that is unwound by the tape reel 602 to each other while applying pressure to them. For example, with the use of the transfer roller 644 and the second press roller 605, a bonding surface of the first support body 601 that has been exposed by peeling the separation tape 600 can be pressed against the process member 70. With the use of the transfer roller 644 and the second press roller 605, a uniform force can be applied to the first support body 601 and the process member 70 while the process member 70 is transferred. As a result, the first support body 601 and the process member 70 can be bonded to each other. Moreover, inclusion of bubbles between the first support body 601 and the process member 70 can be inhibited.

The pressure application mechanism is not necessarily a roller but may be a flat plate or the like. Examples of materials for the roller include stainless steel, resins, and rubber. Examples of the flat plate include a metal plate, an organic resin plate of acrylic, plastic, or the like, and a glass plate. Alternatively, an elastic flat plate using rubber, a spring, a resin, or the like may be used.

The peeling apparatus may include the drying mechanism 614. Since the functional element (e.g., a thin-film integrated circuit) included in the first member 71 is vulnerable to static electricity as described above, it is preferable that liquid be supplied to the interface between the first member 71 and the second member 72 before the first member 71 is peeled or that the peeling be performed while liquid is supplied to the interface. Since a watermark might be formed if the liquid adhered to the first member 71 is vaporized, the liquid is preferably removed immediately after the peeling. Thus, immediately after the peeling from the second member 72, the first member 71 including a functional element is preferably blow-dried to remove a droplet left on the first member 71. Therefore, watermark generation can be suppressed. A carrier plate 609 may be provided to prevent slack in the first support body 601.

Figure 3:
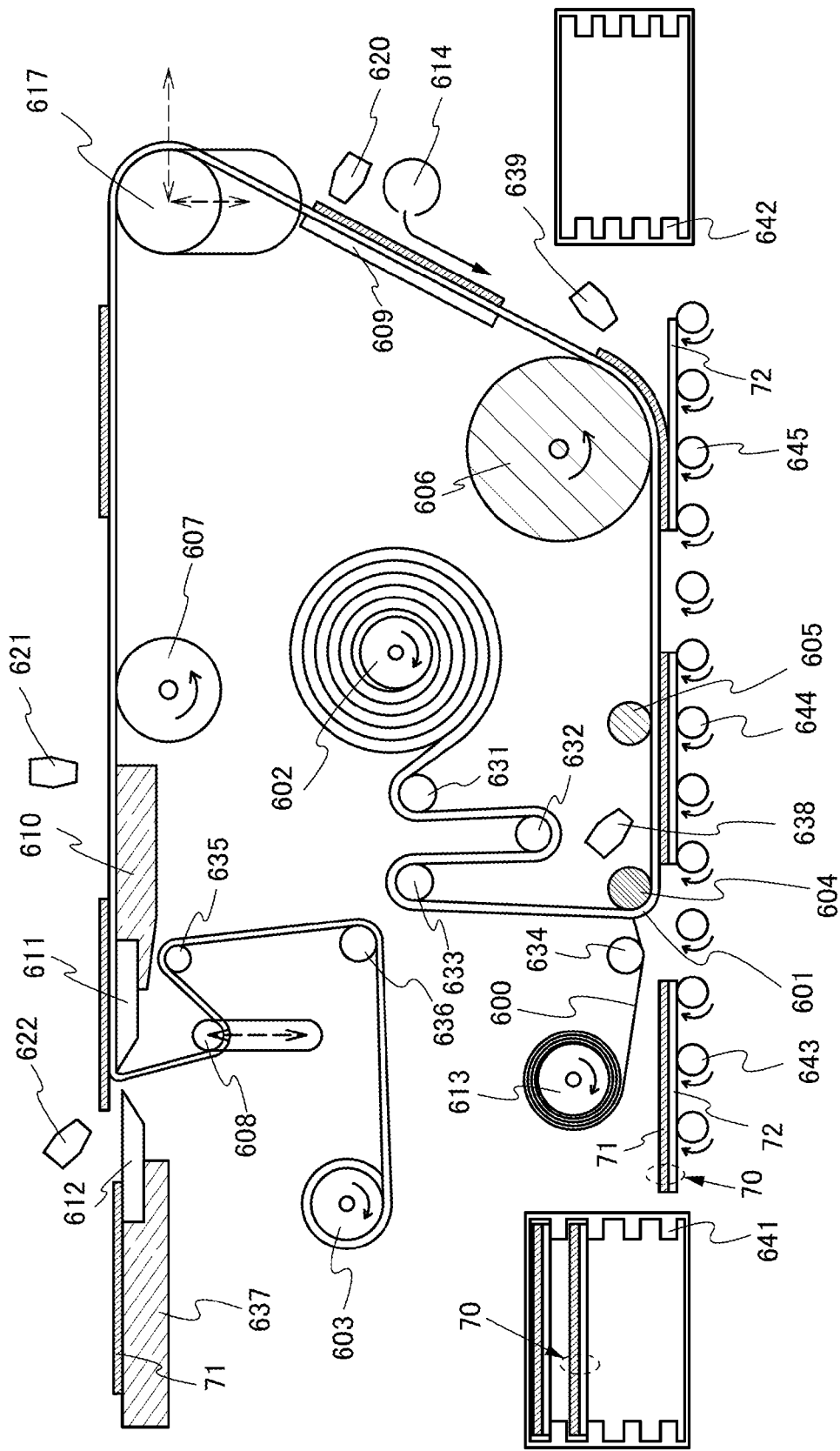
FIG. 3 illustrates a peeling apparatus.

Although the first member 71 may be blow-dried when parallel to the horizontal plane as illustrated in FIG. 2, it is preferable that to drop a droplet, air be made to flow down along the inclination of the first support body 601 while the first support body 601 is transferred in a direction tilted relative to the horizontal plane as illustrated in FIG. 3.

Although the transfer direction of the first support body 601 may be perpendicular to the horizontal plane, the transfer direction is preferably tilted relative to the horizontal plane for higher stability and less shaking of the first support body 601 being transferred.

In the process, at a position where static electricity might be generated, a static eliminator included in the peeling apparatus is preferably used. There is no particular limitation on the static eliminator, and for example, a corona discharge ionizer, a soft X-ray ionizer, an ultraviolet ionizer, or the like can be used.

For example, it is preferable that the peeling apparatus be provided with an ionizer and static elimination be performed by spraying the first member 71 with air, a nitrogen gas, or the like from the ionizer to reduce adverse effects of static electricity on a functional element or a thin-film integrated circuit. It is preferable to use the ionizer particularly in a step of bonding two members to each other or a step of dividing one member. Specifically, the peeling apparatus preferably includes the ionizers 639, 620, and 622 (see FIG. 2). It is further preferable that the peeling apparatus include ionizers 638 and 621 as well (see FIG. 3).

For example, the process member 70 is preferably divided into the first member 71 and the second member 72 while the vicinity of the interface between the first member 71 and the second member 72 is irradiated with ions using the ionizer 639 to remove static electricity.

Pressure may be applied while static electricity is removed by irradiation of the vicinity of the interface between the first support body 601 and the second press roller 605 with ions using the ionizer 638, for example.

The peeling apparatus may include a substrate load cassette 641 and a substrate unload cassette 642. For example, the process member 70 can be supplied to the substrate load cassette 641. Furthermore, the second member 72 can be supplied to the substrate unload cassette 642.

The process member 70 may be transferred from the substrate load cassette 641 onto the guide roller with the transfer mechanism of the peeling apparatus. The second member 72 over the guide roller may be transferred to the substrate unload cassette 642 with the transfer mechanism. In the case where the peeling apparatus is connected to a different apparatus, the process member 70 may be transferred from the different apparatus onto the guide roller with the transfer mechanism. In other words, the peeling apparatus does not necessarily include the substrate load cassette 641. The second member 72 over the guide roller may be transferred to a different apparatus with the transfer mechanism. In other words, the peeling apparatus does not necessarily include the substrate unload cassette 642.

In the peeling apparatus of one embodiment of the present invention, the transfer rollers such as the transfer rollers 643, 644, and 645, the first press roller 606, the tension roller 617, the second press roller 605, and the like are driving rollers rotated by an electric motor or the like. The rotation speed of the tape reel 602 and the first wind-up reel 603 is also adjusted with a motor. These driving rollers, the tape reel 602, and the first wind-up reel 603 adjust the moving speed and tension of the first support body 601. A plurality of guide rollers 631, 632, 633, 634, 635, and 636, the direction changing roller 604, and a tension roller 608 are driven rollers. Note that the second press roller 605 and the tension roller 617 may also be driven rollers.

Furthermore, there is no particular limitation on the number of the rollers provided from the upper stream to the lower stream of the flow of transfer of the first support body 601.

In the peeling apparatus of one embodiment of the present invention, for division of the process member into the first member and the second member, the first support body that is attached to the process member in advance is pulled to peel the first member from the second member, as described above. The process member can be automatically divided with the use of the first support body, which shortens processing time and improves the manufacturing yield of products.

For example, the process member has a structure in which a formation substrate and a functional layer are stacked in this order. The functional layer corresponds to the first member and the formation substrate corresponds to the second member. Here, the first support body may be used as a support body of the functional layer. In other words, the first support body is not necessarily separated from the first member. When a flexible substrate and the functional layer that is exposed by being peeled from the formation substrate are bonded to each other with the use of an adhesive, a flexible device in which the first support body, the functional layer, and the flexible substrate are stacked in this order can be manufactured.

Alternatively, the process member has a structure in which a formation substrate, a functional layer, and a flexible substrate are stacked in this order, for example. The functional layer and the flexible substrate correspond to the first member and the formation substrate corresponds to the second member. Since the first support body attached to the flexible substrate is unnecessary after peeling, the first support body is peeled from the first member. When another flexible substrate and the functional layer that is exposed by being peeled from the formation substrate are bonded to each other with the use of an adhesive, a flexible device in which the flexible substrate, the functional layer, and the flexible substrate are stacked in this order can be manufactured.

Here, when force is applied to the first support body for peeling of the first support body, failure in peeling or a crack in the first member might occur depending on the delivery speed, delivery direction, or the like of the first support body.

By including the components described below, the peeling apparatus of one embodiment of the present invention can automatically separate the first support body and the first member from each other and can have shorter processing time and a higher manufacturing yield of products.

The peeling apparatus in FIG. 2 includes a carrier plate 610, a first wedge-shaped member 611, a second wedge-shaped member 612, a table 637, and the guide roller 636. The peeling apparatus in FIG. 3 further includes the tension roller 608 and the guide roller 635.

The guide rollers 635 and 636 guide the first support body 601 to the first wind-up reel 603.

The tension roller 608 is positioned between the tension roller 617 and the first wind-up reel 603. The tension roller 608 can apply tension in the direction in which the first support body 601 is bent back.

As a roller guiding the first support body 601 to the first wind-up reel 603, at least one of the guide rollers 635 and 636 and the tension roller 608 is preferably provided.

The first wedge-shaped member 611 is preferably provided in a position where the first support body 601 is bent back with the guide roller 635 or 636 or the tension roller 608. The first wedge-shaped member 611 may be fixed to the carrier plate 610. The first wedge-shaped member 611 has a tapered portion. The range of angles at which the first support body 601 can be bent back depends on the angle between a flat surface of the carrier plate 610 and the tapered portion of the first wedge-shaped member 611.

The angle of the direction in which the first support body 601 is bent back is preferably, but not limited to, an acute angle to facilitate peeling of the first member 71 from the first support body 601.

The second wedge-shaped member 612 is fixed to the table 637. The first wind-up reel 603 can wind up the first support body 601 that has passed between the first wedge-shaped member 611 and the second wedge-shaped member 612.

The table 637 has a flat surface. The first member 71 peeled from the first support body 601 is placed on the flat surface.

The flat surface of the carrier plate 610 is preferably positioned higher than the flat surface of the table 637. In other words, the flat surface of the carrier plate 610 and that of the table 637 are not on the same plane and are located at different levels in cross section. As long as the flat surfaces are located at different levels, the first wedge-shaped member 611 and the second wedge-shaped member 612 do not necessarily overlap with each other when seen from above. In the case where the first wedge-shaped member 611 and the second wedge-shaped member 612 overlap with each other, a tip of the second wedge-shaped member 612 is positioned below the first wedge-shaped member 611.

Figure 4:
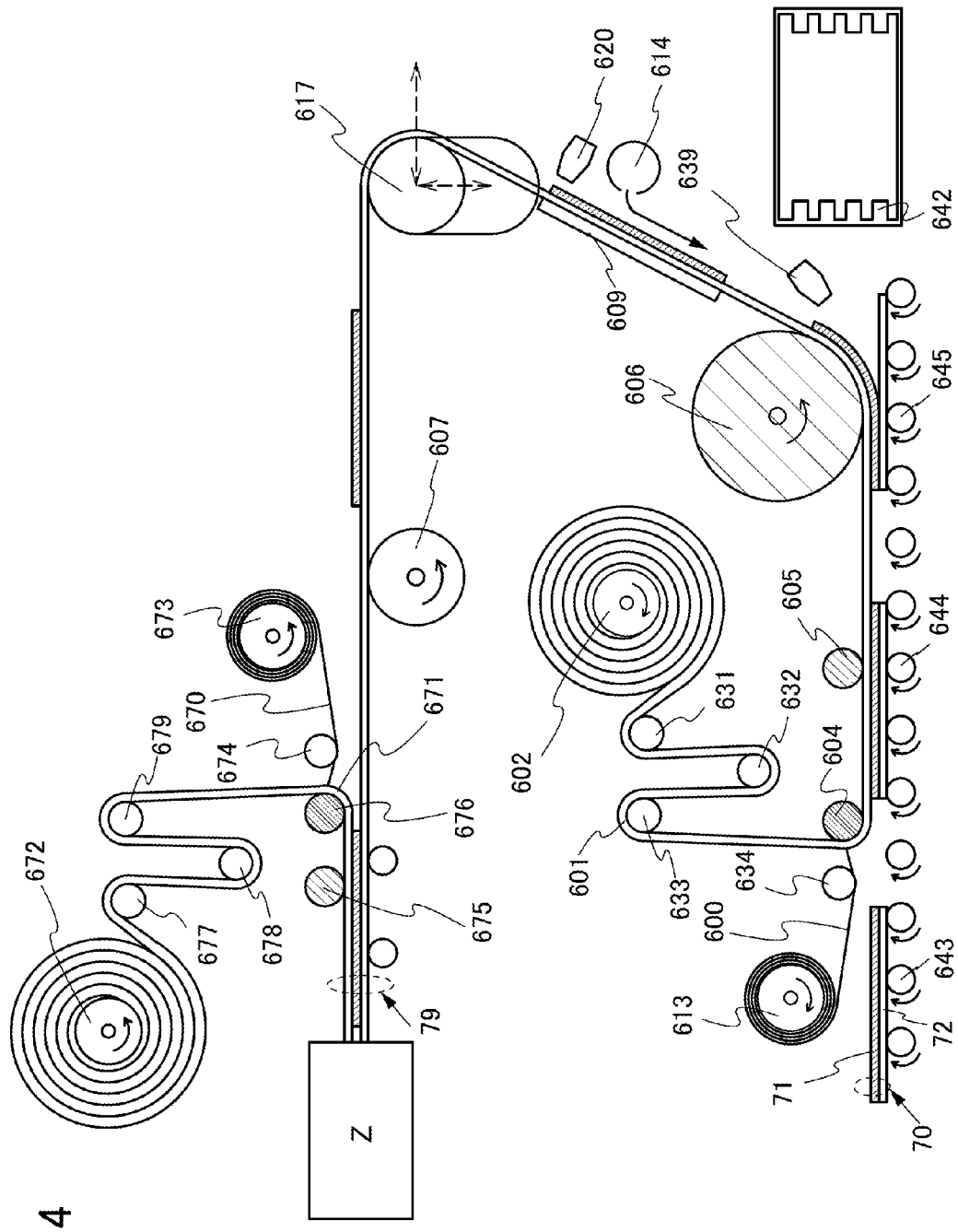
FIG. 4 illustrates a peeling apparatus.

Note that in the case where the first support body 601 and the first member 71 are not separated, the delivery direction of the first support body 601 may be changed to the horizontal direction with the direction changing roller 607 or the tension roller 617, and then, the first member 71 and a support body 671 may be bonded to each other with an adhesive as illustrated in FIG. 4. As a result, a stack 79 in which the first support body 601, the first member 71, and the support body 671 are stacked in this order can be manufactured.

A tape reel 672 can unwind the support body 671 in rolled sheet form. For the support body 671, a material similar to that for the first support body 601 can be used.

The tape reel 672 includes one of a pair of tension applying mechanisms. The other of the pair of tension applying mechanisms is positioned in the portion (see FIGS. 5A to 5D) that is illustrated as the region Z in FIG. 4. Specifically, a third wind-up reel 683 shown in FIG. 5A or a support body hold unit 663 or a fixing mechanism 156a shown in FIG. 5B includes the other of the pair of tension applying mechanisms. The pair of tension applying mechanisms can apply tension to the support body 671. Note that the tension applying mechanism included in the third wind-up reel 683 shown in FIG. 5A or the support body hold unit 663 or the fixing mechanism 156a shown in FIG. 5B is also paired with the tension applying mechanism included in the tape reel 602.

The peeling apparatus may include guide rollers (e.g., guide rollers 677, 678, and 679 in FIG. 4) guiding the support body 671 to the third wind-up reel 683.

A direction changing roller 676 enables the support body 671 to move in substantially the same direction as the transfer direction of the first support body 601.

The third press roller 675 can bond the first member 71 and the support body 671 that is unwound by the tape reel 672 to each other while applying pressure to them. Accordingly, inclusion of bubbles between the support body 671 and the first member 71 can be inhibited.

A separation tape 670 may be bonded to at least one surface of the support body 671. A reel 673 can wind up the separation tape 670. A guide roller 674 can guide the separation tape 670 to the reel 673.

The manufactured stack 79 may be wound up or cut in the region Z shown in FIG. 4. Structure examples of the region Z shown in FIG. 4 are shown in FIGS. 5A to 5D.

FIG. 5A illustrates an example in which the third wind-up reel 683 winds up the stack 79. A guide roller guiding the stack 79 to the third wind-up reel 683, such as guide rollers 665 and 666, may be provided.

FIGS. 5B to 5D illustrates an example in which the stack 79 is cut.

As illustrated in FIG. 5B, an end portion of the stack 79 is held by the support body hold unit 663. The pair of tension applying mechanisms included in the support body hold unit 663 and the tape reel 602 applies tension to the stack 79 before being cut, so that the stack 79 can remain at rest. Note that it is preferable that the first support body 601 and the support body 671 stop being unwound when the stack 79 is cut. In other words, the tape reel 602 and the tape reel 672 preferably unwind the support bodies intermittently. The stack 79 before being cut is also fixed by the fixing mechanism 156a and a fixing mechanism 156b.

The stack 79 is cut using a cutting mechanism 155. The cutting mechanism 155 cuts the stack 79 between the fixing mechanism 156a and the fixing mechanism 156b.

After the stack 79 is cut into a stack 79a and a stack 79b, the stack 79a is fixed with the fixing mechanism 156a and the tape reel 602 and the stack 79b is fixed with a stage 153 and the fixing mechanism 156b.

As illustrated in FIG. 5C, after the stack 79 is cut, the stage 153, the fixing mechanism 156b, and the support body hold unit 663 move away from the stack 79b. Thus, the stack 79b including the first support body 601, the first member 71, and the support body 671 can be taken out from the peeling apparatus. The peeling apparatus may include a transfer mechanism or a carry-out unit for the stack 79b. In one embodiment of the present invention, the stacks can be manufactured with high productivity. One embodiment of the present invention can also be regarded as a stack manufacturing apparatus that performs a peeling process and a bonding process.

The support body hold unit 663 moves to clamp the end portion of the stack 79a held by the fixing mechanism 156a.

Then, the fixing mechanism 156a moves away from the stack 79a as illustrated in FIG. 5D. After that, the first support body 601 and the support body 671 resume being unwound. Meanwhile, the process member is divided, for example. After a certain amount of the first support body 601 is unwound, unwinding is stopped. Then, the operation returns to the state shown in FIG. 5B.

The stage 153 is movable in at least one of the following directions: the depth direction; the horizontal direction; and the vertical direction. Examples of the fixing mechanism for fixing the stack 79 placed over the stage 153 include a chuck such as a suction chuck, an electrostatic chuck, a mechanical chuck, or a porous chuck, and a table such as a suction table, a heater table, or a spinner table.

The cutting mechanism 155 is not particularly limited as long as it can cut the stack 79; for example, a sharp edge tool such as a cutter or a laser can be used.

The fixing mechanisms 156a and 156b are not particularly limited as long as they can fix the stack 79; for example, clips can be used. The fixing mechanisms 156a and 156b are movable in at least one of the following directions: the depth direction; the horizontal direction; and the vertical direction.

Process Example

A process in which a process member is divided into a first member and a second member with the use of the peeling apparatus in FIG. 3 is described below.

In mass production of flexible devices, a peeled layer including a thin-film integrated circuit or the like is formed over a large-area formation substrate and is automatically peeled from the formation substrate, whereby shorter processing time and a higher manufacturing yield of the products can be achieved. In addition, manufacturing cost of the products can be reduced.

This embodiment describes an example using a large-area formation substrate, which is cut into four parts later. Note that in one embodiment of the present invention, the size of the formation substrate is not limited, and the formation substrate is not necessarily cut. The formation substrate may be cut into any number of parts.

In this process example, the process member 70 includes a glass substrate 401, an insulating layer 402, a peeling layer 403, an insulating layer 404, a layer 405 including a thin-film integrated circuit, and a flexible substrate 406 which are stacked in this order. The glass substrate 401, the insulating layer 402, and the peeling layer 403 correspond to the second member 72, and the insulating layer 404, the layer 405 including a thin-film integrated circuit, and the flexible substrate 406 correspond to the first member 71.

First, the large glass substrate 401 is prepared as a formation substrate. When a substrate is large, the number of products per substrate is also large, resulting in reduced manufacturing costs. Although there is no particular limitation on the size of the formation substrate, a glass substrate with a size of, for example, 600 mm×720 mm is used.

There is no particular limitation on the formation substrate as long as the formation substrate has heat resistance high enough to withstand a manufacturing process and a thickness and a size which can be used in a manufacturing apparatus. Examples of materials that can be used for the formation substrate include glass, quartz, sapphire, ceramics, metal, an inorganic material, and an organic resin. For example, a semiconductor wafer or a steel plate may be used.

Next, the insulating layer 402 is formed over the glass substrate 401. The insulating layer 402 has a function of preventing the glass substrate 401 from being etched by etching of the peeling layer 403, which is formed later. Alternatively, the insulating layer 402 has a function of preventing diffusion of impurities contained in the glass substrate 401. The insulating layer 402 can be formed using one or more films selected from a silicon nitride film, a silicon oxide film, a silicon nitride oxide film, and a silicon oxynitride film.

After the peeling layer 403 is formed, it is selectively etched to remove at least part of the peeling layer 403 which is at the edge of the substrate.

As examples of a material that can be used for the peeling layer 403, an inorganic material, an organic material, and the like can be given.

Specific examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon. A crystal structure of a layer containing silicon may be amorphous, microcrystal, or polycrystal.

Specific examples of the organic material include polyimide, polyester, polyolefin, polyamide, polycarbonate, and an acrylic resin.

The peeling layer 403 may have a single-layer structure or a stacked-layer structure.

In the case where the peeling layer 403 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum is, for example, an alloy of tungsten and molybdenum.

In the case where the peeling layer 403 has a stacked-layer structure, a stacked-layer structure including a layer containing tungsten and a layer containing an oxide of tungsten can be employed, for example.

The layer containing an oxide of tungsten may be formed by stacking another layer with a layer containing tungsten; for example, the layer containing an oxide of tungsten may be formed by stacking a film containing oxygen, such as a silicon oxide film or a silicon oxynitride film, over a layer containing tungsten.

The layer containing an oxide of tungsten may be formed by performing thermal oxidation treatment, oxygen plasma treatment, nitrous oxide ($N_2O$) plasma treatment, treatment with a solution having strong oxidizing power (e.g., ozone water), or the like on a surface of a layer containing tungsten.

The peeling layer 403 can be formed by a sputtering method, a plasma CVD method, a coating method, a printing method, or the like. Note that the coating method includes a spin coating method, a droplet discharge method, and a dispensing method.

Note that the peeling layer is not necessarily provided in the case where peeling at an interface between the formation substrate and the peeled layer is possible. For example, glass is used as the formation substrate, an organic resin such as polyimide, polyester, polyolefin, polyamide, polycarbonate, or acrylic is formed in contact with the glass, and the insulating layer 404, the layer 405 including a thin-film integrated circuit, and the like are formed over the organic resin. In this case, locally heating the organic resin by laser light or the like enables peeling at the interface between the formation substrate and the organic resin. Alternatively, peeling at the interface between a metal layer and the organic resin may be performed in the following manner: the metal layer is provided between the formation substrate and the organic resin and current is made to flow in the metal layer so that the metal layer is heated. At this time, the organic resin can be used as a substrate of a device such as a light-emitting device. Alternatively, the organic resin may be bonded to a substrate with an adhesive.

Figure 6A:
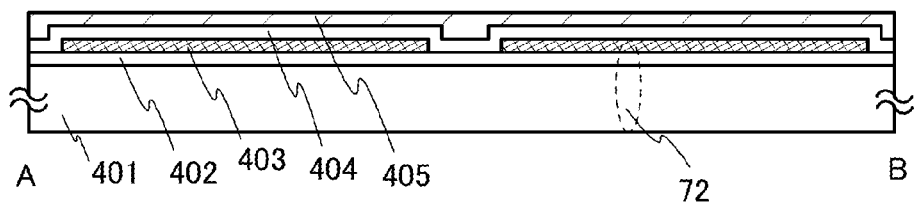
FIGS. 6A to 6E illustrate a peeling apparatus.
Figure 7A:
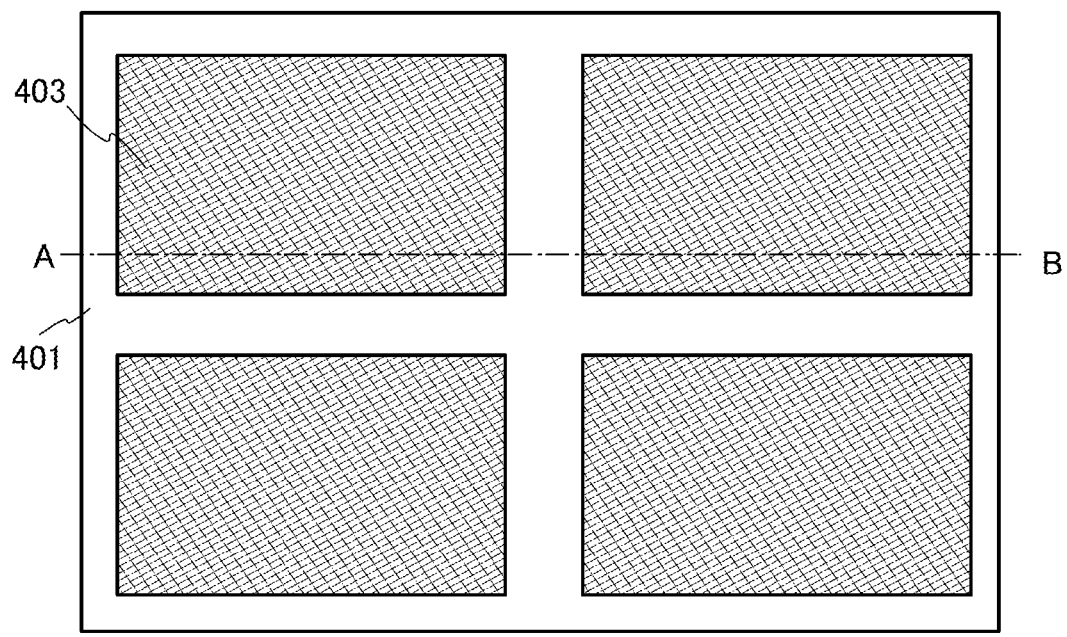
FIGS. 7A to 7C illustrate a peeling method.

Then, the insulating layer 404 is formed, and the layer 405 including a thin-film integrated circuit is formed thereover (FIG. 6A). FIG. 7A is a plan view of the glass substrate 401. A cross-sectional view taken along a dashed-dotted line A-B in FIG. 7A corresponds to FIG. 6A. Note that in the plan view, some components are not shown.

The insulating layer 404 can be formed using, for example, one or more films selected from a silicon nitride film, a silicon oxide film, a silicon nitride oxide film, and a silicon oxynitride film.

In this embodiment, the peeling layers 403 are formed in four positions as illustrated in FIG. 7A. Note that in one embodiment of the present invention, the peeling layer 403 provided in one position may be cut into four parts.

Next, the glass substrate 401 is cut into four parts with a scriber or a breaker. After that, the flexible substrate 406 is placed so that the layer 405 including a thin-film integrated circuit is positioned between the glass substrate 401 and the flexible substrate 406. Note that the case where a prepreg sheet which can be bonded by hot press (thermocompression) is used as the flexible substrate 406 is described here.

Note that the flexible substrate 406 can be replaced with a flexible substrate provided with an adhesive layer. For the adhesive layer, a glass layer with a melting point of 400° C. or lower, preferably 300° C. or lower, an adhesive, or the like can be used, for example.

Examples of the adhesive include a light curable adhesive such as a UV curable adhesive, a reactive curable adhesive, a heat curable adhesive, and an anaerobic adhesive. A sheet-like adhesive is preferably used because the manufacturing process can be shortened and the manufacturing apparatus can be simplified.

Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin.

As an example of the flexible substrate, a substrate with flexibility that uses a material similar to that for the formation substrate can be given.

The flexible substrate 406 is subjected to vacuum hot press, for example, at 195° C. for 2 hours (including a heatup time of 30 minutes) in order to be fixed to the layer 405 including a thin-film integrated circuit. Note that the vacuum hot press is preferably performed with the flexible substrate 406 interposed between buffers in order to prevent the flexible substrate 406 from being bonded to a press plate.

Figure 6B:
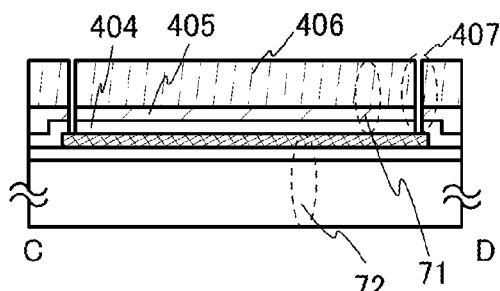
Figure 7B:
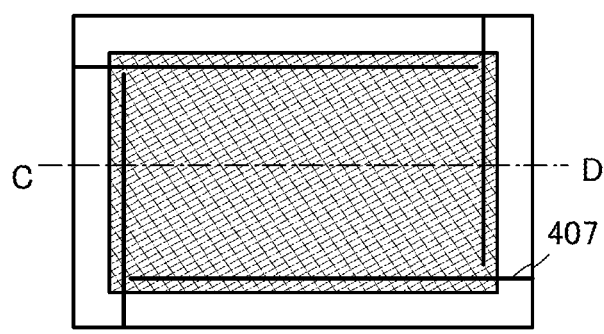

Next, a groove 407 serving as a peeling trigger is formed. Here, the groove 407 is formed with a $CO_2$ laser (wavelength: 266 nm) apparatus (FIG. 7B). The groove 407 where the peeling layer 403 is exposed is formed by the laser light. In the case where irradiation with the laser light with a wavelength of 266 nm is performed, a metal film is not removed but an insulating film and the like over the metal film can be removed selectively. FIG. 6B is a cross-sectional view taken along a dashed-dotted line C-D in FIG. 7B.

The peeling trigger can be formed with any of a variety of lasers or a sharp knife such as a cutter. For example, the peeling trigger can be formed by inserting a sharp tip into the peeling layer 403 or the insulating layer 404. Alternatively, the peeling trigger can be formed by peeling part of the insulating layer 404 from the peeling layer 403 by a non-contact method using a laser or the like (e.g., a laser ablation method). The peeling trigger can be formed to have a point-like shape or a linear shape (including a solid line shape, a dashed line shape, and a frame-like shape).

In one embodiment of the present invention, the groove may be formed by irradiating the periphery of the peeling layer 403 with laser light without a break. However, when the groove is formed in the periphery of the peeling layer 403 without a break, peeling might start immediately after that, causing the entire region surrounded by the groove to be peeled. In addition, if part of the region surrounded by the groove is peeled at the time of the formation of the groove in the periphery of the peeling layer 403 without a break, it might be difficult to attach a support film in a later step. It is thus preferable to provide areas where the grooves 407 are not formed at the four corners of the periphery of the peeling layer 403 as illustrated in FIG. 7B. Here, two adjacent grooves preferably have a distance of, for example, 1 cm or more and 2 cm or less therebetween.

Figure 6C:
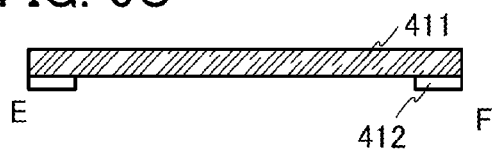
Figure 6D:
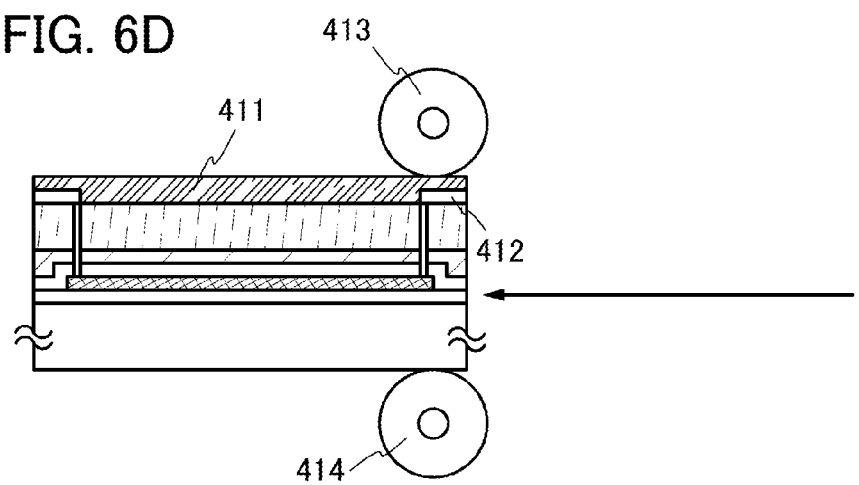
Figure 7C:
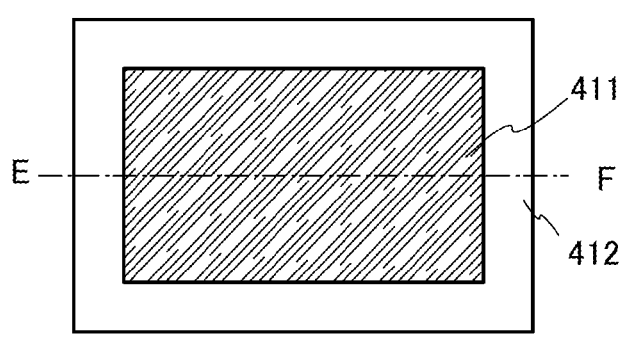

Next, a support film 411 is attached to the flexible substrate 406. The support film 411 is not necessarily attached. One surface of the support film 411 is provided with a protective sheet. The protective sheet is peeled to expose an adhesion surface of the support film 411. In this embodiment, a protective sheet 412 remains in the periphery of the support film 411 so that the center of the support film 411 is exposed as illustrated in FIG. 7C. FIG. 6C is a cross-sectional view taken along the dashed-dotted line E-F in FIG. 7C that is a plan view. It is preferable that the support film 411 be bonded to the flexible substrate 406 such that the protective sheet 412 overlaps with the groove 407. The support film 411 can be uniformly attached to the flexible substrate 406 by being passed through between a pair of rollers 413 and 414, as illustrated in FIG. 6D.

Note that the support film 411 is not particularly limited as long as it is a pressure sensitive one-side adhesive tape, and can be a film made of polyethylene or the like (e.g., a PET film), a polypropylene film, or the like. The support film 411 not only prevents electrostatic breakdown but also functions as a support of the layer 405 including a thin-film integrated circuit.

Figure 6E:
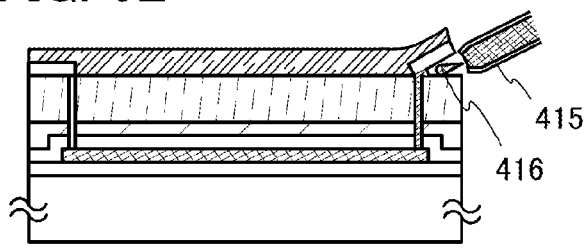

Next, as illustrated in FIG. 6E, a droplet 416 is injected to the groove 407 with an injector 415 which is in the form of a dropper or a syringe. Note that even when the amount of the droplet 416 to be supplied is small, static electricity generation in a later peeling process can be inhibited. Portions which overlap with the support film 411 with the protective sheet 412 interposed therebetween (i.e., portion overlapping with the groove 407 and a region outside the portion) are not bonded to the flexible substrate 406. The droplet 416 is injected to a space between the protective sheet 412 and the flexible substrate 406 with the injector 415.

In the case where the peeling apparatus of one embodiment of the present invention includes a liquid feeding mechanism or the like, the droplet 416 is not necessarily injected.

In addition, if necessary, pretreatment in which pressure is applied along the groove 407 with a sharp tool such as a knife may be performed before the injection of the droplet 416 into the groove 407 for the purpose of smooth peeling.

Next, the glass substrate 401 provided with the support film 411 is set in the substrate load cassette 641 in the peeling apparatus of one embodiment of the present invention. After that, the glass substrate 401 is placed on the transfer roller 643 with the use of a substrate transfer mechanism (not illustrated). The glass substrate 401 on the transfer roller 643 is transferred to the substrate unload cassette 642 though the transfer rollers 644 and 645.

Figure 8A:
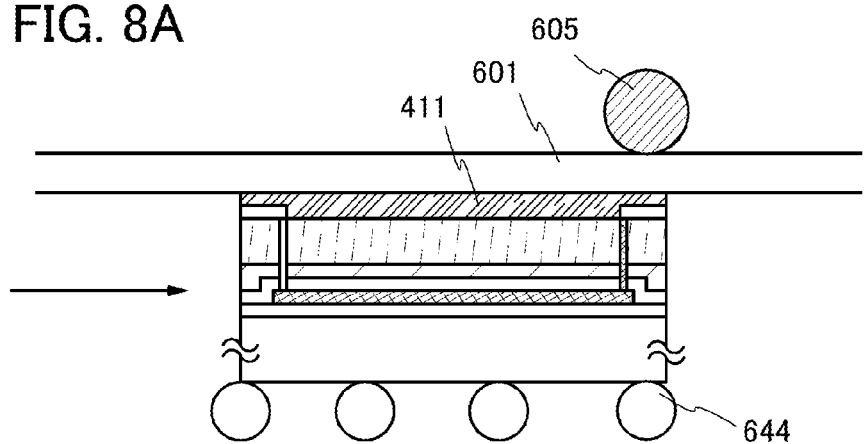
FIGS. 8A to 8C illustrate a peeling method.

While the glass substrate 401 is transferred by the transfer roller 644, the first support body 601 is bonded to the support film 411 as illustrated in FIG. 8A. The first support body 601 is unwound from the tape reel 602 and is guided to the first wind-up reel 603 by the plurality of guide rollers 631, 632, and 633, and the like.

The separation tape 600 is peeled from the first support body 601 unwound from the tape reel 602 to expose a bonding surface of the first support body 601, and then the first support body 601 is attached to the support film 411. The separation tape 600 is peeled by being pulled by the second wind-up reel 613 through a guide roller 634. Furthermore, the first support body 601 whose bonding surface is exposed is bent back, and is pulled by the first press roller 606 rotated by a driving portion (e.g., a motor) to be moved by the direction changing roller 604 in substantially the same direction as the transfer direction of the glass substrate 401.

As illustrated in FIG. 8A, the bonding surface of the first support body 601 which is exposed by peeling the separation tape 600 is pressed against the support film 411 by the second press roller 605 and the second transfer roller 644.

The glass substrate 401 to which the support film 411 is attached is transferred to the position where the first press roller 606 overlaps with the groove 407 by the plurality of transfer rollers. The first press roller 606 rotates while pressing the glass substrate 401, so that the layer 405 including a thin-film integrated circuit is peeled from the glass substrate 401 because of a difference between the adhesive strength between the glass substrate 401 and the peeling layer 403 and the adhesive strength between the first support body 601 and the support film 411.

Note that the adhesive strength between the support film 411 and the layer 405 including a thin-film integrated circuit is stronger than that between the first support body 601 and the support film 411. However, the peeling process does not depend on the adhesive strength of the first support body 601.

In addition, the first press roller 606 applies pressure at which the glass substrate 401 is not broken. In this embodiment, the thickness of the glass substrate 401 which is a support substrate is 0.7 mm and the thickness of the first support body 601 is 0.1 mm. Setting the distance between the second press roller 605 and the second transfer roller 644 to less than 0.75 mm might cause the breakage of the glass substrate 401.

A rubber member is preferably used for the first press roller 606 and the second press roller 605 in order to prevent the breakage of the glass substrate 401. The use of rubber enables more uniform pressure application than the use of a metal.

The angle $\alpha$ at which the first press roller 606 bends back the first support body 601 is an obtuse angle. Peeling at an interface with low adhesion in the process member 70 is thus inhibited and the process member 70 can be divided into the first member 71 and the second member 72 with a high yield.

When separation from the glass substrate 401 is completed after peeling, the liquid remains on the layer 405 including a thin-film integrated circuit. For this reason, the layer 405 including a thin-film integrated circuit is blow-dried from one direction while being held tilted relative to the horizontal plane, preferably at an angle of approximately 60° so that the liquid is dripped down.

After the blow-dry, the first support body 601 that has been moved obliquely is made to move in the horizontal direction with the roller changing the delivery direction of the first support body 601 into the horizontal direction.

After the peeling process, the first support body 601 which moves in the horizontal direction again is made in contact with the tip of the first wedge-shaped member 611 fixed to the carrier plate 610 and the first support body 601 is bent back along the tip, whereby the layer 405 including a thin-film integrated circuit is separated from the first support body 601.

Figure 8B:
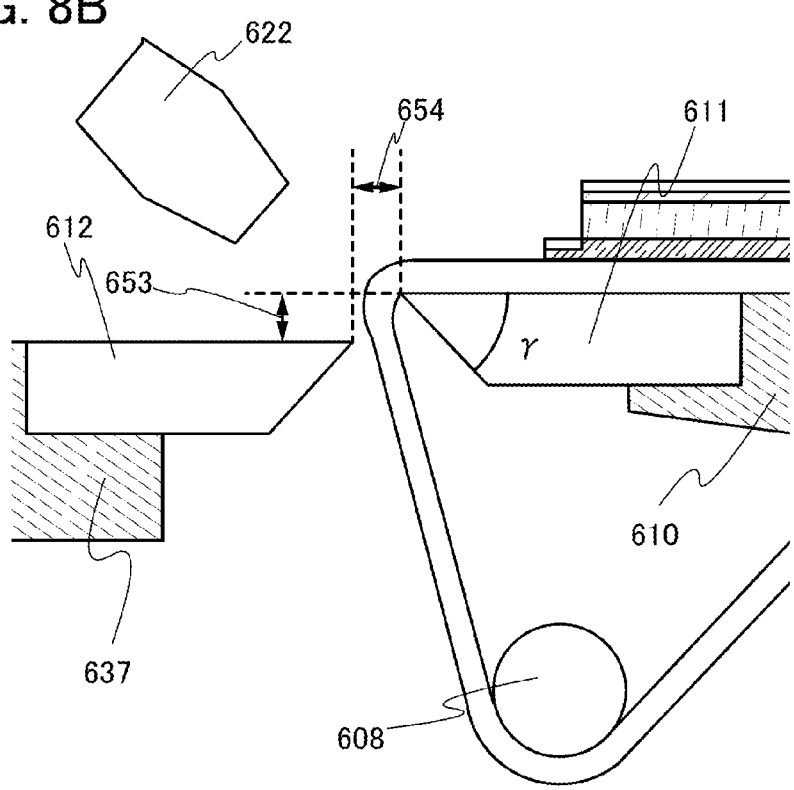

FIG. 8B is an enlarged view of the tip of the first wedge member 611 and the surroundings thereof in FIG. 3.

An angle $\gamma$ of the tip of the first wedge-shaped member 611 is preferably an acute angle of less than 90° with respect to a plane which is horizontal to the flat surface of the carrier plate 610 (the plane is indicated by a virtual dotted line) illustrated in FIG. 8B. In that case, the first member 71 can be easily peeled from the first support body 601. The tip of the first wedge-shaped member 611 is made to be sharp or thin, so that the first support body 601 can be peeled without fail. Note that the first support body 601 is not cut by the tip of the first wedge-shaped member 611.

The tension of the first support body 601 is controlled by the tension roller 608. The axis of the tension roller 608 can move up and down, and the tension of the first support body 601 can be adjusted by changing the position of the axis. The first support body 601 that has been peeled by being bent back along the tip of the first wedge-shaped member 611 is guided to the first wind-up reel 603 by the guide rollers 635 and 636.

The table 637 with the flat surface on which the layer 405 including a thin-film integrated circuit which is peeled from the first support body 601 is placed is provided with the second wedge-shaped member 612. It is important that a surface parallel to the flat surface of the table 637 does not align with a surface parallel to the flat surface of the carrier plate 610, that is, the surfaces are not on the same plane. When the surfaces are on the same plane, the layer 405 including a thin-film integrated circuit might be bent back together with the first support body 601 and might not be peeled from the first support body 601. In this embodiment, as illustrated in FIG. 8B, the surface parallel to the flat surface of the table 637 and the surface parallel to the flat surface of the carrier plate 610 are located at different levels so that the former is lower than the latter. A level difference 653 between the surfaces is set to approximately 2 mm; however, it is not limited thereto. The level difference 653 also depends on the thickness and material of the first support body 601, a distance 654 between the first wedge-shaped member 611 and the second wedge-shaped member 612, and the like, and thus is set as appropriate in consideration of these elements.

In this embodiment, the distance 654 between the first wedge-shaped member 611 and the second wedge-shaped member 612 is set to 2 mm; however, the distance 654 is not particularly limited thereto. If the first wedge-shaped member 611 and the second wedge-shaped member 612 have a difference in level, they may partly overlap with each other when seen from above.

The structure illustrated in FIG. 8B enables the first support body 601 to be peeled stably without excessive load on the layer 405 including a thin-film integrated circuit.

Figure 8C:
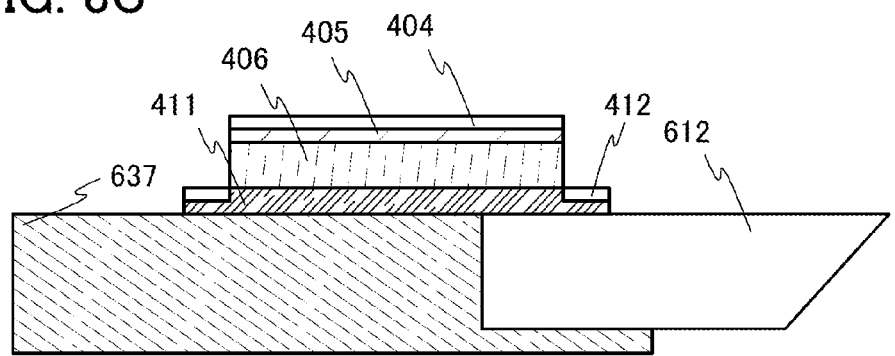

The layer 405 including a thin-film integrated circuit which is separated from the first support body 601 is placed on the table 637 so that the support film 411 is in contact with the table 637. FIG. 8C illustrates a state in which the layer 405 including a thin-film integrated circuit is placed on the table 637 after being peeled from the first support body 601. As illustrated in FIG. 8C, a stack which includes the flexible substrate 406, the layer 405 including a thin-film integrated circuit, and the insulating layer 404 over the support film 411 is placed on the table 637 with a rear surface of the insulating layer 404 exposed. In addition, the protective sheet 412 is provided in the periphery of the support film 411. The flexible substrate 406, the layer 405 including a thin-film integrated circuit, and the insulating layer 404 do not overlap with an exposed surface of the protective sheet 412.

This embodiment can be combined with any of the other embodiments as appropriate.

Embodiment 2

In this embodiment, a stack manufacturing apparatus of one embodiment of the present invention will be described with reference to FIG. 9 and FIGS. 10A to 10E.

The stack manufacturing apparatus of one embodiment of the present invention includes a first supply unit configured to supply a process member having a sheet-like shape, a first separation unit configured to be supplied with the process member and divide the process member into one surface layer and a first remaining portion, a support body supply unit configured to supply a first support body having a sheet-like shape, a first bonding unit configured to be supplied with the first remaining portion and the first support body and bond the first remaining portion and the first support body to each other with a first adhesive layer, and a first unloading unit configured to unload a first stack including the first remaining portion, the first adhesive layer, and the first support body. The first separation unit includes the peeling apparatus described in Embodiment 1.

The stack manufacturing apparatus having the above structure manufactures a stack using the sheet-like process member supplied to the first supply unit. The first separation unit divides the process member into the one surface layer and the first remaining portion. The first bonding unit bonds the first remaining portion and the sheet-like first support body supplied from the support body supply unit to each other with the first adhesive layer. Then, the first unloading unit unloads the first stack including the first remaining portion, the first adhesive layer, and the first support body.

FIG. 9 is a schematic diagram illustrating a structure of a stack manufacturing apparatus 1000A of one embodiment of the present invention, and a transfer path of a process member and a stack in a process.

Figure 10C:
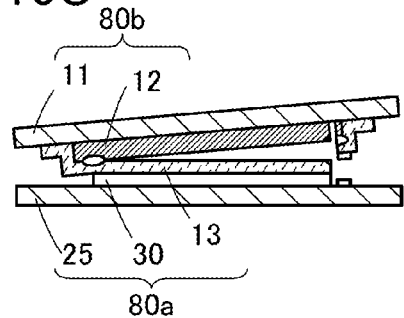

FIGS. 10A to 10E are schematic views illustrating a process for manufacturing a stack with the use of the stack manufacturing apparatus 1000A of one embodiment of the present invention. FIGS. 10A, 10B, 10D, and 10E each illustrate a plan view and a cross-sectional view taken along dashed-dotted line X1-X2 in the plan view. FIG. 10C illustrates only a cross-sectional view.

The stack manufacturing apparatus 1000A described in this embodiment includes a first supply unit 100, a first separation unit 300, a first bonding unit 400, and a support body supply unit 500 (FIG. 9).

Note that each unit can be named freely, and the name does not limit the function of each unit.

In this embodiment, an example in which the first separation unit 300 includes the peeling apparatus of one embodiment of the present invention that is described in Embodiment 1 is described.

The first supply unit 100 can supply a process member 80. Note that the first supply unit 100 can also serve as a first unloading unit.

The first separation unit 300 can separate one surface layer 80b and a first remaining portion 80a of the process member 80 from each other (FIG. 9 and FIGS. 10A to 10C).

Note that in this specification, the surface layer may have a stacked-layer structure instead of a single-layer structure as long as it includes an outermost layer. For example, the one surface layer 80b in FIG. 10A corresponds to a first substrate 11 and a first peeling layer 12.

The first bonding unit 400 is supplied with the first remaining portion 80a and a first support body 41. The first bonding unit 400 bonds the first support body 41 and the first remaining portion 80a to each other with a first adhesive layer 31 (FIG. 9 and FIGS. 10D and 10E).

The support body supply unit 500 supplies the first support body 41 (FIG. 9).

The first supply unit 100 also serving as the first unloading unit can unload a stack 81 including the first remaining portion 80a, the first adhesive layer 31, and the first support body 41 (FIG. 9 and FIG. 10E). The stack manufacturing apparatus of one embodiment of the present invention may include an unloading unit and a supply unit separately.

The above stack manufacturing apparatus of one embodiment of the present invention includes the first supply unit 100 that supplies the process member 80 and also serves as the first unloading unit for unloading the stack 81, the first separation unit 300 that separates the one surface layer 80b and the first remaining portion 80a of the process member 80 from each other, the first bonding unit 400 that bonds the first support body 41 to the first remaining portion 80a, and the support body supply unit 500 that supplies the first support body 41. This structure makes it possible to peel the one surface layer 80b of the process member 80 and bond the first support body 41 to the first remaining portion 80a which is separated. As described above, one embodiment of the present invention can provide an apparatus for manufacturing a stack including a support body and a remaining portion of a process member.

Furthermore, the stack manufacturing apparatus 1000A in this embodiment includes a first storage portion 300b, a first cleaning device 350, a transfer mechanism 121, and the like.

The first storage portion 300b stores the one surface layer 80b peeled from the process member 80.

The first cleaning device 350 cleans the first remaining portion 80a separated from the process member 80.

The transfer mechanism 121 transfers the process member 80, the first remaining portion 80a separated from the process member 80, and the stack 81.

<<Stack Manufacturing Apparatus>>

Individual components of the stack manufacturing apparatus of one embodiment of the present invention will be described below.

<First Supply Unit>

The first supply unit 100 supplies the process member 80. For example, to allow the transfer mechanism 121 to transfer a plurality of process members 80 successively, a multistage storage capable of storing the plurality of process members 80 can be included.

Furthermore, the first supply unit 100 in this embodiment also serves as the first unloading unit. The first supply unit 100 unloads the stack 81 including the first remaining portion 80a, the first adhesive layer 31, and the first support body 41. For example, to allow the transfer mechanism 121 to transfer a plurality of stacks 81 successively, a multistage storage capable of storing the plurality of stacks 81 can be included.

<First Separation Unit>

The first separation unit 300 includes the peeling apparatus of one embodiment of the present invention that is described in Embodiment 1 as an example.

<First Bonding Unit>

The first bonding unit 400 includes a mechanism for forming the first adhesive layer 31 and a crimp mechanism for bonding the first remaining portion 80a and the first support body 41 to each other with the use of the first adhesive layer 31.

Examples of the mechanism for forming the first adhesive layer 31 include a dispenser for applying a liquid adhesive and a device feeding an adhesive sheet shaped as a sheet in advance.

Note that the first adhesive layer 31 may be formed on the first remaining portion 80a and/or the first support body 41. Specifically, the first support body 41 on which the first adhesive layer 31 is formed in advance may be used.

Examples of the crimp mechanism for bonding the first remaining portion 80a and the first support body 41 to each other include mechanisms for applying pressure that are controlled to apply a constant pressure or provide a uniform gap, such as a pair of rollers, a flat plate and a roller, and a pair of flat plates facing each other.

<Support Body Supply Unit>

The support body supply unit 500 supplies the first support body 41. For example, the support body supply unit 500 unrolls a film which is supplied in a rolled shape, cuts the film to a predetermined length, activates a surface of the film, and supplies the film as the first support body 41.

<Stack Manufacturing Method>

A method for manufacturing the stack 81 from the process member 80 with the use of the stack manufacturing apparatus 1000A will be described below with reference to FIG. 9 and FIGS. 10A to 10E.

The process member 80 includes the first substrate 11, the first peeling layer 12 on the first substrate 11, a first peeled layer 13 whose one surface is in contact with the first peeling layer 12, a bonding layer 30 whose one surface is in contact with the other surface of the first peeled layer 13, a base 25 in contact with the other surface of the bonding layer 30 (FIG. 10A). Note that in this embodiment, description is given of a case of using the process member 80 in which the peeling triggers 13s are formed in advance near end portions of the bonding layer 30 (FIG. 10B).

<First Step>

The process member 80 is loaded into the first supply unit 100. The first supply unit 100 supplies the process member 80, and the transfer mechanism 121 transfers the process member 80 and supplies the process member 80 to the first separation unit 300.

<Second Step>

The first separation unit 300 peels the one surface layer 80b of the process member 80. Specifically, from the peeling trigger 13s formed near the end portion of the bonding layer 30, the first substrate 11 and the first peeling layer 12 are separated from the first peeled layer 13 (FIG. 10C).

By this step, the first remaining portion 80a is obtained from the process member 80. Specifically, the first remaining portion 80a includes the first peeled layer 13, the bonding layer 30 whose one surface is in contact with the first peeled layer 13, and the base 25 in contact with the other surface of the bonding layer 30.

<Third Step>

The transfer mechanism 121 transfers the first remaining portion 80a. The first cleaning device 350 cleans the first remaining portion 80a supplied thereto.

The transfer mechanism 121 transfers the first remaining portion 80a after the cleaning and supplies the first remaining portion 80a to the first bonding unit 400. The support body supply unit 500 supplies the first support body 41 to the first bonding unit 400.

Note that the transfer mechanism 121 may supply the first remaining portion 80a from the first separation unit 300 directly to the first bonding unit 400 without supplying it to the cleaning device.

The first bonding unit 400 forms the first adhesive layer 31 on the first remaining portion 80a supplied thereto (FIG. 10D), and bonds the first remaining portion 80a and the first support body 41 to each other with the first adhesive layer 31 (FIG. 10E).

By this step, the stack 81 is obtained using the first remaining portion 80a. Specifically, the stack 81 includes the first support body 41, the first adhesive layer 31, the first peeled layer 13, the bonding layer 30 whose one surface is in contact with the first peeled layer 13, and the base 25 in contact with the other surface of the bonding layer 30.

<Fourth Step>

The transfer mechanism 121 transfers the stack 81, and the stack 81 is supplied to the first supply unit 100 also serving as the first unloading unit.

After this step, the stack 81 can be unloaded.

<Another Step>

Note that when it takes time to cure the first adhesive layer 31, it is preferable that the stack 81 in which the first adhesive layer 31 is not cured yet be unloaded and the first adhesive layer 31 be cured outside the stack manufacturing apparatus 1000A, in which case occupancy time of the apparatus can be reduced.

This embodiment can be combined with any of the other embodiments as appropriate.

Embodiment 3

In this embodiment, a stack manufacturing apparatus of one embodiment of the present invention will be described with reference to FIG. 11, FIGS. 12A to 12E, and FIGS. 13A to 13E.

The stack manufacturing apparatus of one embodiment of the present invention includes a first supply unit configured to supply a process member having a sheet-like shape, a first separation unit configured to be supplied with the process member and divide the process member into one surface layer and a first remaining portion, a support body supply unit configured to supply a first support body and a second support body each having a sheet-like shape, a first bonding unit configured to be supplied with the first remaining portion and the first support body and bond the first remaining portion and the first support body to each other with a first adhesive layer, a first unloading unit configured to unload a first stack including the first remaining portion, the first adhesive layer, and the first support body, a second supply unit configured to supply the first stack, a trigger formation unit configured to be supplied with the first stack and form a peeling trigger near an end portion of the first remaining portion, a second separation unit configured to be supplied with the first stack including the peeling trigger and divide the first stack into one surface layer and a second remaining portion, a second bonding unit configured to be supplied with the second remaining portion and the second support body and bond the second remaining portion and the second support body to each other with a second adhesive layer, and a second unloading unit configured to unload a second stack including the second remaining portion, the second adhesive layer, and the second support body. At least one of the first separation unit and the second separation unit includes the peeling apparatus described in Embodiment 1.

The stack manufacturing apparatus having the above structure manufactures a stack using the sheet-like process member supplied to the first supply unit. The first separation unit divides the process member into the one surface layer and the first remaining portion. The first bonding unit bonds the first remaining portion and the first support body supplied from the support body supply unit to each other with the first adhesive layer. Then, the first unloading unit unloads the first stack including the first remaining portion, the first adhesive layer, and the first support body, and supplies the first stack to the second supply unit. The trigger formation unit forms the peeling trigger in the first stack supplied from the second supply unit. The second separation unit divides the first stack including the peeling trigger into the one surface layer and the second remaining portion. The second bonding unit bonds the second remaining portion and the second support body supplied from the support body supply unit to each other with the second adhesive layer. Then, the second unloading unit unloads the second stack including the second remaining portion, the second adhesive layer, and the second support body.

Figure 11:
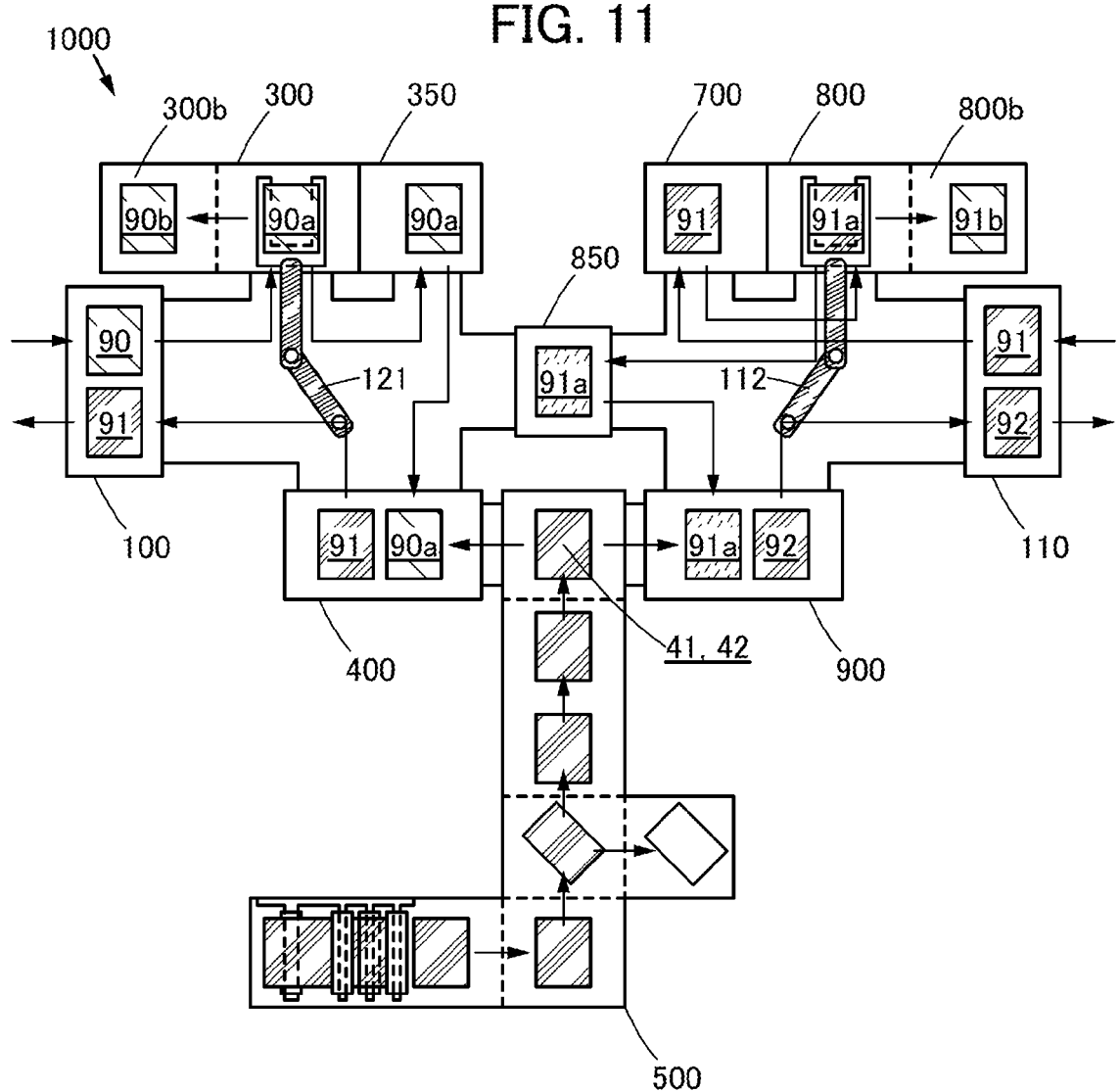
FIG. 11 illustrates a stack manufacturing apparatus.

FIG. 11 is a schematic diagram illustrating a structure of a stack manufacturing apparatus 1000 of one embodiment of the present invention, and a transfer path of a process member and a stack in a process.

Figure 12C:
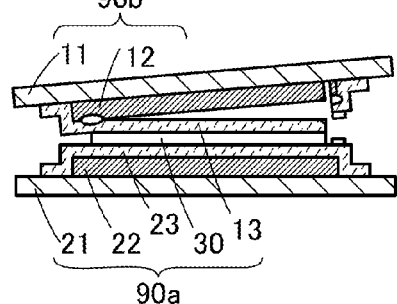
Figure 13A:
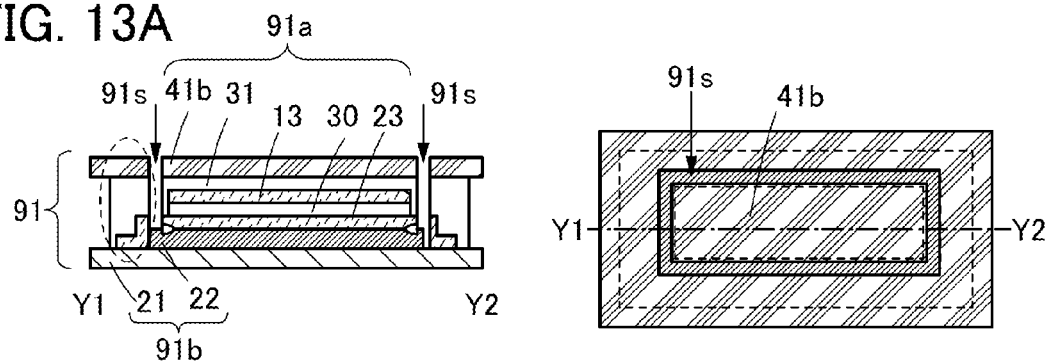
FIGS. 13A to 13E illustrate a stack manufacturing process.
Figure 13B:
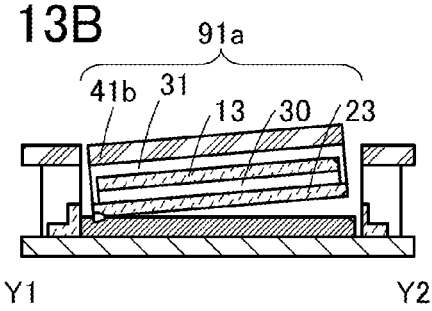
Figure 13C:
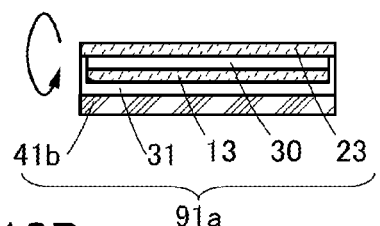

FIGS. 12A to 12E and FIGS. 13A to 13E are schematic views illustrating a process for manufacturing a stack with the use of the stack manufacturing apparatus 1000 of one embodiment of the present invention. FIGS. 12A, 12B, 12D, and 12E and FIGS. 13A, 13D, and 13E each illustrate a plan view and a cross-sectional view taken along dashed-dotted line Y1-Y2 in the plan view. FIG. 12C and FIGS. 13B and 13C each illustrate only a cross-sectional view.

The stack manufacturing apparatus 1000 described in this embodiment includes the first supply unit 100, the first separation unit 300, the first bonding unit 400, the support body supply unit 500, a second supply unit 110, a trigger formation unit 700, a second separation unit 800, and a second bonding unit 900.

Note that each unit can be named freely, and the name does not limit the function of each unit.

In this embodiment, an example in which the first separation unit 300 and the second separation unit 800 each include the peeling apparatus of one embodiment of the present invention that is described in Embodiment 1 is described. The present invention is not limited to this example, and in the stack manufacturing apparatus of one embodiment of the present invention, at least one of the first separation unit 300 and the second separation unit 800 includes the peeling apparatus of one embodiment of the present invention.

The first supply unit 100 can supply a process member 90. Note that the first supply unit 100 can also serve as a first unloading unit.

The first separation unit 300 can separate one surface layer 90b and a first remaining portion 90a of the process member 90 from each other (FIG. 11 and FIGS. 12A to 12C).

The first bonding unit 400 is supplied with the first support body 41, and bonds the first support body 41 and the first remaining portion 90a to each other with the first adhesive layer 31 (FIG. 11 and FIGS. 12D and 12E).

The support body supply unit 500 supplies the first support body 41 and a second support body 42 (FIG. 11).

The first supply unit 100 also serving as the first unloading unit can unload a stack 91 including the first remaining portion 90a, the first adhesive layer 31, and the first support body 41 (FIG. 11 and FIG. 12E).

The second supply unit 110 can supply the stack 91. Note that the second supply unit 110 can also serve as a second unloading unit.

The trigger formation unit 700 forms a peeling trigger 91s near end portions of the first remaining portion 90a (FIG. 13A). Specifically, part of a second peeled layer 23 which overlaps with a second peeling layer 22 and the first adhesive layer 31 is removed.

The second separation unit 800 separates one surface layer 91b and a second remaining portion 91a of the stack 91 from each other (FIGS. 13A and 13B).

Figure 13D:
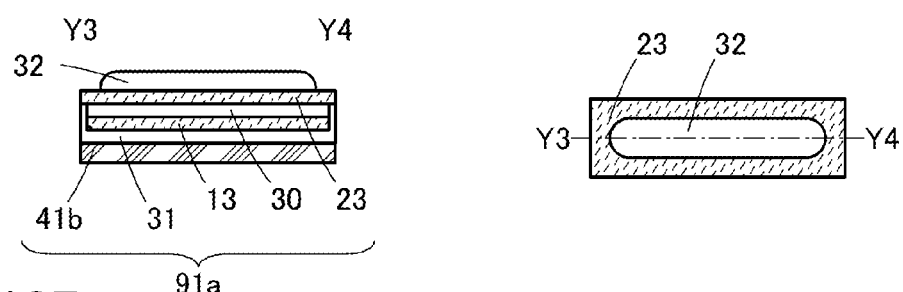
Figure 13E:
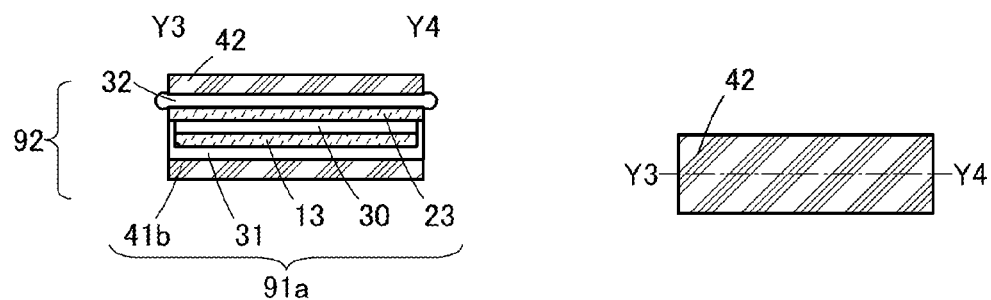

The second bonding unit 900 is supplied with the second support body 42, and bonds the second support body 42 and the second remaining portion 91a to each other with a second adhesive layer 32 (FIGS. 13D and 13E).

The second supply unit 110 also serving as the second unloading unit unloads a stack 92 including the second remaining portion 91a, the second adhesive layer 32, and the second support body 42 (FIG. 11 and FIG. 13E).

The above stack manufacturing apparatus of one embodiment of the present invention includes the first supply unit 100 that supplies the process member 90 and also serves as the first unloading unit for unloading the stack 91, the first separation unit 300 that separates the one surface layer 90b and the first remaining portion 90a of the process member 80 from each other, the first bonding unit 400 that bonds the first support body 41 to the first remaining portion 90a, the support body supply unit 500 that supplies the first support body 41 and the second support body 42, the second supply unit 110 that supplies the stack 91 and unloads the stack 92, the trigger formation unit 700 that forms the peeling trigger, the second separation unit 800 that separates the one surface layer 91b and the second remaining portion 91a of the stack 91 from each other, and the second bonding unit 900 that bonds the second support body 42 to the second remaining portion 91a. This structure makes it possible to peel both surface layers of the process member 90 and bond the first support body 41 and the second support body 42 to the remaining portion. As described above, one embodiment of the present invention can provide an apparatus for manufacturing a stack including a remaining portion of a process member and support bodies.

Furthermore, the stack manufacturing apparatus 1000 in this embodiment includes the first storage portion 300b, a second storage portion 800b, the first cleaning device 350, a second cleaning device 850, the transfer mechanism 121, a transfer mechanism 112, and the like.

The first storage portion 300b stores the one surface layer 90b peeled from the process member 90.

The second storage portion 800b stores the one surface layer 91b peeled from the stack 91.

The first cleaning device 350 cleans the first remaining portion 90a separated from the process member 90.

The second cleaning device 850 cleans the second remaining portion 91a separated from the stack 91.

The transfer mechanism 121 transfers the process member 90, the first remaining portion 90a separated from the process member 90, and the stack 91.

The transfer mechanism 112 transfers the stack 91, the second remaining portion 91a separated from the stack 91, and the stack 92.

<<Stack Manufacturing Apparatus>>

Individual components of the stack manufacturing apparatus of one embodiment of the present invention will be described below.

Note that the stack manufacturing apparatus 1000 differs from the stack manufacturing apparatus 1000A described in Embodiment 2 in including the second supply unit 110, the trigger formation unit 700, the second separation unit 800, the second bonding unit 900, the second storage portion 800b, and the second cleaning device 850. In this embodiment, a structure different from that of the stack manufacturing apparatus 1000A is described, and the description in Embodiment 2 is referred to for a structure common to that of the stack manufacturing apparatus 1000A.

<Second Supply Unit>

The second supply unit 110 can have a structure similar to that of the first supply unit described in Embodiment 2 except that the second supply unit 110 supplies the stack 91 (i.e., supplies an object different from that of the first supply unit).

Furthermore, the second supply unit 110 in this embodiment also serves as the second unloading unit. The second unloading unit can have a structure similar to that of the first unloading unit described in Embodiment 2 except that the second unloading unit unloads the stack 92 (i.e., unloads an object different from that of the first unloading unit).

<Trigger Formation Unit>

The trigger formation unit 700 includes a cutting mechanism which cuts the first support body 41 and the first adhesive layer 31 and peels part of the second peeled layer 23 from the second peeling layer 22, for example.

Specifically, the cutting mechanism includes at least one blade which has a sharp tip and a transfer mechanism which transfers the blade relatively to the stack 91.

<Second Separation Unit>

The second separation unit 800 includes the peeling apparatus of one embodiment of the present invention that is described in Embodiment 1 as an example.

<Second Bonding Unit>

The second bonding unit 900 includes a mechanism for forming the second adhesive layer 32 and a crimp mechanism for bonding the second remaining portion 91a and the second support body 42 to each other with the use of the second adhesive layer 32.

The mechanism for forming the second adhesive layer 32 can have a structure similar to that of the first bonding unit 400 described in Embodiment 2, for example.

Note that the second adhesive layer 32 may be formed on the second remaining portion 91a and/or the second support body 42. Specifically, the second support body 42 on which the second adhesive layer 32 is formed in advance may be used.

The crimp mechanism for attaching the second remaining portion 91a and the second support body 42 to each other can have a structure similar to that of the first bonding unit 400 described in Embodiment 2, for example.

<Stack Manufacturing Method>

A method for manufacturing the stack 92 from the process member 90 with the use of the stack manufacturing apparatus 1000 will be described below with reference to FIG. 11, FIGS. 12A to 12E, and FIGS. 13A to 13E.

The process member 90 has the same structure as the process member 80 except that a first base includes a second substrate 21, the second peeling layer 22 on the second substrate 21, and the second peeled layer 23 whose one surface is in contact with the second peeling layer 22.

Specifically, the process member 90 includes the first substrate 11, the first peeling layer 12 on the first substrate 11, the first peeled layer 13 whose one surface is in contact with the first peeling layer 12, the bonding layer 30 whose one surface is in contact with the other surface of the first peeled layer 13, the second peeled layer 23 whose one surface is in contact with the other surface of the bonding layer 30, the second peeling layer 22 whose one surface is in contact with the other surface of the second peeled layer 23, and the second substrate 21 on the second peeling layer 22 (FIG. 12A). Note that in this embodiment, description is given of a case of using the process member 90 in which the peeling triggers 13s are formed in advance near end portions of the bonding layer 30 (FIG. 12B).

<First Step>

The process member 90 is loaded into the first supply unit 100. The first supply unit 100 supplies the process member 90, and the transfer mechanism 121 transfers the process member 90 and supplies the process member 90 to the first separation unit 300.

<Second Step>

The first separation unit 300 peels the one surface layer 90b of the process member 90. Specifically, from the peeling trigger 13s formed near the end portion of the bonding layer 30, the first substrate 11 and the first peeling layer 12 are separated from the first peeled layer 13 (FIG. 12C).

By this step, the first remaining portion 90a is obtained from the process member 90. Specifically, the first remaining portion 90a includes the first peeled layer 13, the bonding layer 30 whose one surface is in contact with the first peeled layer 13, the second peeled layer 23 whose one surface is in contact with the other surface of the bonding layer 30, the second peeling layer 22 whose one surface is in contact with the other surface of the second peeled layer 23, and the second substrate 21 on the second peeling layer 22.

<Third Step>

The transfer mechanism 121 transfers the first remaining portion 90a. The first cleaning device 350 cleans the first remaining portion 90a supplied thereto.

The transfer mechanism 121 transfers the first remaining portion 90a after the cleaning and supplies the first remaining portion 90a to the first bonding unit 400. The support body supply unit 500 supplies the first support body 41 to the first bonding unit 400.

The first bonding unit 400 forms the first adhesive layer 31 over the first remaining portion 90a supplied thereto (FIG. 12D), and bonds the first remaining portion 90a and the first support body 41 to each other with the first adhesive layer 31.

By this step, the stack 91 is obtained using the first remaining portion 90a. Specifically, the stack 91 includes the first support body 41, the first adhesive layer 31, the first peeled layer 13, the bonding layer 30 whose one surface is in contact with the first peeled layer 13, the second peeled layer 23 whose one surface is in contact with the other surface of the bonding layer 30, the second peeling layer 22 whose one surface is in contact with the other surface of the second peeled layer 23, and the second substrate 21 on the second peeling layer 22 (FIG. 12E).

<Fourth Step>

The transfer mechanism 121 transfers the stack 91, and the stack 91 is supplied to the first supply unit 100 also serving as the first unloading unit.

After this step, the stack 91 can be unloaded. For example, when it takes time to cure the first adhesive layer 31, it is possible that the stack 91 in which the first adhesive layer 31 is not cured yet is unloaded and the first adhesive layer 31 is cured outside the stack manufacturing apparatus 1000. In that case, occupancy time of the apparatus can be reduced.

<Fifth Step>

The stack 91 is loaded into the second supply unit 110. The second supply unit 110 supplies the stack 91, and the transfer mechanism 112 transfers the stack 91 and supplies the stack 91 to the trigger formation unit 700.

<Sixth Step>

The trigger formation unit 700 forms the peeling trigger 91s by peeling, from the second peeling layer 22, part of the second peeled layer 23 near the end portion of the first adhesive layer 31 of the stack 91.

For example, the first support body 41 and the first adhesive layer 31 are cut from the first support body 41 side, and part of the second peeled layer 23 is peeled from the second peeling layer 22.

Specifically, the first adhesive layer 31 and the first support body 41 in a region which is on the second peeling layer 22 and in which the second peeled layer 23 is provided are cut to draw a closed curve with a blade or the like having a sharp tip, and along the closed curve, the second peeled layer 23 is partly peeled from the second peeling layer 22 (FIG. 13A).

By this step, the peeling trigger 91s is formed in the cut portion near the end portions of a first support body 41b and the first adhesive layer 31.

<Seventh Step>

The second separation unit 800 peels the one surface layer 91b of the stack 91. Specifically, from the peeling trigger 91s formed near the end portion of the bonding layer 30, the second substrate 21 and the second peeling layer 22 are separated from the second peeled layer 23 (FIG. 13B).

By this step, the second remaining portion 91a is obtained from the stack 91. Specifically, the second remaining portion 91a includes the first support body 41b, the first adhesive layer 31, the first peeled layer 13, the bonding layer 30 whose one surface is in contact with the first peeled layer 13, and the second peeled layer 23 whose one surface is in contact with the other surface of the bonding layer 30.

<Eighth Step>

The transfer mechanism 112 transfers the second remaining portion 91a, and turns the second remaining portion 91a so that the second peeled layer 23 faces upward (FIG. 13C). The second cleaning device 850 cleans the second remaining portion 91a supplied thereto.

The transfer mechanism 112 transfers the second remaining portion 91a after the cleaning and supplies the second remaining portion 91a to the second bonding unit 900. The support body supply unit 500 supplies the second support body 42 to the second bonding unit 900.

Note that the transfer mechanism 112 may supply the second remaining portion 91a from the second separation unit 800 directly to the second bonding unit 900 without supplying it to the cleaning device.

The second bonding unit 900 forms the second adhesive layer 32 on the second remaining portion 91a supplied thereto (FIG. 13D), and bonds the second remaining portion 91a and the second support body 42 to each other with the second adhesive layer 32 (FIG. 13E).

By this step, the stack 92 is obtained using the second remaining portion 91a. Specifically, the stack 92 includes the first peeled layer 13, the first adhesive layer 31, the first support body 41b, the bonding layer 30, the second peeled layer 23, and the second support body 42.

<Ninth Step>

The transfer mechanism 112 transfers the stack 92, and the stack 92 is supplied to the second supply unit 110 also serving as the second unloading unit.

After this step, the stack 92 can be unloaded.

Modification Example

A modification example of this embodiment is described with reference to FIG. 14.

Figure 14:
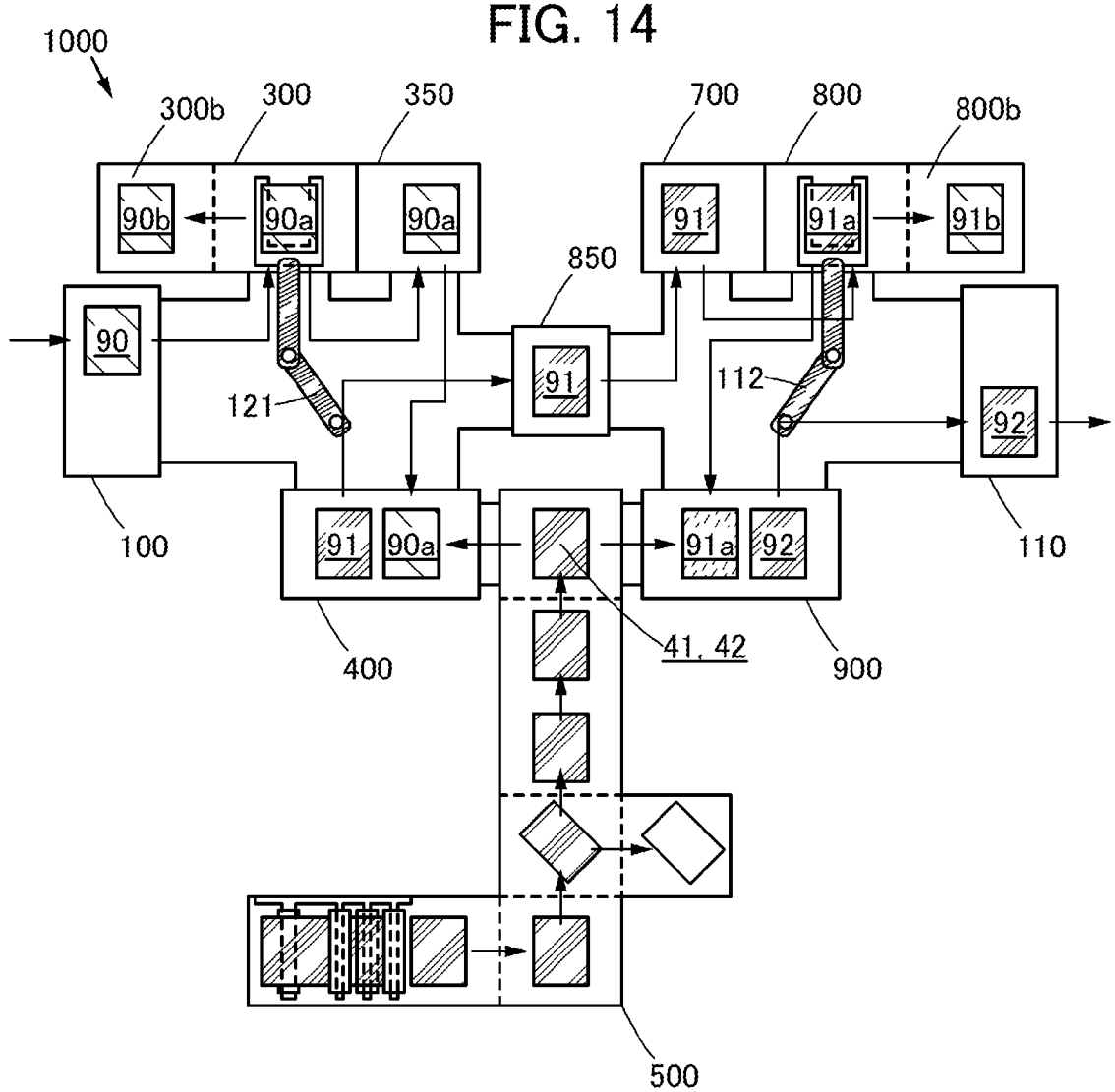
FIG. 14 illustrates a stack manufacturing apparatus.

FIG. 14 is a schematic diagram illustrating a structure of the stack manufacturing apparatus 1000 of one embodiment of the present invention, and a transfer path of a process member and a stack in a process.

In the modification example of this embodiment, a method for manufacturing the stack 92 from the process member 90 with the use of the stack manufacturing apparatus 1000, which is different from the above-described method, will be described with reference to FIGS. 12A to 12E, FIGS. 13A to 13E, and FIG. 14.

Specifically, the differences between the method in this modification example and the above-described method are as follows: in the fourth step, the transfer mechanism 121 transfers the stack 91 and the stack 91 is supplied not to the first supply unit 100 also serving as the first unloading unit but to the second cleaning device 850; in the fifth step, the transfer mechanism 112 transfers the stack 91 and the stack 91 is supplied to the trigger formation unit 700; and in the eighth step, the second remaining portion 91a is directly supplied to the second bonding unit 900 without being supplied to the second cleaning device 850. Thus, different portions will be described in detail below. Refer to the above description for portions where the same methods can be employed.

Modification Example of Fourth Step

The transfer mechanism 121 transfers the stack 91 and the stack 91 is supplied to the second cleaning device 850.

In the modification example of this embodiment, the second cleaning device 850 is used as a delivery chamber in which the transfer mechanism 121 delivers the stack 91 to the transfer mechanism 112 (FIG. 14).

By this step, the stack 91 can be continuously processed without being unloaded from the stack manufacturing apparatus 1000. The stack manufacturing apparatus 1000 may include a delivery chamber separately. In that case, the second remaining portion 91a can be cleaned in the second cleaning device 850 and the stack 91 can be delivered via the delivery chamber at the same time.

Modification Example of Fifth Step

The transfer mechanism 112 transfers the stack 91, and the stack 91 is supplied to the trigger formation unit 700.

Modification Example of Eighth Step

The transfer mechanism 112 transfers the second remaining portion 91a, and turns the second remaining portion 91a so that the second peeled layer 23 faces upward. The second remaining portion 91a is supplied to the second bonding unit 900.

The second bonding unit 900 forms the second adhesive layer 32 on the second remaining portion 91a supplied thereto (FIG. 12D), and bonds the second remaining portion 91a and the second support body 42 to each other with the second adhesive layer 32 (FIG. 12E).

By this step, the stack 92 is obtained using the second remaining portion 91a.

This embodiment can be combined with any of the other embodiments as appropriate.

Embodiment 4

In this embodiment, a light-emitting device that can be manufactured using the peeling apparatus of one embodiment of the present invention will be described with reference to drawings. Although a light-emitting device mainly including an organic EL element is described in this embodiment as an example, a device that can be manufactured using the peeling apparatus of one embodiment of the present invention is not limited to this example.

Specific examples of a light-emitting device of one embodiment of the present invention are described below.

Specific Example 1

FIG. 15A is a plan view of the light-emitting device, and FIG. 15C is an example of a cross-sectional view taken along the dashed-dotted line A1-A2 in FIG. 15A. The light-emitting device in Specific Example 1 is a top-emission light-emitting device using a color filter method. In this embodiment, the light-emitting device can have a structure in which sub-pixels of three colors of, for example, red (R), green (G), and blue (B) express one color, a structure in which sub-pixels of four colors of R, G, B, and white (W) express one color, a structure in which sub-pixels of four colors of R, G, B, and yellow (Y) express one color, or the like. The color element is not particularly limited and colors other than R, G, B, W, and Y may be used. For example, cyan, magenta, or the like may be used.

The light-emitting device illustrated in FIG. 15A includes a light-emitting portion 804, a driver circuit portion 806, and an FPC 808.

The light-emitting device in FIG. 15C includes a substrate 101, an adhesive layer 103, an insulating layer 105, a plurality of transistors, a conductive layer 857, an insulating layer 815, an insulating layer 817, a plurality of light-emitting elements, an insulating layer 821, an adhesive layer 822, a coloring layer 845, a light-blocking layer 847, an insulating layer 115, an adhesive layer 113, and a substrate 111. The adhesive layer 822, the insulating layer 115, the adhesive layer 113, and the substrate 111 transmit visible light. Light-emitting elements and transistors included in the light-emitting portion 804 and the driver circuit portion 806 are sealed with the substrate 101, the substrate 111, and the adhesive layer 822.

The light-emitting portion 804 includes a transistor 820 and a light-emitting element 830 over the substrate 101 with the adhesive layer 103 and the insulating layer 105 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. It is preferable that the lower electrode 831 reflect visible light. The upper electrode 835 transmits visible light.

In addition, the light-emitting portion 804 includes the coloring layer 845 overlapping with the light-emitting element 830 and the light-blocking layer 847 overlapping with the insulating layer 821. The space between the light-emitting element 830 and the coloring layer 845 is filled with the adhesive layer 822.

The insulating layer 815 has an effect of inhibiting diffusion of impurities to a semiconductor included in the transistor. As the insulating layer 817, an insulating layer having a planarization function is preferably selected in order to reduce surface unevenness due to the transistor.

The driver circuit portion 806 includes a plurality of transistors over the substrate 101 with the adhesive layer 103 and the insulating layer 105 provided therebetween. In FIG. 15C, one of the transistors included in the driver circuit portion 806 is illustrated.

The insulating layer 105 and the substrate 101 are bonded to each other with the adhesive layer 103. The insulating layer 115 and the substrate 111 are bonded to each other with the adhesive layer 113. It is preferable to use films having an excellent moisture-proof property as at least one of the insulating layer 105 and the insulating layer 115, in which case entry of an impurity such as moisture into the light-emitting element 830 or the transistor 820 can be inhibited, leading to improved reliability of the light-emitting device.

The conductive layer 857 is electrically connected to an external input terminal through which a signal (e.g., a video signal, a clock signal, a start signal, or a reset signal) or a potential from the outside is transmitted to the driver circuit portion 806. Here, an example in which the FPC 808 is provided as the external input terminal is described. To prevent an increase in the number of manufacturing steps, the conductive layer 857 is preferably formed using the same material and the same step(s) as those of the electrode or the wiring in the light-emitting portion or the driver circuit portion. Here, an example is described in which the conductive layer 857 is formed using the same material and the same step(s) as those of the electrodes of the transistor 820.

In the light-emitting device in FIG. 15C, the FPC 808 is positioned over the substrate 111. A connector 825 is connected to the conductive layer 857 through an opening provided in the substrate 111, the adhesive layer 113, the insulating layer 115, the adhesive layer 822, the insulating layer 817, and the insulating layer 815. Moreover, the connector 825 is connected to the FPC 808. The FPC 808 and the conductive layer 857 are electrically connected to each other through the connector 825. In the case where the conductive layer 857 and the substrate 111 overlap with each other, the conductive layer 857, the connector 825, and the FPC 808 are electrically connected to one another by forming an opening in the substrate 111 (or using a substrate having an opening).

Specific Example 2

Figure 16A:
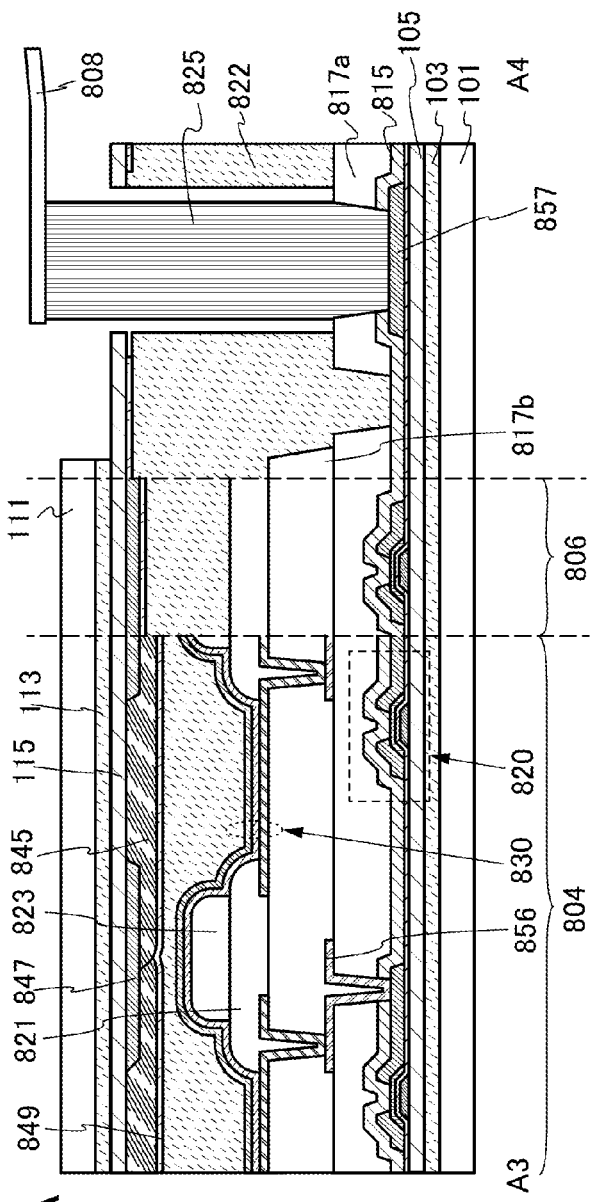
FIGS. 16A to 16C illustrate light-emitting devices.

FIG. 15B is a plan view of the light-emitting device, and FIG. 16A is an example of a cross-sectional view taken along the dashed-dotted line A3-A4 in FIG. 15B. The light-emitting device in Specific Example 2 is a top-emission light-emitting device using a color filter method, which differs from the light-emitting device in Specific Example 1. Here, only different points from those of Specific Example 1 are described and the description of the same points as Specific Example 1 is omitted.

The light-emitting device illustrated in FIG. 16A differs from the light-emitting device in FIG. 15C in the following points.

The light-emitting device illustrated in FIG. 16A includes insulating layers 817a and 817b and a conductive layer 856 over the insulating layer 817a. The source electrode or the drain electrode of the transistor 820 and the lower electrode of the light-emitting element 830 are electrically connected to each other through the conductive layer 856.

The light-emitting device in FIG. 16A includes a spacer 823 over the insulating layer 821. The spacer 823 can adjust the distance between the substrate 101 and the substrate 111.

The light-emitting device in FIG. 16A includes an overcoat 849 covering the coloring layer 845 and the light-blocking layer 847. The space between the light-emitting element 830 and the overcoat 849 is filled with the adhesive layer 822.

In addition, in the light-emitting device in FIG. 16A, the substrate 101 differs from the substrate 111 in size. The FPC 808 is positioned over the insulating layer 115 and does not overlap with the substrate 111. The connector 825 is connected to the conductive layer 857 through an opening provided in the insulating layer 115, the adhesive layer 822, the insulating layer 817a, and the insulating layer 815. Since it is not necessary to form the opening in the substrate 111, the material for the substrate 111 is not limited.

Figure 16B:
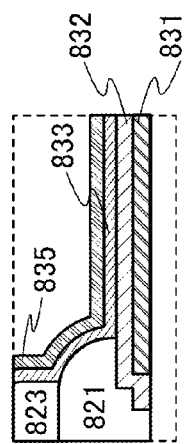

Note that as illustrated in FIG. 16B, the light-emitting element 830 may include an optical adjustment layer 832 between the lower electrode 831 and the EL layer 833. It is preferable to use a conductive material having a light-transmitting property for the optical adjustment layer 832. Owing to the combination of a color filter (the coloring layer) and a microcavity structure (the optical adjustment layer), light with high color purity can be extracted from the light-emitting device of one embodiment of the present invention. The thickness of the optical adjustment layer may be varied depending on the color of the sub-pixel.

Specific Example 3

Figure 16C:
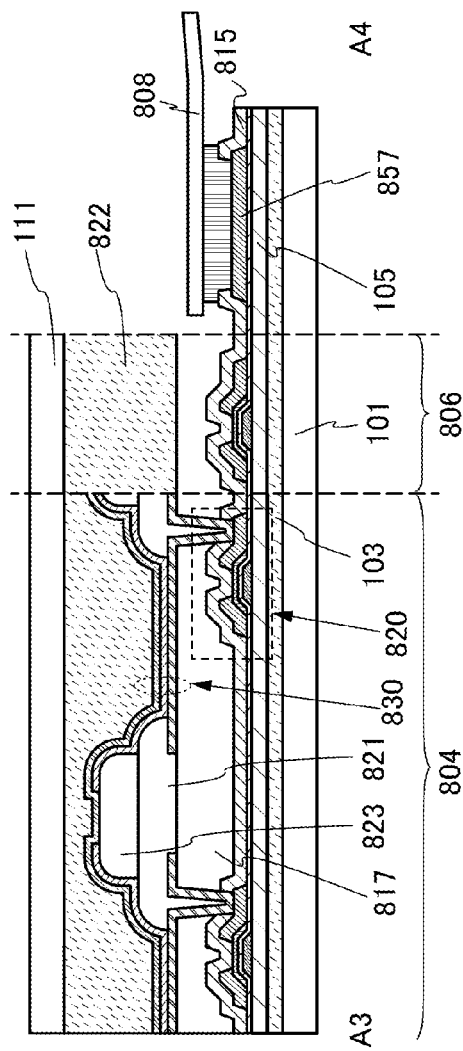

FIG. 15B is a plan view of the light-emitting device, and FIG. 16C is an example of a cross-sectional view taken along the dashed-dotted line A3-A4 in FIG. 15B. The light-emitting device in Specific Example 3 is a top-emission light-emitting device using a separate coloring method.

The light-emitting device in FIG. 16C includes the substrate 101, the adhesive layer 103, the insulating layer 105, a plurality of transistors, the conductive layer 857, the insulating layer 815, the insulating layer 817, a plurality of light-emitting elements, the insulating layer 821, the spacer 823, the adhesive layer 822, and the substrate 111. The adhesive layer 822 and the substrate 111 transmit visible light.

In the light-emitting device in FIG. 16C, the connector 825 is positioned over the insulating layer 815. The connector 825 is connected to the conductive layer 857 through an opening provided in the insulating layer 815. Moreover, the connector 825 is connected to the FPC 808. The FPC 808 and the conductive layer 857 are electrically connected to each other through the connector 825.

Specific Example 4

FIG. 15B is a plan view of the light-emitting device, and FIG. 17A is an example of a cross-sectional view taken along the dashed-dotted line A3-A4 in FIG. 15B. The light-emitting device in Specific Example 4 is a bottom-emission light-emitting device using a color filter method.

The light-emitting device in FIG. 17A includes the substrate 101, the adhesive layer 103, the insulating layer 105, a plurality of transistors, the conductive layer 857, the insulating layer 815, the coloring layer 845, the insulating layer 817a, the insulating layer 817b, the conductive layer 856, a plurality of light-emitting elements, the insulating layer 821, the adhesive layer 822, and the substrate 111. The substrate 101, the adhesive layer 103, the insulating layer 105, the insulating layer 815, the insulating layer 817a, and the insulating layer 817b transmit visible light.

The light-emitting portion 804 includes the transistor 820, a transistor 824, and the light-emitting element 830 over the substrate 101 with the adhesive layer 103 and the insulating layer 105 provided therebetween. The light-emitting element 830 includes the lower electrode 831 over the insulating layer 817b, the EL layer 833 over the lower electrode 831, and the upper electrode 835 over the EL layer 833. The lower electrode 831 is electrically connected to the source electrode or the drain electrode of the transistor 820. An end portion of the lower electrode 831 is covered with the insulating layer 821. It is preferable that the upper electrode 835 reflect visible light. The lower electrode 831 transmits visible light. The location of the coloring layer 845 overlapping with the light-emitting element 830 is not particularly limited and may be, for example, between the insulating layer 817a and the insulating layer 817b or between the insulating layer 815 and the insulating layer 817a.

The driver circuit portion 806 includes a plurality of transistors over the substrate 101 with the adhesive layer 103 and the insulating layer 105 provided therebetween. In FIG. 17A, two of the transistors included in the driver circuit portion 806 are illustrated.

The insulating layer 105 and the substrate 101 are bonded to each other with the adhesive layer 103. It is preferable to use films having an excellent moisture-proof property as the insulating layer 105, in which case entry of an impurity such as moisture into the light-emitting element 830 or the transistors 820 and 824 can be inhibited, leading to improved reliability of the light-emitting device.

The conductive layer 857 is electrically connected to an external input terminal through which a signal or a potential from the outside is transmitted to the driver circuit portion 806. Here, an example in which the FPC 808 is provided as the external input terminal is described. Here, an example is described in which the conductive layer 857 is formed using the same material and the same step(s) as those of the conductive layer 856.

Specific Example 5

FIG. 17B shows an example of a light-emitting device different from those of Specific Examples 1 to 4.

A light-emitting device in FIG. 17B includes the substrate 101, the adhesive layer 103, the insulating layer 105, a conductive layer 814, a conductive layer 857a, a conductive layer 857b, the light-emitting element 830, the insulating layer 821, the adhesive layer 822, and the substrate 111.

The conductive layer 857a and the conductive layer 857b, which are external connection electrodes of the light-emitting device, can each be electrically connected to an FPC or the like.

The light-emitting element 830 includes the lower electrode 831, the EL layer 833, and the upper electrode 835. The end portion of the lower electrode 831 is covered with the insulating layer 821. The light-emitting element 830 has a bottom emission structure, a top emission structure, or a dual emission structure. The electrode, the substrate, the insulating layer, and the like through each of which light is extracted transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, a substrate having the light extraction structure can be formed by bonding the above lens or film to a resin substrate with an adhesive or the like having substantially the same refractive index as the substrate or the lens or film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be formed to have a single-layer structure or a stacked-layer structure using a material selected from copper, titanium, tantalum, tungsten, molybdenum, chromium, neodymium, scandium, nickel, or aluminum, an alloy material containing any of these materials as its main component, and the like. The thickness of the conductive layer 814 can be greater than or equal to 0.1 µm and less than or equal to 3 µm, preferably greater than or equal to 0.1 µm and less than or equal to 0.5 µm, for example.

Examples of Materials

Next, materials and the like that can be used for a light-emitting device are described. Note that description on the components already described in this specification and the like is omitted in some cases.

As materials for the substrates, glass, quartz, an organic resin, metal, an alloy, or the like can be used. The substrate through which light from the light-emitting element is extracted is formed using a material which transmits the light.

In particular, a flexible substrate is preferably used. For example, an organic resin; or glass, a metal, or an alloy that is thin enough to have flexibility can be used.

An organic resin, which has a specific gravity smaller than that of glass, is preferably used for the flexible substrate, in which case the light-emitting device can be lightweight as compared with the case where glass is used.

The substrate is preferably formed using a material with high toughness. In that case, a light-emitting device with high impact resistance that is less likely to be broken can be provided. For example, when an organic resin substrate or a thin metal or alloy substrate is used, the light-emitting device can be lightweight and robust as compared with the case where a glass substrate is used.

A metal material and an alloy material, which have high thermal conductivity, are preferable because they can easily conduct heat to the whole substrate and accordingly can prevent a local temperature rise in the light-emitting device. The thickness of a substrate using a metal material or an alloy material is preferably greater than or equal to 10 µm and less than or equal to 200 µm and further preferably greater than or equal to 20 µm and less than or equal to 50 µm.

There is no particular limitation on a material for the metal substrate or the alloy substrate, but it is preferable to use, for example, aluminum, copper, nickel, or a metal alloy such as an aluminum alloy or stainless steel.

Furthermore, when a material with high thermal emissivity is used for the substrate, the surface temperature of the light-emitting device can be prevented from rising, leading to inhibition of breakage or a decrease in reliability of the light-emitting device. For example, the substrate may have a stacked-layer structure of a metal substrate and a layer with high thermal emissivity (the layer can be formed using a metal oxide or a ceramic material, for example).

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin (e.g., nylon or aramid), a cycloolefin resin, a polystyrene resin, a polyamide imide resin, and a polyvinyl chloride resin. In particular, a material having a low coefficient of thermal expansion is preferable, and for example, a polyamide imide resin, a polyimide resin, or PET can be suitably used. A substrate in which a fibrous body is impregnated with a resin (also referred to as prepreg) or a substrate whose coefficient of thermal expansion is reduced by mixing an organic resin with an inorganic filler can also be used.

The flexible substrate may have a stacked-layer structure in which a hard coat layer (e.g., a silicon nitride layer) by which a surface of the light-emitting device is protected from damage, a layer which can disperse pressure (e.g., an aramid resin layer), or the like is stacked over a layer of any of the above-mentioned materials.

The flexible substrate may be formed by stacking a plurality of layers. When a glass layer is used, a barrier property against water and oxygen can be improved and thus a highly reliable light-emitting device can be provided.

For example, a flexible substrate in which a glass layer, an adhesive layer, and an organic resin layer are stacked from the side closer to a light-emitting element can be used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and high flexibility. The thickness of the organic resin layer is greater than or equal to 10 µm and less than or equal to 200 µm, preferably greater than or equal to 20 µm and less than or equal to 50 µm. By providing such an organic resin layer outside the glass layer, occurrence of a crack or a break in the glass layer can be inhibited and mechanical strength can be improved. With the substrate that includes such a composite material of a glass material and an organic resin, a highly reliable flexible light-emitting device can be provided.

As the adhesive layer, a variety of curable adhesives such as a reactive curable adhesive, a thermosetting adhesive, an anaerobic adhesive, and a photo-curable adhesive such as an ultraviolet curable adhesive can be used. Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferable. Alternatively, a two-component-mixture-type resin may be used. Further alternatively, an adhesive sheet or the like may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case entry of impurities such as moisture into the functional element can be inhibited and the reliability of the light-emitting device can be improved.

In addition, a filler with a high refractive index or a light scattering member is mixed into the resin, in which case the efficiency of light extraction from the light-emitting element can be improved. For example, titanium oxide, barium oxide, zeolite, zirconium, or the like can be used.

An insulating film having an excellent moisture-proof property is preferably used for at least one of the insulating layer 105 and the insulating layer 115. Alternatively, at least one of the insulating layer 105 and the insulating layer 115 preferably has a function of preventing diffusion of impurities to a light-emitting element.

As an insulating film having an excellent moisture-proof property, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film having an excellent moisture-proof property is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], and still further preferably lower than or equal to $1\times10^{-8}$ [g/(m$^2$·day)].

There is no particular limitation on the structure of the transistor in the light-emitting device. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or an organic semiconductor can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be inhibited.

For stable characteristics of the transistor, a base film is preferably provided. The base film can be formed to have a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided. In each of the above structure examples, the insulating layer 105 can serve as a base film of the transistor.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin enough to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. In addition, lanthanum, neodymium, germanium, or the like may be added to the metal material or the alloy. Moreover, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Furthermore, when a metal film or a metal oxide film is stacked on and in contact with an aluminum alloy film, oxidation of the aluminum alloy film can be inhibited. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an inkjet method, a coating method, and the like.

The light-emitting element 830 may contain two or more kinds of light-emitting substances. Thus, for example, a light-emitting element that emits white light can be achieved. For example, a white emission can be obtained by selecting light-emitting substances so that two or more kinds of light-emitting substances emit light of complementary colors. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the wavelength range of a visible region (e.g., from 350 nm to 750 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer includes a host material, an assist material, and a phosphorescent material (guest material), the separation layer may be formed using the host material and the assist material. In other words, the separation layer includes a region not containing the phosphorescent material and the phosphorescent layer includes a region containing the phosphorescent material in the above structure. Accordingly, the separation layer and the phosphorescent layer can be evaporated separately depending on whether a phosphorescent material is used or not. With such a structure, the separation layer and the phosphorescent layer can be formed in the same chamber. Thus, the manufacturing costs can be reduced.

Moreover, the light-emitting element 830 may be a single element including one EL layer or a tandem element in which EL layers are stacked with a charge generation layer provided therebetween.

The light-emitting element is preferably provided between a pair of insulating films having an excellent moisture-proof property. In that case, entry of an impurity such as moisture into the light-emitting element can be inhibited, leading to inhibition of a decrease in the reliability of the light-emitting device.

As the insulating layer 815, for example, an inorganic insulating film such as a silicon oxide film, a silicon oxynitride film, or an aluminum oxide film can be used. For example, as the insulating layer 817, the insulating layer 817a, and the insulating layer 817b, an organic material such as polyimide, acrylic, polyamide, polyimide amide, or a benzocyclobutene-based resin can be used. Alternatively, a low-dielectric constant material (a low-k material) or the like can be used. Furthermore, each insulating layer may be formed by stacking a plurality of insulating films.

For the insulating layer 821, an organic insulating material or an inorganic insulating material is used. As the resin, for example, a polyimide resin, a polyamide resin, an acrylic resin, a siloxane resin, an epoxy resin, or a phenol resin can be used. It is particularly preferable that the insulating layer 821 be formed to have an inclined side wall with curvature, using a photosensitive resin material.

There is no particular limitation on the method for forming the insulating layer 821; a photolithography method, a sputtering method, an evaporation method, a droplet discharging method (e.g., an inkjet method), a printing method (e.g., a screen printing method or an off-set printing method), or the like may be used.

The spacer 823 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. When the spacer 823 containing a conductive material is electrically connected to the upper electrode 835, a potential drop due to the resistance of the upper electrode 835 can be inhibited. The spacer 823 may have either a tapered shape or an inverse tapered shape.

For example, a conductive layer functioning as an electrode or a wiring of the transistor, an auxiliary electrode of the light-emitting element, or the like, which is used for the light-emitting device, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, a yellow (Y) color filter for transmitting light in a yellow wavelength range, or the like can be used. Each coloring layer is formed in a desired position with any of a variety of materials by a printing method, an inkjet method, an etching method using a photolithography method, or the like. In a white sub-pixel, a resin such as a transparent resin or a white resin may be provided so as to overlap with the light-emitting element.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix is formed using a resin material containing a metal material, pigment, or dye. Note that it is preferable to provide the light-blocking layer in a region other than the light-emitting portion, such as a driver circuit portion, in which case undesired leakage of guided light or the like can be inhibited.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film or an organic insulating film such as an acrylic film or a polyimide film can be used, and furthermore, a stacked-layer structure of an organic insulating film and an inorganic insulating film may be employed.

In the case where upper surfaces of the coloring layer and the light-blocking layer are coated with a material of the adhesive layer, a material which has high wettability with respect to the material of the adhesive layer is preferably used as the material of the overcoat. For example, an oxide conductive film such as an ITO film or a metal film such as an Ag film which is thin enough to transmit light is preferably used as the overcoat.

As the connector, any of a variety of anisotropic conductive films (ACF), anisotropic conductive pastes (ACP), and the like can be used.

Note that although the light-emitting device is described as an example in this embodiment, the peeling apparatus of one embodiment of the present invention can be applied to manufacture of a variety of devices such as a semiconductor device, a display device, and an input/output device.

In this specification and the like, a display element, a display device which is a device including a display element, a light-emitting element, and a light-emitting device which is a device including a light-emitting element can employ various modes or can include various elements. A display element, a display device, a light-emitting element, or a light-emitting device includes, for example, at least one of an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a display element including a micro electro mechanical system (MEMS), a digital micromirror device (DMD), a digital micro shutter (DMS), an interferometric modulator display (IMOD) element, an MEMS shutter display element, optical interference type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device having electronic ink, ELECTRONIC LIQUID POWDER (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum or silver. Furthermore, in such a case, a memory circuit such as an SRAM can be provided under the reflective electrodes, leading to lower power consumption.

For example, in this specification and the like, an active matrix method in which an active element (a non-linear element) is included in a pixel or a passive matrix method in which an active element is not included in a pixel can be used.

In the active matrix method, as an active element, not only a transistor but also a variety of active elements can be used. For example, a metal insulator metal (MIM), a thin film diode (TFD), or the like can also be used. Since these elements can be formed with a smaller number of manufacturing steps, manufacturing cost can be reduced or a yield can be improved. Alternatively, since the size of these elements is small, the aperture ratio can be improved, so that power consumption can be reduced or higher luminance can be achieved.

Since an active element is not used in the passive matrix method, the number of manufacturing steps is small, so that manufacturing cost can be reduced or a yield can be improved. Alternatively, since an active element is not used, the aperture ratio can be improved, so that power consumption can be reduced or higher luminance can be achieved, for example.

Note that the light-emitting device may be used as a display device or as a lighting device. For example, it may be used as a light source such as a backlight or a front light, that is, a lighting device for a display panel.

This embodiment can be combined with any of the other embodiments as appropriate.

Embodiment 5

In this embodiment, an input/output device of one embodiment of the present invention will be described with reference to drawings. Note that the above description can be referred to for components which are similar to those of the light-emitting device described in Embodiment 4. Although an input/output device including a light-emitting element is described as an example in this embodiment, one embodiment of the present invention is not limited thereto. For example, an input/output device including another element (e.g., a display element), the example of which is shown in Embodiment 4, can also be manufactured using the peeling apparatus of one embodiment of the present invention. Moreover, the input/output device described in this embodiment can also be referred to as a touch panel.

Structure Example 1

Figure 18A:
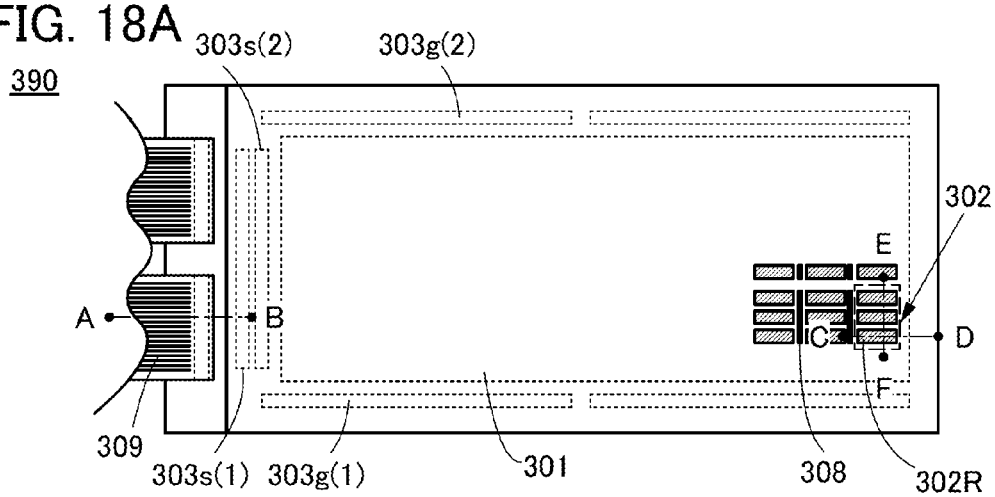
FIGS. 18A to 18C illustrate an input/output device.
Figure 18B:
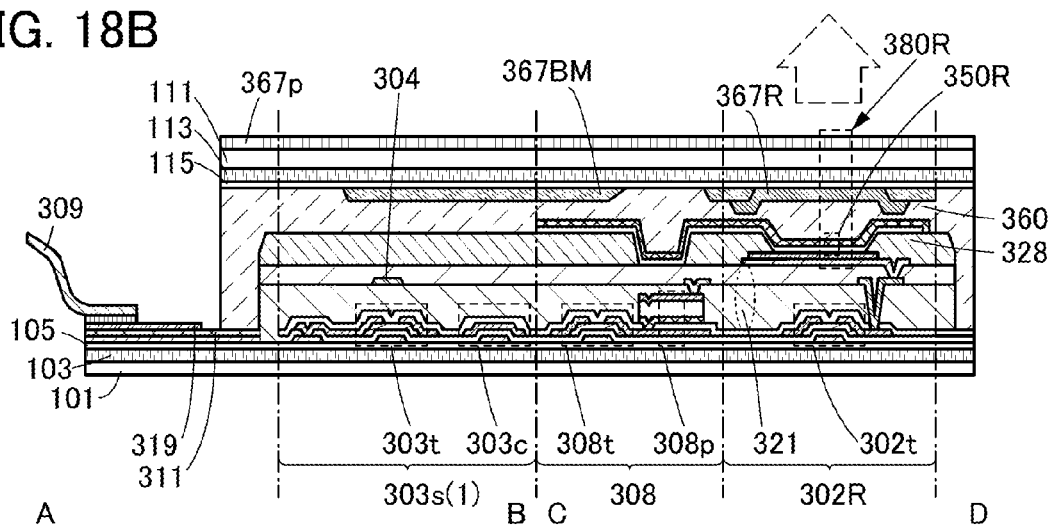
Figure 18C:
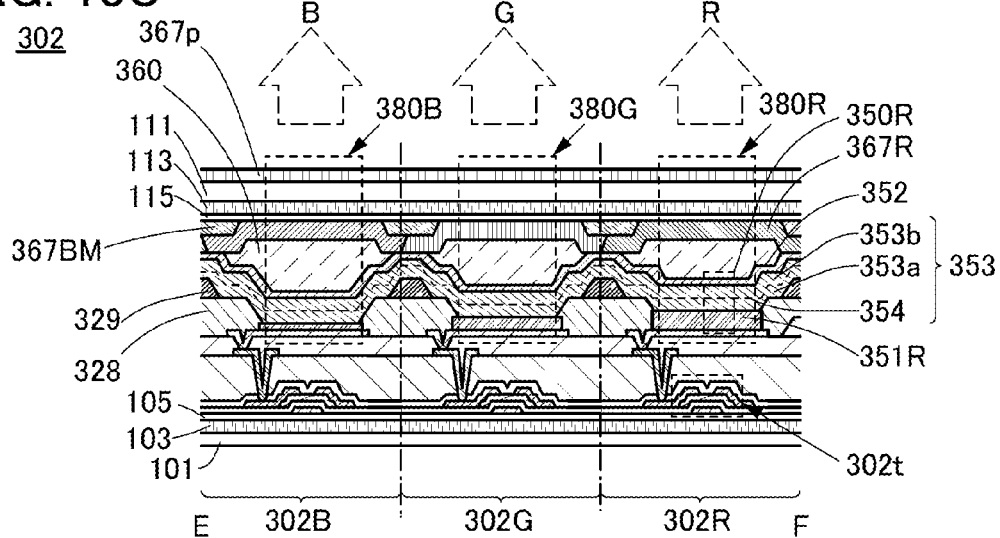

FIG. 18A is a top view of the input/output device. FIG. 18B is a cross-sectional view taken along the dashed-dotted line A-B and dashed-dotted line C-D in FIG. 18A. FIG. 18C is a cross-sectional view taken along the dashed-dotted line E-F in FIG. 18A.

An input/output device 390 illustrated in FIG. 18A includes a display portion 301 (serving also as an input portion), a scan line driver circuit 303g(1), an imaging pixel driver circuit 303g(2), an image signal line driver circuit 303s(1), and an imaging signal line driver circuit 303s(2).

The display portion 301 includes a plurality of pixels 302 and a plurality of imaging pixels 308.

The pixel 302 includes a plurality of sub-pixels (e.g., a sub-pixel 302R). Each sub-pixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303g(1) can supply selection signals to the pixels 302.

The image signal line driver circuit 303s(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time it takes for an imaging pixel circuit to sense light.

The imaging pixel driver circuit 303g(2) can supply control signals to the imaging pixels 308.

The imaging signal line driver circuit 303s(2) can read out imaging signals.

As illustrated in FIGS. 18B and 18C, the input/output device 390 includes the substrate 101, the adhesive layer 103, the insulating layer 105, the substrate 111, the adhesive layer 113, and the insulating layer 115. The substrates 101 and 111 are bonded to each other with an adhesive layer 360.

The substrate 101 and the insulating layer 105 are bonded to each other with the adhesive layer 103. The substrate 111 and the insulating layer 115 are bonded to each other with the adhesive layer 113.

Each of the pixels 302 includes the sub-pixel 302R, a sub-pixel 302G, and a sub-pixel 302B (see FIG. 18C). The sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit. The pixel circuit includes a transistor 302t that can supply electric power to the light-emitting element 350R. Furthermore, the light-emitting module 380R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 18C).

The EL layer 353 includes a first EL layer 353a, an intermediate layer 354, and a second EL layer 353b, which are stacked in this order.

Note that a microcavity structure can be provided for the light-emitting module 380R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The light-emitting module 380R, for example, includes the adhesive layer 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the adhesive layer 360 and through the coloring layer 367R and is emitted to the outside of the light-emitting module 380R as indicated by an arrow in FIG. 18B or 18C.

The input/output device 390 includes a light-blocking layer 367BM. The light-blocking layer 367BM is provided so as to surround the coloring layer (e.g., the coloring layer 367R).

The input/output device 390 includes an anti-reflective layer 367p positioned in a region overlapping with the display portion 301. As the anti-reflective layer 367p, a circular polarizing plate can be used, for example.

The input/output device 390 includes an insulating layer 321. The insulating layer 321 covers the transistor 302t and the like. Note that the insulating layer 321 can be used as a layer for planarizing unevenness caused by the pixel circuits and the imaging pixel circuits. An insulating layer on which a layer that can inhibit diffusion of impurities to the transistor 302t and the like is stacked can be used as the insulating layer 321.

The input/output device 390 includes a partition 328 that overlaps with an end portion of the lower electrode 351R. In addition, a spacer 329 that controls the distance between the substrate 101 and the substrate 111 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 18B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for a transistor 308t, the transistor 302t, or the like.

The imaging pixels 308 each include a photoelectric conversion element 308p and an imaging pixel circuit. The imaging pixel circuit can sense light received by the photoelectric conversion element 308p. The imaging pixel circuit includes the transistor 308t.

For example, a PIN photodiode can be used as the photoelectric conversion element 308p.

The input/output device 390 includes a wiring 311 through which a signal is supplied. The wiring 311 is provided with a terminal 319. Note that an FPC 309 through which a signal such as an image signal or a synchronization signal is supplied is electrically connected to the terminal 319. Note that a printed wiring board (PWB) may be attached to the FPC 309.

Note that transistors such as the transistors 302t, 303t, and 308t can be formed in the same process. Alternatively, the transistors may be formed in different processes.

Structure Example 2

Figure 19A:
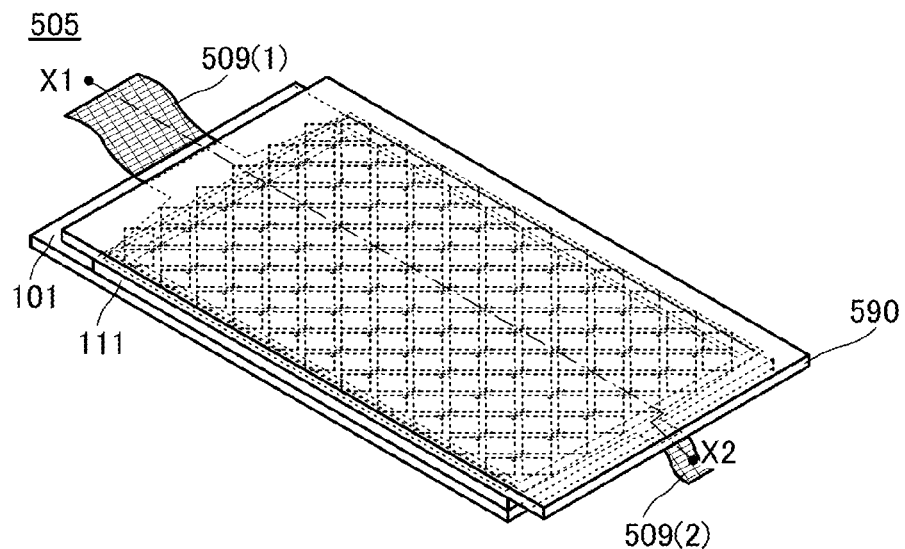
FIGS. 19A and 19B illustrate an input/output device.
Figure 19B:
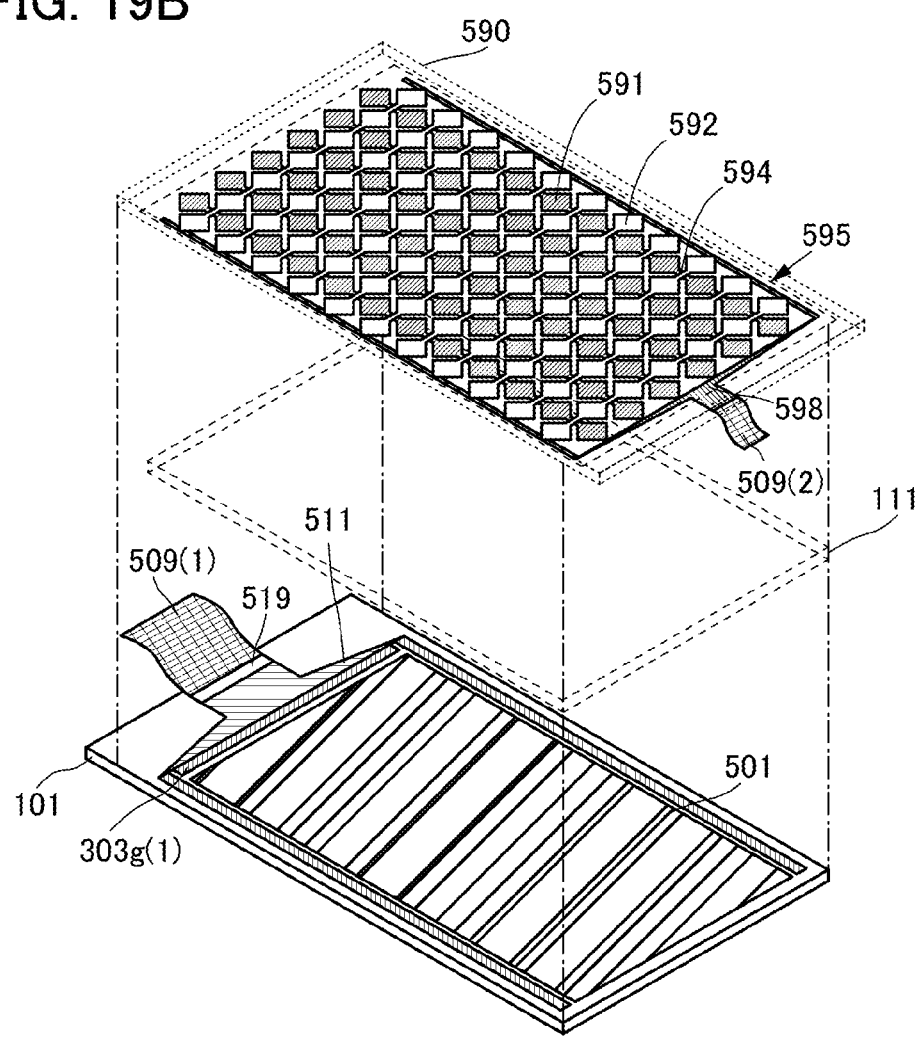
Figure 20A:
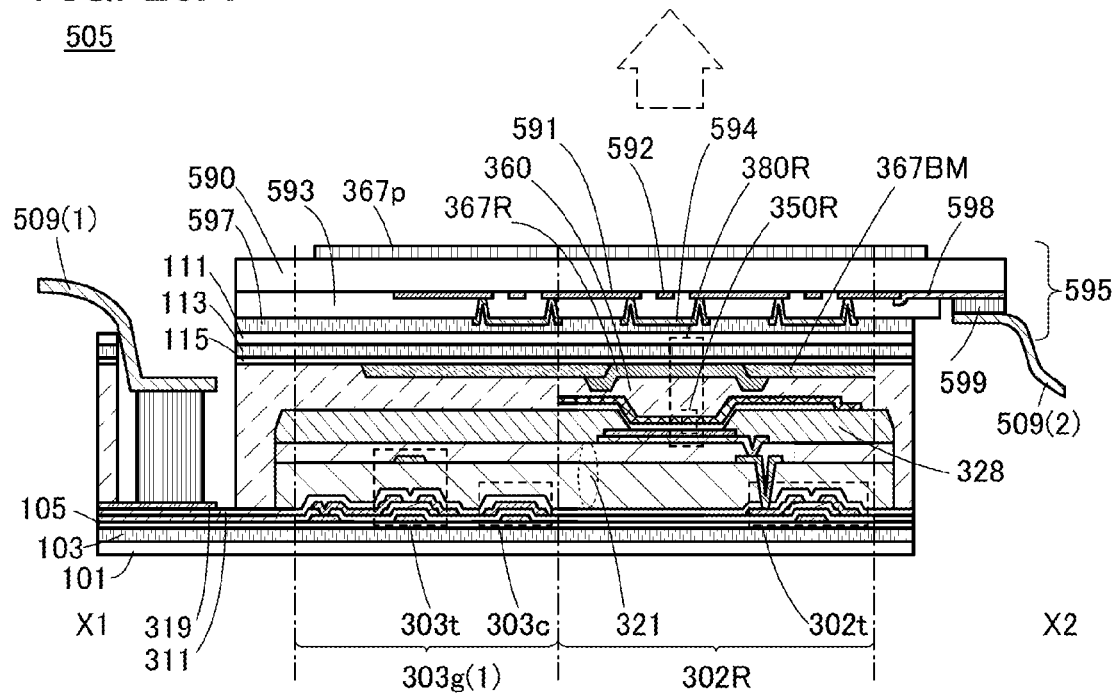
FIGS. 20A to 20C illustrate input/output devices.
Figure 20B:
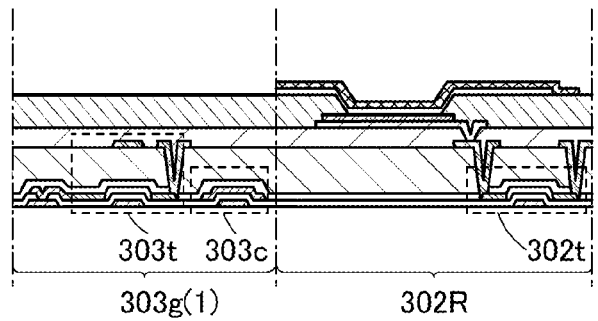
Figure 20C:
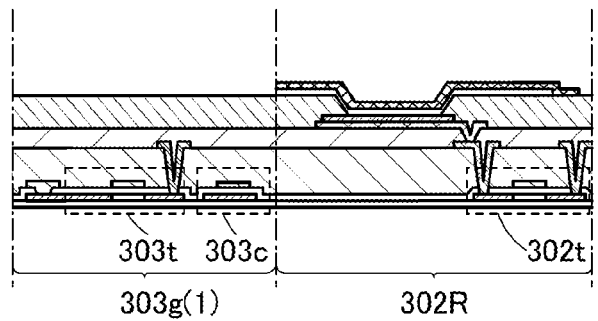

FIGS. 19A and 19B are perspective views of an input/output device 505. Note that FIGS. 19A and 19B illustrate only main components for clarity. FIGS. 20A to 20C are each a cross-sectional view taken along the dashed-dotted line X1-X2 in FIG. 19A.

As illustrated in FIGS. 19A and 19B, the input/output device 505 includes a display portion 501, the scan line driver circuit 303g(1), a touch sensor 595, and the like. Furthermore, the input/output device 505 includes the substrate 101, the substrate 111, and a substrate 590.

The input/output device 505 includes a plurality of pixels and a plurality of wirings 511. The plurality of wirings 511 can supply signals to the pixels. The plurality of wirings 511 are led to a peripheral portion of the substrate 101, and part of the plurality of wirings 511 form a terminal 519. The terminal 519 is electrically connected to an FPC 509(1).

The input/output device 505 includes the touch sensor 595 and a plurality of wirings 598. The plurality of wirings 598 are electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG. 19B, electrodes, wirings, and the like of the touch sensor 595 provided on the back side of the substrate 590 (the side facing the substrate 101) are indicated by solid lines for clarity.

As the touch sensor 595, for example, a capacitive touch sensor can be used. Examples of the capacitive touch sensor include a surface capacitive touch sensor and a projected capacitive touch sensor. An example of using a projected capacitive touch sensor is described here.

Examples of the projected capacitive touch sensor include a self capacitive touch sensor and a mutual capacitive touch sensor. The use of a mutual capacitive type is preferred because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 19A and 19B.

The electrodes 591 each have a quadrangular shape and are arranged in a direction intersecting with the direction in which the electrodes 592 extend. Note that the plurality of electrodes 591 are not necessarily arranged in the direction orthogonal to one electrode 592 and may be arranged to intersect with one electrode 592 at an angle of less than 90°.

A wiring 594 intersects with the electrode 592. The wiring 594 electrically connects two electrodes 591 between which one of the electrodes 592 is positioned. The intersecting area of the one of the electrodes 592 and the wiring 594 is preferably as small as possible. Such a structure allows a reduction in the area of a region where the electrodes are not provided, reducing unevenness in transmittance. As a result, unevenness in luminance of light transmitted through the touch sensor 595 can be reduced.

Note that the shapes of the electrodes 591 and the electrodes 592 are not limited to the above-mentioned shapes and can be any of a variety of shapes. For example, a plurality of first electrodes each having a stripe shape may be provided so that space between two adjacent first electrodes are reduced as much as possible, and a plurality of second electrodes each having a stripe shape may be provided so as to intersect the first electrodes with an insulating layer sandwiched between the first electrodes and the second electrodes. In that case, two adjacent second electrodes may be spaced apart from each other. In that case, it is preferable to provide, between the two adjacent second electrodes, a dummy electrode which is electrically insulated from these electrodes, whereby the area of a region having a different transmittance can be reduced.

As illustrated in FIG. 20A, the input/output device 505 includes the substrate 101, the adhesive layer 103, the insulating layer 105, the substrate 111, the adhesive layer 113, and the insulating layer 115. The substrates 101 and 111 are bonded to each other with the adhesive layer 360.

An adhesive layer 597 bonds the substrate 590 to the substrate 111 so that the touch sensor 595 overlaps with the display portion 501. The adhesive layer 597 has a light-transmitting property.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

The electrodes 591 and the electrodes 592 may be formed by depositing a light-transmitting conductive material on the substrate 590 by a sputtering method and then removing an unnecessary portion by a variety of patterning technique such as photolithography.

The electrodes 591 and the electrodes 592 are covered with an insulating layer 593. Furthermore, openings reaching the electrodes 591 are formed in the insulating layer 593, and the wiring 594 electrically connects the adjacent electrodes 591. A light-transmitting conductive material can be favorably used as the wiring 594 because the aperture ratio of the input/output device can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

Furthermore, a connection layer 599 electrically connects the wirings 598 to the FPC 509(2).

The display portion 501 includes a plurality of pixels arranged in a matrix. Each pixel has the same structure as Structure Example 1; thus, description is omitted.

Any of various kinds of transistors can be used in the input/output device. A structure in the case of using bottom-gate transistors is illustrated in FIGS. 20A and 20B.

For example, a semiconductor layer containing an oxide semiconductor, amorphous silicon, or the like can be used in the transistor 302$t$ and the transistor 303$t$ illustrated in FIG. 20A.

For example, a semiconductor layer containing polycrystalline silicon that is obtained by crystallization process such as laser annealing can be used in the transistor 302$t$ and the transistor 303$t$ illustrated in FIG. 20B.

A structure in the case of using top-gate transistors is illustrated in FIG. 20C.

For example, a semiconductor layer including polycrystalline silicon, a single crystal silicon film that is transferred from a single crystal silicon substrate, or the like can be used in the transistor 302$t$ and the transistor 303$t$ illustrated in FIG. 20C.

Structure Example 3

Figure 21A:
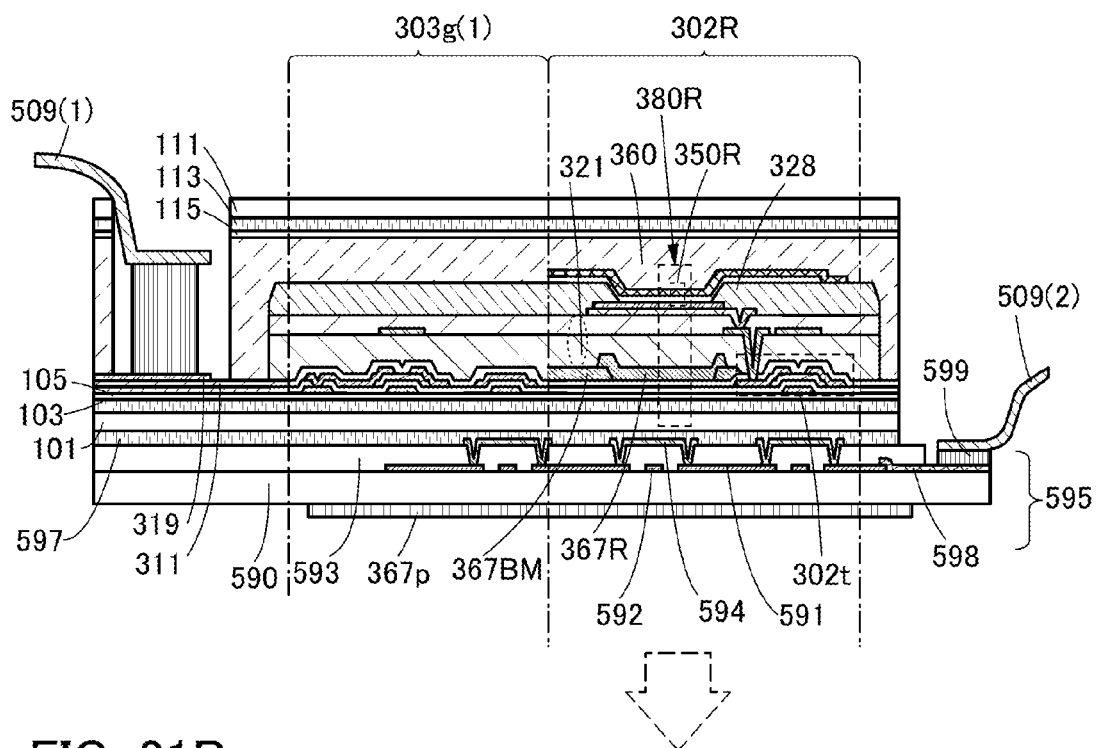
FIGS. 21A to 21C illustrate input/output devices.
Figure 21B:
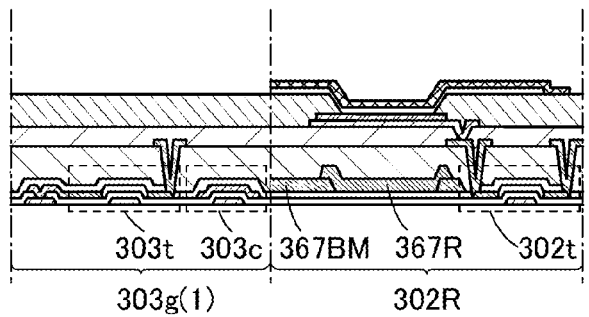
Figure 21C:
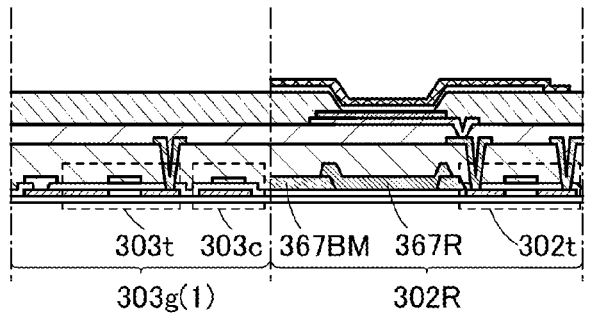

FIGS. 21A to 21C are cross-sectional views of an input/output device 505B. The input/output device 505B is different from the input/output device 505 in that received image data is displayed on the side where the transistors are provided and that the touch sensor is provided on the substrate 101 side of the display portion. Different structures will be described in detail below, and the above description is referred to for similar structures.

The coloring layer 367R is positioned in a region overlapping with the light-emitting element 350R. The light-emitting element 350R illustrated in FIG. 21A emits light to the side where the transistor 302$t$ is provided. Accordingly, part of light emitted from the light-emitting element 350R passes through the coloring layer 367R and is emitted to the outside of the light-emitting module 380R as indicated by an arrow in FIG. 21A.

The input/output device 505B includes the light-blocking layer 367BM on the light extraction side. The light-blocking layer 367BM is provided so as to surround the coloring layer (e.g., the coloring layer 367R).

The touch sensor 595 is provided not on the substrate 111 side but on the substrate 101 side (see FIG. 21A).

The adhesive layer 597 bonds the substrate 590 to the substrate 101 so that the touch sensor 595 overlaps with the display portion. The adhesive layer 597 has a light-transmitting property.

Note that a structure in the case of using bottom-gate transistors in the display portion 501 is illustrated in FIGS. 21A and 21B.

For example, a semiconductor layer containing an oxide semiconductor, amorphous silicon, or the like can be used in the transistor 302$t$ and the transistor 303$t$ illustrated in FIG. 21A.

For example, a semiconductor layer containing polycrystalline silicon can be used in the transistor 302$t$ and the transistor 303$t$ illustrated in FIG. 21B.

A structure in the case of using top-gate transistors is illustrated in FIG. 21C.

For example, a semiconductor layer containing polycrystalline silicon, a single crystal silicon film that is transferred from a single crystal silicon substrate, or the like can be used in the transistor 302$t$ and the transistor 303$t$ illustrated in FIG. 21C.

Structure Example 4

Figure 22:
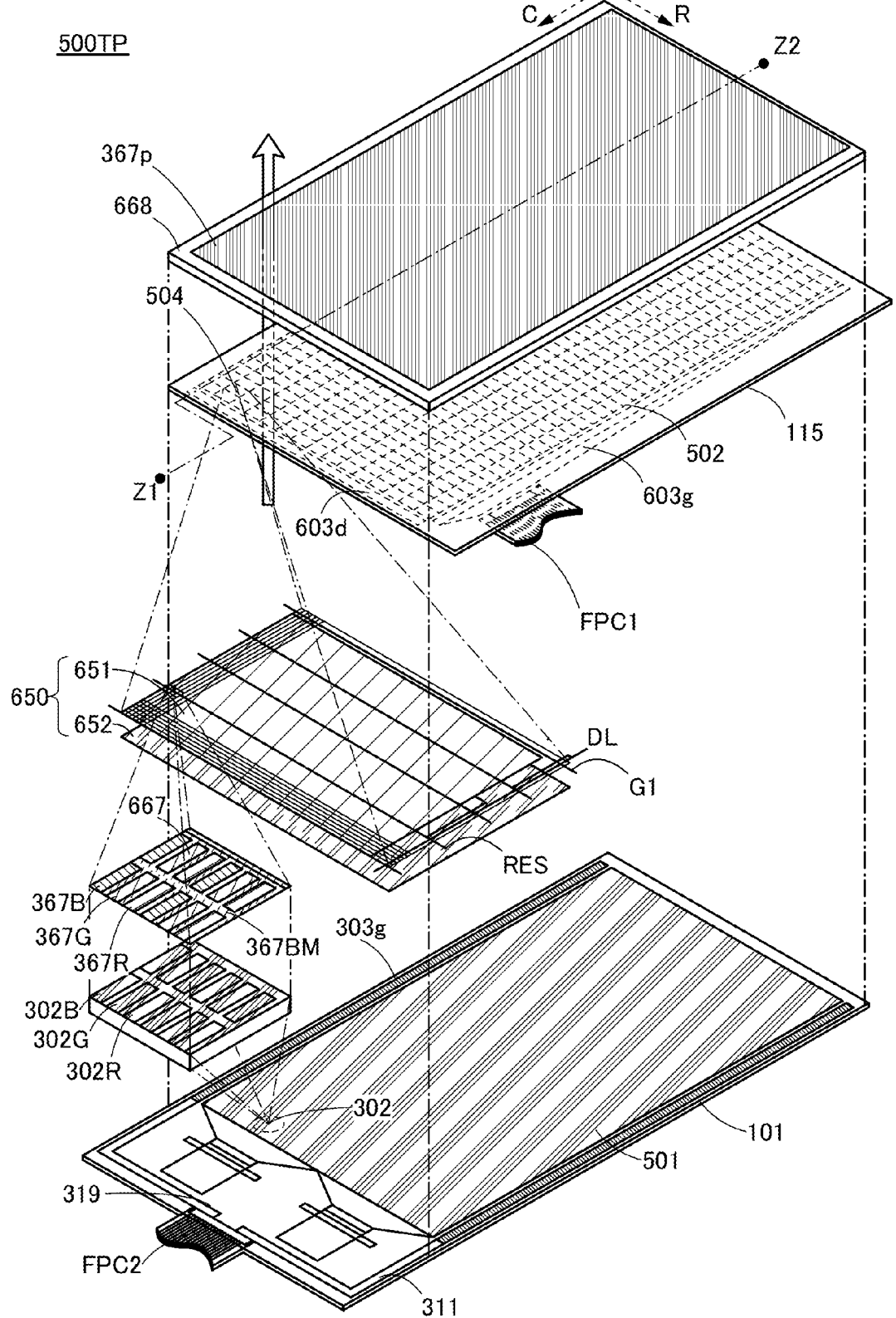
FIG. 22 illustrates an input/output device.
Figure 23:
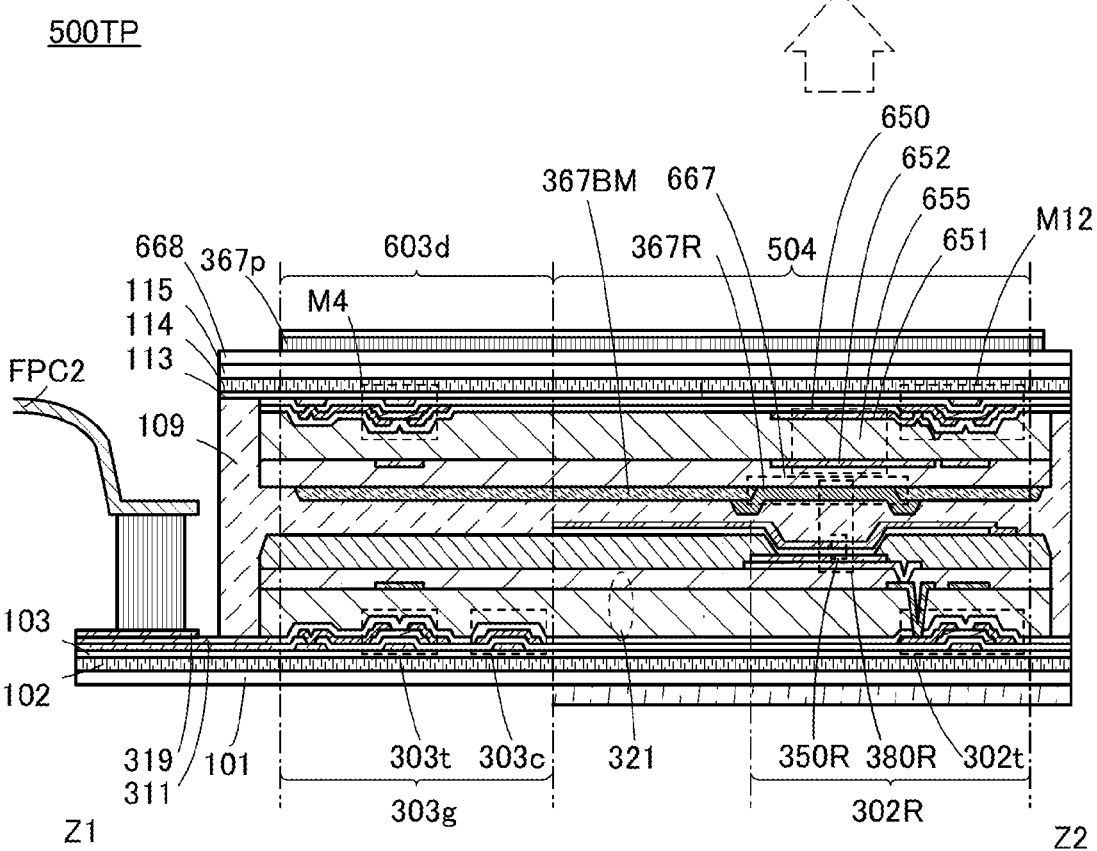
FIG. 23 illustrates an input/output device.

As illustrated in FIG. 22, an input/output device 500TP includes a display portion 501 and an input portion 502 that overlap with each other. FIG. 23 is a cross-sectional view taken along the dashed-dotted line Z1-Z2 in FIG. 22. Note that FIG. 23 also illustrates the structure of a scan line driver circuit 303$g$, which is not included in the cross-sectional view taken along the dashed-dotted line Z1-Z2. In the input/output unit 500TP illustrated in FIG. 22, the scan line driver circuit 303$g$ and the driver circuit 603$d$ do not overlap with each other; however, they may overlap with each other as shown in FIG. 23.

Individual components included in the input/output device 500TP are described below. Note that these components cannot be clearly distinguished and one component also serves as another component or include part of another component in some cases. Note that the input/output device 500TP in which the input portion 502 overlaps with the display portion 501 is also referred to as a touch panel.

The input portion 502 includes a plurality of sensing units 504 arranged in a matrix. The input portion 502 also includes a selection signal line G1, a control line RES, a signal line DL, and the like.

The selection signal line G1 and the control line RES are electrically connected to the plurality of sensing units 504 that are arranged in the row direction (indicated by the arrow R in FIG. 22). The signal line DL is electrically connected to the plurality of sensing units 504 that are arranged in the column direction (indicated by the arrow C in FIG. 22).

The sensing unit 504 senses an object that is close thereto or in contact therewith and supplies a sensing signal. For example, the sensing unit 504 senses, for example, capacitance, illuminance, magnetic force, electric waves, or pressure and supplies data based on the sensed physical quantity. Specifically, a capacitor, a photoelectric conversion element, a magnetic sensing element, a piezoelectric element, a resonator, or the like can be used as the sensing element.

The sensing unit 504 senses, for example, a change in capacitance between the sensing unit 504 and an object close thereto or an object in contact therewith.

Note that when an object having a dielectric constant higher than that of the air, such as a finger, comes close to a conductive film in the air, the capacitance between the finger and the conductive film changes. The sensing unit 504 can sense the capacitance change and supply sensing data.

For example, the capacitance change causes charge distribution between the conductive film and the capacitor, leading to voltage change across the capacitor. This voltage change can be used as a sensing signal.

The sensing unit 504 is provided with a sensor circuit. The sensor circuit is electrically connected to the selection signal line G1, the control line RES, the signal line DL, or the like.

The sensor circuit includes a transistor, a sensor element, or the like. For example, a conductive film and a capacitor electrically connected to the conductive film can be used for the sensor circuit. A capacitor and a transistor electrically connected to the capacitor can also be used for the sensor circuit.

For example, a capacitor 650 including an insulating layer 655, and a first electrode 651 and a second electrode 652 between which the insulating layer 655 is provided can be used for the sensor circuit (see FIG. 23). The voltage between the electrodes of the capacitor 650 changes when an object comes close to the conductive film that is electrically connected to one electrode of the capacitor 650.

The sensing unit 504 includes a switch that can be turned on or off in accordance with a control signal. For example, a transistor M12 can be used as the switch.

A transistor which amplifies a sensing signal can be used in the sensor unit 504.

Transistors manufactured through the same process can be used as the transistor that amplifies a sensing signal and the switch. This allows the input portion 502 to be provided through a simplified process.

The sensing unit includes a plurality of window portions 667 arranged in a matrix. The window portion 667 transmits visible light, and a light-blocking layer BM may be provided between the plurality of window portions 667.

A coloring layer is provided in a position overlapping with the window portion 667 in the input/output device 500TP. The coloring layer transmits light of a predetermined color. Note that the coloring layer can be called a color filter. For example, a coloring layer 367B transmitting blue light, a coloring layer 367G transmitting green light, and a coloring layer 367R transmitting red light can be used. A coloring layer transmitting yellow light or a coloring layer transmitting white light may also be used.

The display portion 501 includes the plurality of pixels 302 arranged in a matrix. The pixel 302 is positioned so as to overlap with the window portions 667 of the input portion 502. The pixels 302 may be arranged at higher resolution than the sensing units 504. Each pixel has the same structure as Structure Example 1; thus, description is omitted.

The input/output device 500TP includes the input portion 502 that includes the plurality of sensing units 504 arranged in a matrix and the window portions 667 transmitting visible light, the display portion 501 that includes the plurality of pixels 302 overlapping with the window portions 667, and the coloring layers between the window portions 667 and the pixels 302. In addition, each sensing unit is provided with a switch with which interference in another sensing unit can be reduced.

With such a structure, sensing data sensed by each sensing unit can be supplied together with the positional data of the sensing unit. In addition, the sensing data associated with the positional data of the pixel for displaying an image can be supplied. Electrical continuity between a sensing unit that does not supply sensing data and the signal line is not established, whereby interference in a sensing unit that supplies a sensing signal can be reduced. Consequently, the novel input/output device 500TP that is highly convenient or highly reliable can be provided.

For example, the input portion 502 of the input/output device 500TP can sense sensing data and supply the sensing data together with the positional data. Specifically, a user of the input/output device 500TP can make a variety of gestures (e.g., tap, drag, swipe, and pinch-in operation) using, as a pointer, his/her finger or the like on the input portion 502.

The input portion 502 can sense a finger or the like that comes close to or is in contact with the input portion 502 and supply sensing data including a sensed position, path, or the like.

An arithmetic unit determines whether or not supplied data satisfies a predetermined condition on the basis of a program or the like and executes an instruction associated with a predetermined gesture.

Thus, a user of the input portion 502 can make the predetermined gesture with his/her finger or the like and make the arithmetic unit execute an instruction associated with the predetermined gesture.

For example, first, the input portion 502 of the input/output device 500TP selects one sensing unit X from the plurality of sensing units that can supply sensing data to one signal line. Then, electrical continuity between the signal line and the sensing units other than the sensing unit X is not established. This can reduce interference of the other sensing units in the sensing unit X.

Specifically, interference of sensing elements of the other sensing units in a sensing element of the sensing unit X can be reduced.

For example, in the case where a capacitor and a conductive film to which one electrode of the capacitor is electrically connected are used for the sensing element, interference of the potentials of the conductive films of the other sensing units in the potential of the conductive film of the sensing unit X can be reduced.

Thus, the input/output device 500TP can drive the sensing unit and supply sensing data independently of its size. The input/output device 500TP can have a variety of sizes, for example, ranging from a size for a hand-held device to a size for an electronic blackboard.

The input/output device 500TP can be folded and unfolded. Even in the case where interference of the other sensing units in the sensing unit X is different between the folded state and the unfolded state, the sensing unit can be driven and sensing data can be supplied without dependence on the state of the input/output device 500TP.

The display portion 501 of the input/output device 500TP can be supplied with display data. For example, an arithmetic unit can supply the display data.

In addition to the above structure, the input/output device 500TP can have the following structure.

The input/output device 500TP may include a driver circuit 603g or a driver circuit 603d. In addition, the input/output device 500TP (or driver circuit) may be electrically connected to an FPC1.

The driver circuit 603g can supply selection signals at predetermined timings, for example. Specifically, the driver circuit 603g supplies selection signals to the selection signal lines G1 row by row in a predetermined order. Any of a variety of circuits can be used as the driver circuit 603g. For example, a shift register, a flip-flop circuit, a combination circuit, or the like can be used.

The driver circuit 603d supplies sensing data on the basis of a sensing signal supplied from the sensing unit 504. Any of a variety of circuits can be used as the driver circuit 603d.

For example, a circuit that can form a source follower circuit or a current mirror circuit by being electrically connected to the sensing circuit in the sensing unit can be used as the driver circuit 603d. In addition, an analog-to-digital converter circuit that converts a sensing signal into a digital signal may be provided in the driver circuit 603d.

The FPC1 supplies a timing signal, a power supply potential, or the like and is supplied with a sensing signal.

The input/output device 500TP may include a scan line driver circuit 503g, a wiring 511, or a terminal 519. In addition, the input/output device 500TP (or driver circuit) may be electrically connected to an FPC2.

In addition, a protective layer 668 that prevents damage and protects the input/output device 500TP may be provided. For example, a ceramic coat layer or a hard coat layer can be used as the protective layer 668. Specifically, a layer containing aluminum oxide or an ultraviolet curable resin can be used.

In the case of a transflective liquid crystal display or a reflective liquid crystal display, some of or all of pixel electrodes function as reflective electrodes. For example, some or all of pixel electrodes are formed to contain aluminum or silver.

Furthermore, a memory circuit such as an SRAM can be provided under the reflective electrodes, leading to lower power consumption. A structure suitable for employed display elements can be selected from among a variety of structures of pixel circuits.

This embodiment can be combined with any of the other embodiments as appropriate.

Embodiment 6

In this embodiment, electronic devices and lighting devices of embodiments of the present invention will be described with reference to drawings.

By the use of the peeling apparatus of one embodiment of the present invention, electronic devices and lighting devices can be manufactured with a high yield. For example, the light-emitting device (which includes the display device including a light-emitting element) described in Embodiment 4 and the input/output device described in Embodiment 5 can be used for a flexible display portion of an electronic device and a flexible light-emitting portion of a lighting device.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

The electronic device or the lighting device of one embodiment of the present invention has flexibility and therefore can be incorporated along a curved inside/outside wall surface of a house or a building or a curved interior/exterior surface of a car.

The electronic device of one embodiment of the present invention may include a light-emitting device or an input/output device, and a secondary battery. In that case, it is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

An electronic device of one embodiment of the present invention may include a light-emitting device or an input/output device, an antenna, and a secondary battery. Receiving a signal with the antenna enables a display portion to display video, information, and the like. When the electronic device includes a secondary battery, the antenna may be used for non-contact power transmission.

Figure 24A:
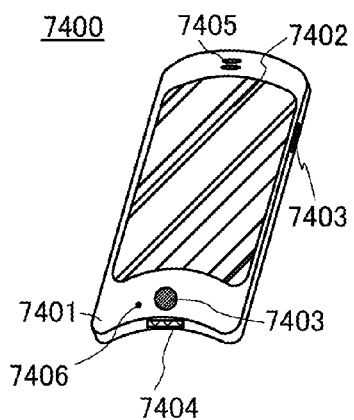
FIGS. 24A to 24K illustrate electronic devices and lighting devices.

FIG. 24A illustrates an example of a cellular phone. A cellular phone 7400 includes a display portion 7402 incorporated in a housing 7401, an operation button 7403, an external connection port 7404, a speaker 7405, a microphone 7406, and the like. Note that the display portion 7402 of the cellular phone 7400 includes the light-emitting device or input/output device manufactured using the peeling apparatus of one embodiment of the present invention. One embodiment of the present invention makes it possible to provide a highly reliable cellular phone having a curved display portion with a high yield. Note that the housing of the electronic device, such as the housing 7401, preferably has a curved surface or flexibility.

When the display portion 7402 of the cellular phone 7400 in FIG. 24A is touched with a finger or the like, data can be input into the cellular phone 7400. Moreover, operations such as making a call and inputting characters can be performed by touch on the display portion 7402 with a finger or the like.

With the operation button 7403, power ON or OFF can be switched. In addition, a variety of images displayed on the display portion 7402 can be switched; switching a mail creation screen to a main menu screen, for example.

Figure 24B:
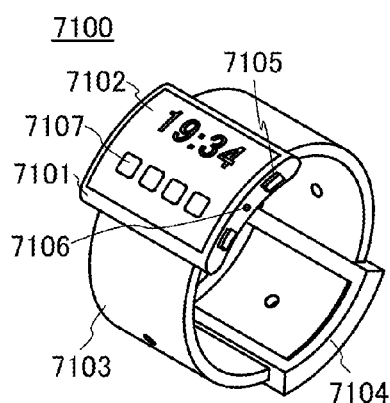

FIG. 24B is an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is curved, and images can be displayed on the curved display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power ON/OFF, ON/OFF of wireless communication, setting and cancellation of manner mode, and setting and cancellation of power saving mode can be performed. For example, the functions of the operation button 7105 can be set freely by setting the operating system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes the light-emitting device or input/output device manufactured using the peeling apparatus of one embodiment of the present invention. One embodiment of the present invention makes it possible to provide a highly reliable portable information terminal having a curved display portion with a high yield.

Figure 24C:
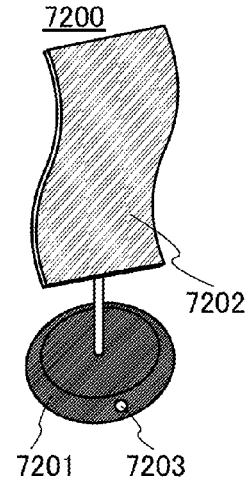
Figure 24D:
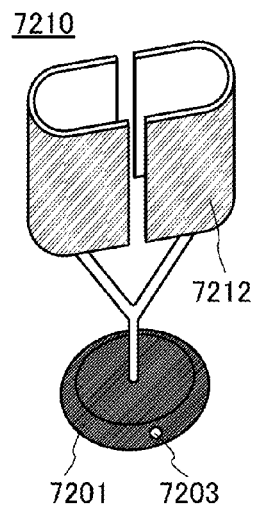
Figure 24E:
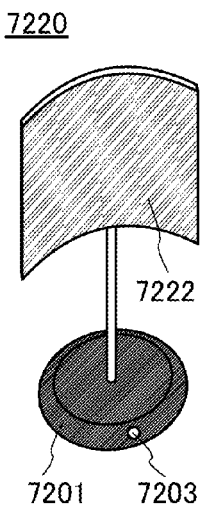

FIGS. 24C to 24E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 24C includes a light-emitting portion 7202 having a wave-shaped light-emitting surface, and thus has good design.

A light-emitting portion 7212 included in the lighting device 7210 in FIG. 24D has two convex-curved light-emitting portions symmetrically placed. Thus, all directions can be illuminated with the lighting device 7210 as a center.

The lighting device 7220 illustrated in FIG. 24E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed to a plastic member, a movable frame, or the like so that an emission surface of the light-emitting portion can be curved freely depending on the intended use.

Note that although the lighting device in which the light-emitting portion is supported by the stage is described as an example here, a housing provided with a light-emitting portion can be fixed to a ceiling or suspended from a ceiling. Since the light-emitting surface can be curved, the light-emitting surface can be curved to have a concave shape so that a particular region is brightly illuminated, or curved to have a convex shape so that the whole room is brightly illuminated.

Here, each light-emitting portion includes the light-emitting device or input/output device manufactured using the peeling apparatus of one embodiment of the present invention. One embodiment of the present invention makes it possible to provide a highly reliable lighting device having a curved light-emitting portion with a high yield.

Figure 24F:
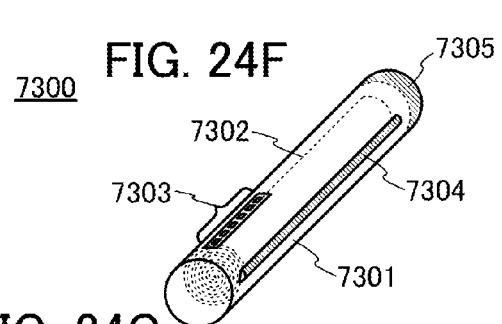

FIG. 24F illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

With the operation buttons 7303, power ON/OFF, switching of displayed videos, and the like can be performed.

Figure 24G:
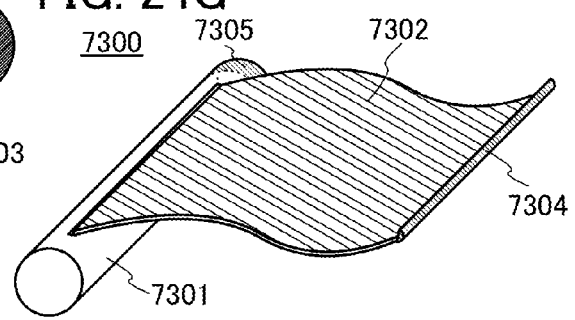
Figure 24H:
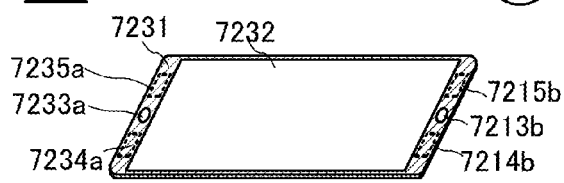
Figure 24I:

FIG. 24G illustrates the display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as illustrated in FIG. 24F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes the light-emitting device or input/output device manufactured using the peeling apparatus of one embodiment of the present invention. One embodiment of the present invention makes it possible to provide a lightweight and highly reliable display device with a high yield.

FIGS. 24H to 24K illustrate a flexible portable information terminal 7230. The portable information terminal 7230 includes a housing 7231 and a display portion 7232. The portable information terminal 7230 may further include buttons 7233*a* and 7233*b* that are input units, speakers 7234*a* and 7234*b* that are voice output units, vibration motors 7235*a* and 7235*b* that are vibration units, or the like.

The display portion 7232 includes the light-emitting device or input/output device manufactured using the peeling apparatus of one embodiment of the present invention.

Figure 24J:
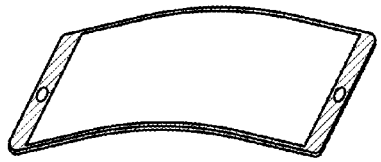
Figure 24K:
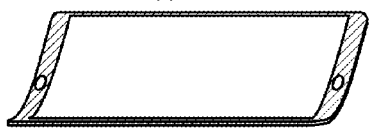

The display portion 7232 and the housing 7231 have flexibility. Thus, the portable information terminal 7230 can be easily curved to have a desired shape and twisted. For example, curving such that the display portion 7232 becomes concave along a direction perpendicular to the long side of the portable information terminal 7230 is possible (FIG. 24I), and curving such that the display portion 7232 becomes convex along the direction is possible (FIG. 24J). The display portion 7232 can also be curved along a direction parallel to the long side of the portable information terminal 7230 as shown in FIG. 24K.

Figure 25A:
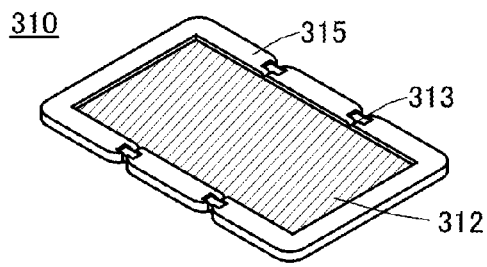
FIGS. 25A to 25I illustrate electronic devices.
Figure 25B:
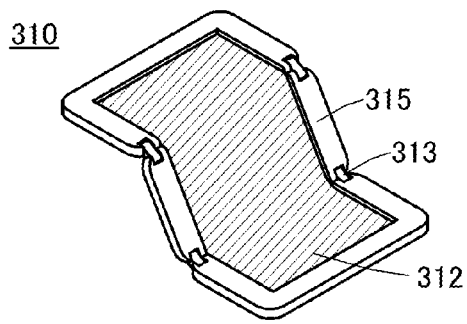
Figure 25C:
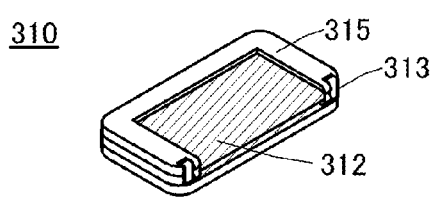

FIGS. 25A to 25C illustrate a foldable portable information terminal 310. FIG. 25A illustrates the portable information terminal 310 that is opened. FIG. 25B illustrates the portable information terminal 310 that is being opened or being folded. FIG. 25C illustrates the portable information terminal 310 that is folded. The portable information terminal 310 is highly portable when folded. The portable information terminal 310 is highly browsable when opened because of its seamless large display region.

A display panel 312 is supported by three housings 315 joined together by hinges 313. By folding the portable information terminal 310 at a connection portion between two housings 315 with the hinges 313, the portable information terminal 310 can be reversibly changed in shape from an opened state to a folded state. The light-emitting device or input/output device manufactured using the peeling apparatus of one embodiment of the present invention can be used for the display panel 312. For example, the light-emitting device or the input/output device that can be bent with a radius of curvature of greater than or equal to 0.01 mm and less than or equal to 150 mm can be used.

Figure 25D:
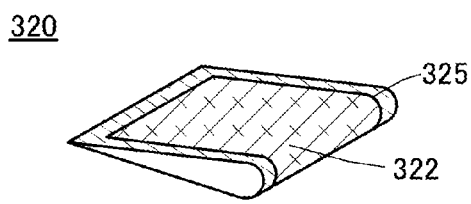
Figure 25E:
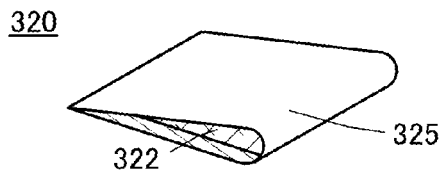

FIGS. 25D and 25E each illustrate a foldable portable information terminal 320. FIG. 25D illustrates the portable information terminal 320 that is folded so that a display portion 322 is on the outside. FIG. 25E illustrates the portable information terminal 320 that is folded so that the display portion 322 is on the inside. When the portable information terminal 320 is not used, the portable information terminal 320 is folded so that a non-display portion 325 faces the outside, whereby the display portion 322 can be prevented from being contaminated or damaged. The light-emitting device or input/output device manufactured using the peeling apparatus of one embodiment of the present invention is used for the display portion 322.

Figure 25F:
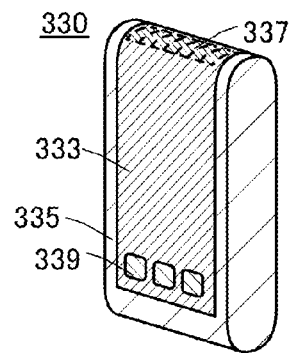
Figure 25G:
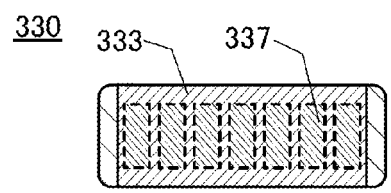
Figure 25H:
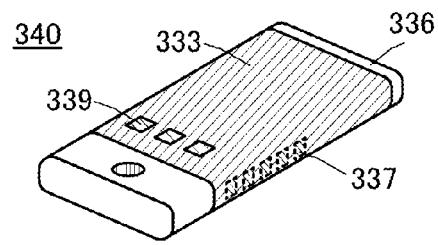

FIG. 25F is a perspective view illustrating an external shape of the portable information terminal 330. FIG. 25G is a top view of the portable information terminal 330. FIG. 25H is a perspective view illustrating an external shape of a portable information terminal 340.

The portable information terminals 330 and 340 each function as, for example, one or more of a telephone set, a notebook, an information browsing system, and the like. Specifically, the portable information terminals 330 and 340 each can be used as a smartphone.

The portable information terminals 330 and 340 can display characters and image data on its plurality of surfaces. For example, three operation buttons 339 can be displayed on one surface (FIGS. 25F and 25H). In addition, data 337 indicated by dashed rectangles can be displayed on another surface (FIGS. 25G and 25H). Examples of the data 337 include notification from a social networking service (SNS), display indicating reception of e-mail or an incoming call, the title of e-mail or the like, the sender of an e-mail or the like, the date, the time, remaining battery, and the reception strength of an antenna. Alternatively, the operation buttons 339, an icon, or the like may be displayed in place of the data 337. Although FIGS. 25F and 25G illustrate an example in which the data 337 is displayed at the top, one embodiment of the present invention is not limited thereto. For example, the data 337 may be displayed on the side as in the portable information terminal 340 in FIG. 25H.

For example, a user of the portable information terminal 330 can see the display (here, the data 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

The light-emitting device or input/output device manufactured using the peeling apparatus of one embodiment of the present invention is included in a display portion 333 mounted in each of a housing 335 of the portable information terminal 330 and a housing 336 of the portable information terminal 340. One embodiment of the present invention makes it possible to provide a highly reliable portable information terminal having a curved display portion with a high yield.

Figure 25I:
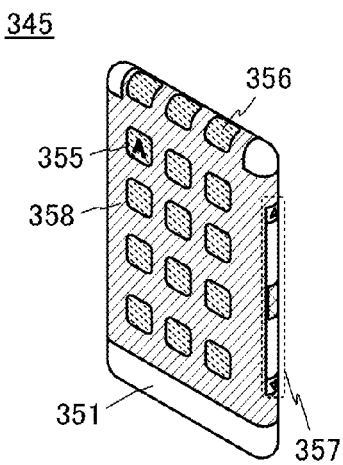

As in a portable information terminal 345 illustrated in FIG. 25I, data may be displayed on three or more surfaces. Here, data 355, data 356, and data 357 are displayed on different surfaces.

A display portion 358 included in a housing 351 of the portable information terminal 345 includes the light-emitting device or input/output device manufactured using the peeling apparatus of one embodiment of the present invention. One embodiment of the present invention makes it possible to provide a highly reliable portable information terminal having a curved display portion with a high yield.

This embodiment can be combined with any of the other embodiments as appropriate.

This application is based on Japanese Patent Application serial no. 2014-127355 filed with Japan Patent Office on Jun. 20, 2014, the entire contents of which are hereby incorporated by reference.

What is claimed is:

1. A peeling apparatus configured to divide a process member into a first member and a second member, the peeling apparatus comprising:
a support body supply unit;
a support body hold unit;
a transfer mechanism;
a first structure body; and
a fixing mechanism,
wherein the first structure body comprises a convex surface,
wherein the support body supply unit is configured to unwind a first support body in rolled sheet form,
wherein the support body supply unit comprises one of a pair of tension applying mechanisms,
wherein the support body hold unit comprises the other of the pair of tension applying mechanisms,
wherein the pair of tension applying mechanisms is configured to apply a tension to the first support body,
wherein the transfer mechanism is configured to transfer the process member,
wherein the first structure body is positioned between the support body supply unit and the support body hold unit,
wherein the first structure body is configured to bend back the unwound first support body along the convex surface,
wherein the first structure body is configured to divide the process member into the first member and the second member,
wherein an angle at which the first structure body bends back the first support body is an obtuse angle, and
wherein the fixing mechanism is configured to fix the second member separated from the first member.

2. The peeling apparatus according to claim 1, further comprising a second structure body,
wherein the second structure body comprises a convex surface,
wherein the second structure body is positioned between the first structure body and the support body hold unit,
wherein the second structure body is configured to deliver the first support body from the first structure body to the support body hold unit along the convex surface, and
wherein the second structure body is configured to apply a tension to the first support body.

3. The peeling apparatus according to claim 2,
wherein the convex surface of the first structure body has a larger radius of curvature than the convex surface of the second structure body.

4. The peeling apparatus according to claim 1, further comprising a second structure body,
wherein the second structure body comprises a convex surface,
wherein the second structure body is positioned between the first structure body and the support body hold unit,
wherein the second structure body is configured to deliver the first support body from the first structure body to the support body hold unit along the convex surface, and
wherein the second structure body is configured to control the angle at which the first structure body bends back the first support body.

5. The peeling apparatus according to claim 4,
wherein the convex surface of the first structure body has a larger radius of curvature than the convex surface of the second structure body.

6. The peeling apparatus according to claim 1, further comprising a liquid feeding mechanism, wherein the liquid feeding mechanism is configured to supply liquid to a separation surface between the first member and the second member.

7. The peeling apparatus according to of claim 1, wherein the convex surface of the first structure body has a radius of curvature of greater than or equal to 0.5 mm and less than or equal to 1000 mm.

8. The peeling apparatus according to claim 1, further comprising a reel,
wherein the reel is positioned between the support body supply unit and the support body hold unit,
wherein a tape is bonded to one surface of the first support body, and
wherein the reel is configured to wind up the tape.

9. The peeling apparatus according to claim 1, further comprising a pressure application mechanism,
wherein the pressure application mechanism is positioned between the support body supply unit and the first structure body, and
wherein the pressure application mechanism is configured to bond the process member and the first support body to each other.

10. A peeling apparatus configured to divide a process member into a first member and a second member, the peeling apparatus comprising:
a support body supply unit;
a first structure body; and
a fixing mechanism,
wherein the first structure body comprises a convex surface,
wherein the support body supply unit is configured to unwind a first support body in rolled sheet form,
wherein the first structure body is configured to divide the process member into the first member and the second member,
wherein an angle at which the first structure body bends back the first support body is an obtuse angle, and
wherein the fixing mechanism is configured to fix the second member separated from the first member.

11. The peeling apparatus according to claim 10, further comprising
a second structure body, and
a support body hold unit,
wherein the second structure body comprises a convex surface,
wherein the first structure body is positioned between the support body supply unit and the support body hold unit,
wherein the second structure body is positioned between the first structure body and the support body hold unit,
wherein the second structure body is configured to deliver the first support body from the first structure body to the support body hold unit along the convex surface, and
wherein the second structure body is configured to apply a tension to the first support body.

12. The peeling apparatus according to claim 10, further comprising
a second structure body, and
a support body hold unit,
wherein the second structure body comprises a convex surface,
wherein the first structure body is positioned between the support body supply unit and the support body hold unit,
wherein the second structure body is positioned between the first structure body and the support body hold unit,
wherein the second structure body is configured to deliver the first support body from the first structure body to the support body hold unit along the convex surface, and
wherein the second structure body is configured to control the angle at which the first structure body bends back the first support body.

13. The peeling apparatus according to claim 12, wherein the convex surface of the first structure body has a larger radius of curvature than the convex surface of the second structure body.

14. The peeling apparatus according to claim 12, further comprising a reel,
wherein the reel is positioned between the support body supply unit and the support body hold unit,
wherein a tape is bonded to one surface of the first support body, and
wherein the reel is configured to wind up the tape.

15. The peeling apparatus according to claim 10, further comprising a liquid feeding mechanism,
wherein the liquid feeding mechanism is configured to supply liquid to a separation surface between the first member and the second member.

16. The peeling apparatus according to of claim 10, wherein the convex surface of the first structure body has a radius of curvature of greater than or equal to 0.5 mm and less than or equal to 1000 mm.

17. The peeling apparatus according to claim 10, further comprising a pressure application mechanism,
wherein the pressure application mechanism is positioned between the support body supply unit and the first structure body, and
wherein the pressure application mechanism is configured to bond the process member and the first support body to each other.

* * * * *